United States Patent
Yamamoto et al.

(10) Patent No.: US 9,625,618 B2
(45) Date of Patent: Apr. 18, 2017

(54) OPTICAL MEMBER SET AND SOLID-STATE IMAGING ELEMENT USING THE SAME

(71) Applicant: FUJIFILM CORPORATION, Minato-ku, Tokyo (JP)

(72) Inventors: Keiji Yamamoto, Haibara-gun (JP); Kazuto Shimada, Haibara-gun (JP); Hideki Takakuwa, Haibara-gun (JP); Makoto Kubota, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 340 days.

(21) Appl. No.: 14/299,210

(22) Filed: Jun. 9, 2014

(65) Prior Publication Data
US 2014/0285695 A1 Sep. 25, 2014

Related U.S. Application Data

(63) Continuation of application No. PCT/JP2012/083661, filed on Dec. 26, 2012.

(30) Foreign Application Priority Data

Dec. 28, 2011 (JP) .................................. 2011-287851
Sep. 7, 2012 (JP) .................................. 2012-197028

(51) Int. Cl.
*G02B 1/10* (2015.01)
*G02B 1/04* (2006.01)
(Continued)

(52) U.S. Cl.
CPC ........... *G02B 1/105* (2013.01); *C09D 183/04* (2013.01); *G02B 1/04* (2013.01); *G02B 1/11* (2013.01);
(Continued)

(58) Field of Classification Search
CPC ........... G02B 1/105; G02B 1/11; G02B 1/111; G02B 1/04; G02B 2207/107;
(Continued)

(56) References Cited

U.S. PATENT DOCUMENTS

| 4,855,176 A | * | 8/1989 | Ohwaki | C03C 17/22 351/159.33 |
| 6,327,430 B1 | * | 12/2001 | Ikemori | G03B 17/08 396/29 |

(Continued)

FOREIGN PATENT DOCUMENTS

| JP | 01306477 A | 12/1989 |
| JP | 2001262011 A | 9/2001 |

(Continued)

OTHER PUBLICATIONS

Communication dated Nov. 24, 2015 from the Korean Intellectual Property Office in counterpart application No. 10-2014-7015484.

(Continued)

*Primary Examiner* — Gevell Selby
(74) *Attorney, Agent, or Firm* — Sughrue Mion, PLLC

(57) ABSTRACT

An optical member set which has a first optical member formed by curing a composition of curable resins, and a second optical member which is covered by the first optical member, in which the contact angle with water on a surface, which comes into contact with a first optical member, of the second optical member is 70 to 97° and the contact angle with the water on a surface of the opposite side to the side, which comes into contact with the second optical member, of the first optical member is 80 to 115°.

15 Claims, 1 Drawing Sheet

(51) Int. Cl.
  *H01L 27/146* (2006.01)
  *G02B 1/11* (2015.01)
  *H04N 5/335* (2011.01)
  *C09D 183/04* (2006.01)
  *G02B 1/111* (2015.01)
  *C08G 77/20* (2006.01)

(52) U.S. Cl.
  CPC ........ *G02B 1/111* (2013.01); *H01L 27/14625* (2013.01); *H04N 5/335* (2013.01); *C08G 77/20* (2013.01); *G02B 2207/107* (2013.01); *Y10T 428/24942* (2015.01)

(58) Field of Classification Search
  CPC  C09D 183/04; H04N 5/335; H01L 27/14625; C08G 77/20; Y10T 428/24942
  See application file for complete search history.

(56) References Cited

U.S. PATENT DOCUMENTS

| | | | |
|---|---|---|---|
| 7,348,056 B2 | 3/2008 | Kobayashi et al. | |
| 8,231,966 B2 | 7/2012 | Imai et al. | |
| 8,506,853 B2 | 8/2013 | Wada et al. | |
| 2001/0031317 A1 | 10/2001 | Hasegawa et al. | |
| 2004/0212884 A1 | 10/2004 | Satake et al. | |
| 2005/0163971 A1 | 7/2005 | Kobayashi et al. | |
| 2008/0228035 A1* | 9/2008 | Hagihara | A61B 1/00071 600/121 |
| 2009/0029153 A1* | 1/2009 | Naito | B29D 11/00865 428/328 |
| 2009/0244736 A1* | 10/2009 | Sasaki | G02B 7/021 359/830 |
| 2011/0003241 A1 | 1/2011 | Kaneko et al. | |
| 2011/0089385 A1 | 4/2011 | Wada et al. | |
| 2011/0195239 A1 | 8/2011 | Takane et al. | |
| 2012/0257283 A1 | 10/2012 | Maruyama et al. | |

FOREIGN PATENT DOCUMENTS

| | | | | |
|---|---|---|---|---|
| JP | 2002-361769 A | 12/2002 | | |
| JP | 2003307601 A | 10/2003 | | |
| JP | 2004258165 A | 9/2004 | | |
| JP | 2004-354568 A | 12/2004 | | |
| JP | 2006186295 | * 3/2005 | ............ | H01L 27/14 |
| JP | 2005283730 A | 10/2005 | | |
| JP | 2006-049296 A | 2/2006 | | |
| JP | 2006-98985 A | 4/2006 | | |
| JP | 2006-186295 A | 7/2006 | | |
| JP | 2006265530 A | 10/2006 | | |
| JP | 2007071917 A | 3/2007 | | |
| JP | 2007-119744 A | 5/2007 | | |
| JP | 2007-184322 A | 7/2007 | | |
| JP | 2009-203462 A | 9/2009 | | |
| JP | 2011-84672 A | 4/2011 | | |
| JP | 2011127096 A | 6/2011 | | |
| KR | 2001-0089191 A | 9/2001 | | |
| KR | 2009-0094751 A | 9/2009 | | |
| WO | 2010/044402 A1 | 4/2010 | | |

OTHER PUBLICATIONS

International Preliminary Report on Patentability and Written Opinion, mailed Jul. 1, 2014, issued in corresponding International Application No. PCT/JP2012/083661, 6 pages in English.

Communication, dated Jul. 1, 2015, issued in corresponding EP Application No. 12863331.0, 6 pages.

Notice of Reasons for Rejection, dated May 12, 2015, issued in related JP Application No. 2012-280331, 7 pages in English and Japanese.

Decision of Refusal, mailed Jan. 12, 2016, issued in corresponding JP Application No. 2012-280331, 10 pages in English and Japanese.

Decision of Rejection, mailed May 17, 2016, issued in corresponding KR Application No. 10-2014-7015484, 10 pages in English and Korean.

International Search Report for PCT/JP2012/083661 dated Feb. 19, 2013.

Written Opinion for PCT/JP2012/083661 dated Feb. 19, 2013.

Office Action dated Feb. 14, 2017 in Japanese Patent Application No. 2016-079861.

* cited by examiner

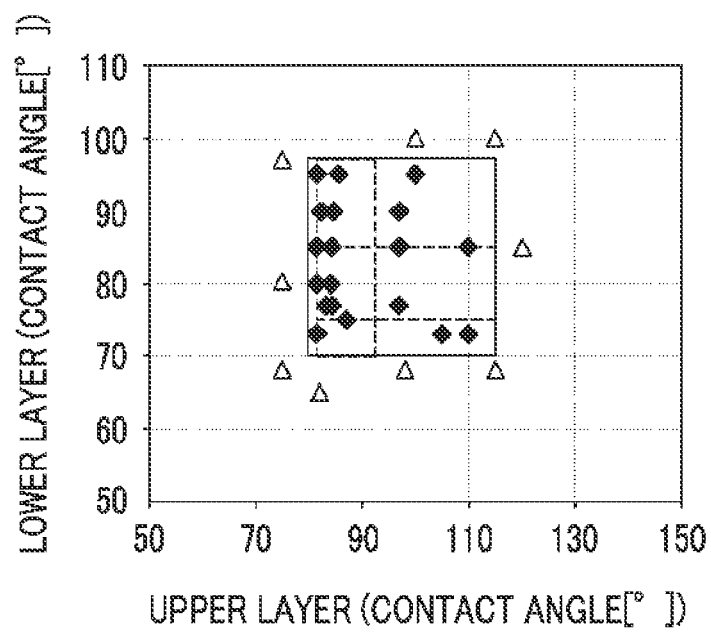

OPTICAL MEMBER SET AND SOLID-STATE IMAGING ELEMENT USING THE SAME

CROSS-REFERENCE TO RELATED APPLICATIONS

This application is a Continuation of PCT International Application No. PCT/JP2012/83661, filed Dec. 26, 2012, which claims priority under 35 U.S.C. §119(a) to Japanese Patent Application No. 2011-287851, filed Dec. 28, 2011 and Japanese Patent Application No. 2012-197028, filed Sep. 7, 2012. Each of the above application(s) is hereby expressly incorporated by reference, in its entirety, into the present application.

BACKGROUND OF THE INVENTION

1. Field of the Invention

The present invention relates to an optical member set and a solid-state imaging element which uses the same.

2. Description of the Related Art

In recent years, the number of types of optical devices has increased greatly, most of which have a structure which forms a low refractive index film with an antireflection property on a surface of an optical mechanism. Without being limited to those with a flat surface shape, examples of the optical mechanisms include brightness improving lenses or diffusing lenses of a backlight for a liquid crystal, Fresnel lenses or lenticular lenses which are used in screens for video projection televisions, microlenses, and the like. In such devices, the desired geometric optical performance is obtained by forming a microstructure using mainly resin material, and a low refractive index film is normally formed in a shape which conforms to the microstructure body surface of the above in order to further grant an antireflection property.

Among these, research and development relating to the materials and structure of the microlens units which are used in solid-state imaging elements is being vigorously pursued (for example, refer to JP2006-186295A, JP2006-98985A, and JP2007-119744A). In the background, along with the progression of the miniaturization of solid-state imaging elements, there is a demand for higher performances for realizing efficient light collection. Particularly in recent years, the size of single pixels has been greatly reduced along with an increase in the number of pixels. In addition, in order to create many more devices by a single instance of manufacturing, the size of the wafers which are used has also been increased. In response to this background, improving the manufacturing quality and product quality of microlens units is becoming increasingly important.

SUMMARY OF THE INVENTION

Here, the present inventors noted a technique where an optically transparent cured film (a first optical member) which is applied to a microlens unit (an optical member set) has a certain thickness, and where a microlens (a second optical member) is covered by the optically transparent cured film. The optical characteristics are not necessarily clear; however, it is considered that such a laminated structure will also be a target for product development in order to keep up with diversification in the applications or forms of use, or with product quality improvement in the future. Anticipating the demand for such a technology, research and development were carried out in order to reveal problems with the manufacturing quality or the product quality, and take countermeasures in advance.

The present invention has an object of providing a microlens unit (an optical member set) where the manufacturing quality and the product quality are improved when an optically transparent cured film (a first optical member) with a certain thickness is adopted as a covering material of a microlens (a second optical member) and a solid-state imaging element which uses the same. Specifically, the present invention has an object of providing a microlens unit (an optical member set) with excellent surface planarity and where crack resistance and high water absorption resistance are imparted to the specific optically transparent cured film described above, and a solid-state imaging element which uses the same.

The problems described above are solved by the following means.

[1] An optical member set including a first optical member formed by curing a composition of curable resins and a second optical member which is covered by the first optical member, in which the contact angle with water on a surface, which comes into contact with a first optical member, of the second optical member is 70 to 97° and the contact angle with the water on a surface of the opposite side to the side, which comes into contact with the second optical member, of the first optical member is 80 to 115°.

[2] The optical member set according to [1], in which the first optical member is formed by containing at least one of a siloxane resin and a fluorine-based resin.

[3] The optical member set according to [1] or [2], in which the first optical member further contains hollow particles.

[4] The optical member set according to any one of [1] to [3], in which the second optical member is formed by containing titania or zirconia.

[5] The optical member set according to any one of [1] to [4], in which the thickness of the first optical member is 0.5 µm to 3 µm.

[6] The optical member set according to any one of [1] to [5], in which the thickness of the second optical member is 0.2 µm to 2 µm.

[7] The optical member set according to any one of [2] to [6], in which 65 mass % or more to 100 mass % or less of the siloxane resin is configured of a silsesquioxane structure which is represented by the following formula (1).

$$-(R^1SiO_{3/2})_n-$$    Formula (1)

(In the formula (1), $R^1$ represents an alkyl group which has 1 to 3 carbon atoms. n represents an integer from 20 to 1000.)

[8] The optical member set according to any one of [1] to [7], in which the first optical member further contains a surfactant.

[9] The optical member set according to any one of [1] to [8], in which the first optical member includes a resin which is obtained by hydrolytic condensation of alkyltrialkoxysilane which is represented by the following formula (2).

$$R^2Si(OR^3)_3$$    Formula (2)

($R^2$ represents an alkyl group which has 1 to 3 carbon atoms and $R^3$ represents an alkyl group.)

[10] The optical member set according to any one of [1] to [9], in which a plurality of convex lenses are adopted as the second optical member, the plurality of convex lenses are arranged to face in substantially the same direction as the swelling direction of the convex lenses, the plurality of convex lenses are covered by a first optical member which is an optically transparent cured film from the swelling direction, and the optically transparent cured film is filled into concave sections which are formed between the plurality of convex lenses substantially without gaps while the opposite side of the convex lens in the optically transparent cured film is a flat surface.

[11] The optical member set according to any one of [1] to [10], in which the contact angle with the water on the surface of the opposite side to the side, which comes into contact with a second optical member, of the first optical member is 80 to 98°.

[12] The optical member set according to any one of [1] to [11], in which the first optical member is formed by containing a siloxane resin.

[13] A solid-state imaging element which is provided with the optical member set according to any one of [1] to [12] and a semiconductor light receiving unit.

In the microlens unit (an optical member set) and the solid-state imaging element which uses the same in the present invention, a favorable manufacturing quality and a favorable product quality are realized by adopting an optically transparent cured film (a first optical member) with a certain thickness as a covering material of the microlens (a second optical member). Specifically, the specific optically transparent cured film described above exhibits excellent planarity and crack resistance and higher water absorption resistance.

BRIEF DESCRIPTION OF THE DRAWING

FIG. 1 is a graph which shows the relationship of the contact angle between an upper layer and a lower layer of an optically transparent cured film which is shown in the examples and the comparative examples.

DESCRIPTION OF THE PREFERRED EMBODIMENTS

A microlens unit which is a preferable embodiment of the present invention is equipped with an optically transparent cured film and a microlens body which is covered by the same. Examples of the lens unit include lens units which are formed of a plurality of convex lenses and an optically transparent cured film which covers the plurality of convex lenses from the swelling direction thereof, which are incorporated in a solid-state imaging element (an optical device). In the present invention, in the optically transparent cured film described above, optical characteristics which are suitable for lens units, planarity and crack resistance, as well as water absorption resistance are realized at the same time by adopting a laminated structure with an upper layer (an optically transparent cured film) and a lower layer (a lens body) which have specific contact angles with water. Below, description will be given of the present invention focusing on preferable embodiments thereof. Here, description will be given of a microlens unit as an example of an optical member set, an optically transparent cured film as an example of a first optical member, and a microlens body as an example of a second optical member.

<Optically Transparent Cured Film (First Optical Member)>

(Upper Layer)

Regarding the optically transparent cured film (which may be referred to below as "the upper layer") of the present embodiment, the contact angle with water on the surface of the opposite side of the side which comes into contact with the lens body is 80° or more, and preferably 81° or more. By setting this lower limit value or more, it is possible to realize a cured film with water absorption resistance. Furthermore, the contact angle is 115° or less, preferably 105° or less, more preferably 98° or less, and even more preferably 92° or less. By setting this upper limit value or less, it is possible to realize a cured film with favorable planarity. Here, unless otherwise specified, the contact angle is measured by the method which is adopted in the examples described later.

The optically transparent cured film is configured of a cured film of a curable resin composition. It is possible for the optically transparent cured film of the present embodiment to be formed by a resin composition for forming the optically transparent cured film where a curable resin such as a siloxane resin is contained in a solvent. By selecting a siloxane resin or a fluorine-based resin as a component of the upper layer, variation between the pixels is reduced, which is preferable. Alternatively, it is preferable that hollow particles be used as the component which is contained in the composition.

The optically transparent cured film is also used as a low refractive index film. Specifically, the refractive index (wavelength 633 nm, measuring temperature 25° C.) is preferably 1.5 or less, more preferably 1.25 to 1.46, even more preferably 1.30 to 1.44, and particularly preferably 1.37 to 1.42. When the refractive index is within the range described above, the optically transparent cured film is useful as an antireflection film. The cured film which forms the upper layer preferably has a refractive index which is lower than the refractive index of the lens body where the cured film forms the lower layer. Due to this, it is possible to obtain an effective antireflection effect. The difference in the refractive index between the optically transparent cured film and the microlens body is not particularly limited; however, 0.42 to 0.58 is preferable, and 0.45 to 0.55 is more preferable.

The thickness (a film thickness) of the optically transparent cured film is not particularly limited; however, a range of 0.5 μm or more is preferable, and 0.6 μm or more is more preferable. There is no particular upper limit; however, 3 μm or less is preferable, and 2.5 μm or less is more preferable. By setting the film thickness to this range, the durability as the microlens unit is excellent and the adhesion with cover glass is excellent even when used as the solid-state imaging element to be described later, which is preferable. In particular, in a case of setting a thick coating, the thickness may be greater than 1 μm. In a case where there are concavities and convexities in the lens body of the lower layer, the film thickness referred to here indicates the thickness from the height of the longest point of the lens body.

Here, to give detailed description of the film shape of the optically transparent cured film of the present embodiment, when the microlens which is the lower layer is a convex lens which has a spherical surface, it is preferable in terms of the processing that a large number of the microlenses be arranged to form a lens array and that the lens array be covered by the optically transparent cured film. At this time, the outer surface (the surface of the side which is opposite to the lens body) of the optically transparent cured film is preferably a flat surface regardless of the concavities and convexities of the lens. Thus, seen from the cross-section direction, the thickness of the optically transparent cured film is not uniform with respect to the lens body of the convex lens. According to the present invention, it is possible to favorably handle the formation of a cured film with such a form.

<Siloxane Resin Composition>

Examples of the material which configures the optically transparent cured film of the present embodiment include a siloxane resin as described above. It is possible to obtain the siloxane resin via hydrolysis and condensation reactions using an alkoxysilane raw material to be described later. More specifically, it is possible for the compounds to be compounds where an alkoxy group of a part or all of an alkyltrialkoxysilane is converted into a silanol group by hydrolyzation and at least a part of the silanol group which is generated is condensed to form a Si—O—Si bond. The siloxane resin may be a siloxane resin which has a silsesquioxane structure of any of a cage type, a ladder type, a random type, or the like. Here, regarding the "cage type", the "ladder type", and the "random type", it is possible to refer to the structures which are described in, for example, Chemistry and Application Development of Silsesquioxane Material (CMC Publishing) or the like.

(Silsesquioxane Structure)

The siloxane resin of the present embodiment preferably has a silsesquioxane structure which is represented by the following formula (1).

$$-(R^1SiO_{3/2})_n-$$  Formula (1)

(In the formula (1), $R^1$ represents an alkyl group which has 1 to 3 carbon atoms. n represents an integer from 20 to 1000.)

The alkyl group which is indicated by $R^1$ described above is not particularly limited within the range of the carbon number described above; however, examples thereof include a methyl group, an ethyl group, a propyl group, an isopropyl group, or the like. Among these, a methyl group and an ethyl group are preferable, and a methyl group is most preferable. In addition, the alkyl group which is indicated by $R^1$ may be an alkyl group which does not have a substituent group or an alkyl group which has a substituent group; however, an alkyl group which does not have a substituent group is preferable.

The substituent groups which may belong to the alkyl group which is indicated by $R^1$ are preferably not groups which have a halogen atom or an ethylenically unsaturated bond, and examples thereof include amino groups (preferably an amino group which has 0 to 20 carbon atoms, for example, amino, N,N-dimethylamino, N,N-diethylamino, N-ethylamino, anilino, or the like), sulfonamide groups (preferably a sulfonamide group which has 0 to 20 carbon atoms, for example, N,N-dimethyl sulfonamide, N-phenyl sulfonamide, or the like), acyloxy groups (preferably an acyloxy group which has 1 to 20 carbon atoms, for example, acetyloxy, benzoyloxy, or the like), carbamoyl groups (preferably a carbamoyl group which has 1 to 20 carbon atoms, for example, N,N-dimethylcarbamoyl, N-phenylcarbamoyl, or the like), acylamino groups (preferably an acylamino group which has 1 to 20 carbon atoms, for example, acetylamino, benzoylamino, or the like), or the like.

In the present invention, unless otherwise specified, the silicon-containing polymer which is configured of the main chain in the siloxane bond is referred to as polysiloxane or siloxane resin. Since there are four atomic bonds in the silicon, the basic constituent units of the polysiloxane are classified by how many organic groups which are represented by a methyl group or a phenyl group there are per silicon atom, and it is possible to divide the units into four as shown in the following. R in the following formula is an organic group.

[Chem. 1]

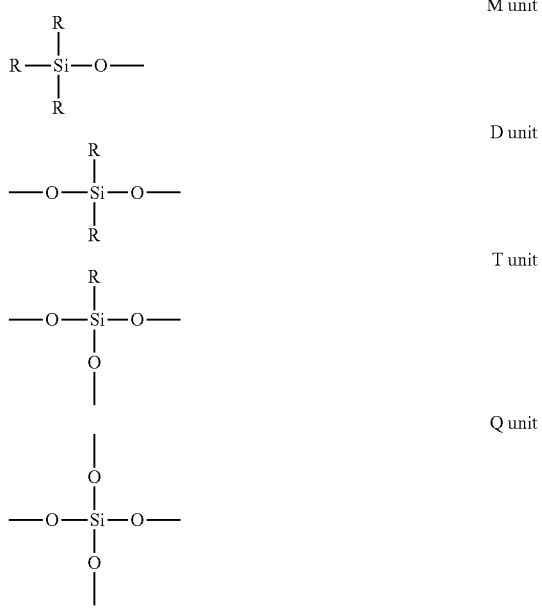

In the present invention, unless otherwise specified, the silsesquioxane has the meaning of a generic name for polysiloxane where the basic constituent unit is a T unit. Since the silicon in the silsesquioxane is bonded to three oxygen atoms and the oxygen is bonded to two silicon atoms, the theoretical composition is $RSiO_{3/2}$ (the Latin word which indicates 3/2 is "sesqui"). In the present embodiment, R in the formula of the T unit described above is $R^1$ described above, and it is preferable that the silsesquioxane structural moiety be included at the specific content ratio described above.

For the siloxane resin of the present embodiment, 65 mass % or more to 100 mass % or less of the total siloxane resin which is included in the cured film, that is, 65 mass % or more to 100 mass % or less of the total siloxane resin which is included in the resin composition for forming the optically transparent cured film is configured of the silsesquioxane structure described above. By the configuration ratio of the silsesquioxane structure described above being within this range, the flatness and the embedability of the microlens unit are excellent. This ratio is preferably 80 mass % or more to 100 mass % or less, more preferably 95 mass % or more to 100 mass % or less, and most preferably substantially 100 mass % (where, in a case of being 100 mass %, other components such as inevitable impurities may be included in a range which does not impair the desired effect). Here, the siloxane resin of the present embodiment may include only one type of a specific polysilsesquioxane structure, or may include two or more types.

The siloxane resin of the present embodiment is preferably a hydrolytic condensate which is obtained by hydrolytic condensation of the alkyltrialkoxysilane.

(Alkyltrialkoxysilane)

In order to manufacture the hydrolytic condensate in the present embodiment, as a starting raw material, it is possible to use an alkoxysilane raw material which includes alkyltrialkoxysilane. Here, the alkoxysilane raw material is intended as a starting material which is configured from alkoxysilane (a silicon compound which has an alkoxy group). By using the alkyltrialkoxysilane as a raw material, the structure of the obtained hydrolytic condensate is more flexible, and it is possible to further increase wettability with regard to the substrate due to the presence of organic components. In addition, it is understood that favorable planarity is realized while maintaining the optical transparency when the unique matrix is a cured product.

The alkyltrialkoxysilane is an organic silicon compound where one alkyl group and three alkoxy groups are bonded to the silicon atom, and it is possible for the alkyltrialkoxysilane to be represented by the following formula (2).

$$R^2Si(OR^3)_3 \qquad \text{Formula (2)}$$

($R^2$ represents an alkyl group which has 1 to 3 carbon atoms, an alkoxyalkyl group which has 1 to 8 carbon atoms, and a fluoroalkyl group which has 1 to 10 carbon atoms, and $R^3$ represents an alkyl group.)

The alkyl group ($R^2$ of the formula (2)) of the alkyltrialkoxysilane is not particularly limited within the range described above, and specific examples thereof include a methyl group, an ethyl group, a propyl group, an isopropyl group, a methoxymethyl group, a methoxypropyl group, a γ-glycidoxymethyl group, a γ-glycidoxypropyl group, a trifluoromethyl group, a trifluoroethyl group, a trifluoropropyl group, a perfluoro ethyl group, a perfluoropropyl group, a tridecafluorooctyl group, and the like. In addition, the methyl group, the ethyl group, the γ-glycidoxypropyl group, the trifluoromethyl group, the trifluoropropyl group, and the tridecafluorooctyl group are preferable among the above, and the methyl group is the most preferable.

The alkoxy group of the alkyltrialkoxysilane is not particularly limited, and examples thereof include a methoxy group and an ethoxy group. More specifically, as $R^3$ in the formula (2), a linear or branched alkyl group which has 1 to 20 carbon atoms is preferable. Here, 1 to 10 carbon atoms are preferable and 1 to 4 carbon atoms are more preferable. In particular, an ethoxy group where $R^3$ in the formula (2) is an ethyl group is preferable from the point of view of easy control of the hydrolytic speed.

Examples of the alkyltrialkoxysilane include methyl trimethoxysilane, methyl triethoxysilane, methyl tripropoxysilane, ethyl trimethoxysilane, ethyl triethoxysilane, propyl trimethoxy silane, propyl triethoxy silane, γ-glycidoxypropyltrimethoxysilane, trifluoropropyltrimethoxysilane, tridecafluorooctyltrimethoxysilane, and the like. Among these, methyltriethoxysilane, ethyltriethoxysilane and trifluoropropyltrimethoxysilane are favorably used, and methyltriethoxysilane is most preferably used. Here, as alkyltrialkoxysilane, only one type may be used, or two or more types may also be used together.

Preferably 65 mass % or more of the alkoxysilane raw material described above is alkyltrialkoxysilane, more preferably 80 mass % or more to 100 mass % or less, and even more preferably 95 mass % or more to 100 mass % or less. By the content being within these ranges, the planarity is further improved when being set as a cured film, which is preferable.

(Tetraalkoxysilane)

As an alkoxysilane raw material, it is possible to use other alkoxysilanes than the trialkoxysilane described above, among which, tetraalkoxysilane is preferable. By including tetraalkoxysilane, the cross-linking density in the hydrolytic condensate increases, which is preferable in that the electrical insulation property, the developing-resisting property, and the heat resistance of the film which is obtained by curing are improved.

The tetraalkoxysilane is an organic silicon compound where four alkoxy groups are bonded to the silicon atom, and it is possible for the tetraalkoxysilane to be represented by the following formula (3).

$$Si(OR^4)_4 \qquad \text{Formula (3)}$$

($R^4$ each independently represents an alkyl group.)

The alkoxy group of the tetraalkoxysilane is not particularly limited, and examples thereof include a methoxy group, an ethoxy group, and the like. More specifically, as $R^4$ in the formula (3), a linear or branched alkyl group which has 1 to 20 carbon atoms is preferable. Here, 1 to 10 carbon atoms is preferable and 1 to 4 carbon atoms is more preferable. In particular, an ethoxy group where $R^4$ in the formula (3) is an ethyl group is preferable from the point of view of easy control of the hydrolytic speed.

Examples of tetraalkoxysilane include tetramethoxysilane, tetraethoxysilane, tetra-n-propoxysilane, tetraisopropoxysilane, tetra-n-butoxysilane, tetraisobutoxy silane, tetra-tert-butoxysilane, and the like. Among these, tetramethoxysilane and tetraethoxysilane are favorably used.

Here, as tetraalkoxysilane, only one type may be used, or two or more types may also be used together.

The content of the tetraalkoxysilane in the alkoxysilane raw material is not particularly limited; however, from the point of view that the heat resistance of the film and the developing-resisting property of the composition is superior, 35 mass % or less is preferable, and 20 mass % or less is more preferable. There is no particular lower limit value; however, in the case of obtaining an additional effect of the tetraalkoxysilane, 0.01 mass % or more is preferable and 0.1 mass % or more is more preferable.

Here, where a compound is indicated in the present specification, this has a meaning which includes salts, complexes, and ions of the compound in addition to the compound itself. In addition, the meaning includes derivatives which are modified in predetermined forms in a range which has a desired effect. In addition, in the present specification, a substituent group (which includes a linking group) which is not specified as substituted or unsubstituted has the meaning that the group may have an arbitrary substituent group. The same applies to compounds which are not specified as substituted or unsubstituted. An example of a preferable substituent group is the substituent group T described below.

Examples of the substituent group T include the groups described below.

Alkyl groups (preferably an alkyl group which has 1 to 20 carbon atoms for example, methyl, ethyl, isopropyl, t-butyl, pentyl, heptyl, 1-ethylpentyl, benzyl, 2-ethoxyethyl, 1-carboxymethyl, or the like); alkenyl groups (preferably an alkenyl group which has 2 to 20 carbon atoms, for example, vinyl, allyl, oleyl, or the like); alkynyl groups (preferably an alkynyl group which has 2 to 20 carbon atoms, for example, ethynyl, butadiynyl, phenylethynyl, or the like); cycloalkyl groups (preferably a cycloalkyl group which has 3 to 20 carbon atoms, for example, cyclopropyl, cyclopentyl, cyclohexyl, 4-methyl cyclohexyl, or the like); aryl groups (preferably, an aryl group which has 6 to 26 carbon atoms, for example, phenyl, 1-naphthyl, 4-methoxyphenyl, 2-chlorophenyl, 3-methyl phenyl, or the like); heterocyclic groups (preferably a heterocyclic group which has 2 to 20 carbon atoms, for example, 2-pyridyl, 4-pyridyl, 2-imidazolyl, 2-benzimidazolyl, 2-thiazolyl, 2-oxazolyl, or the like); alkoxy groups (preferably an alkoxy group which has 1 to 20 carbon atoms, for example, methoxy, ethoxy, isopropyloxy, benzyloxy, or the like); aryloxy groups (preferably an aryloxy group which has 6 to 26 carbon atoms, for example, phenoxy, 1-naphthyloxy, 3-methylphenoxy, 4-methoxyphenoxy, or the like); alkoxycarbonyl groups (preferably an alkoxycarbonyl group which has 2 to 20 carbon atoms, for example, ethoxycarbonyl, 2-ethylhexyloxycarbonyl, or the like); amino groups (preferably an amino group which has 0 to 20 carbon atoms, for example, amino, N,N-dimethylamino, N,N-diethylamino, N-ethylamino, anilino, or the like); sulfonamide groups (preferably a sulfonamide group which has 0 to 20 carbon atoms, for example, N,N-dimethyl sulfonamide, N-phenyl sulfonamide, or the like); acyl groups (preferably an acyl group which has 1 to 20 carbon atoms, for example, acetyl, propionyl, butyryl, benzoyl, or the like); acyloxy groups (preferably an acyloxy group which has 1 to 20 carbon atoms, for example, acetyloxy, benzoyloxy, or the like); carbamoyl groups (preferably a carbamoyl group which has 1 to 20 carbon atoms, for example, N,N-dimethylcarbamoyl, N-phenylcarbamoyl, or the like); acylamino groups (preferably an acylamino group which has 1 to 20 carbon atoms, for example, acetylamino, benzoylamino, or the like); cyano groups, or a halogen atom (for example, a fluorine atom, a chlorine atom, a bromine atom, an iodine atom, or the like); more preferably an alkyl group, an alkenyl group, an aryl group, a heterocyclic group, an alkoxy group, an aryloxy group, an alkoxycarbonyl group, an amino group, an acylamino group, a cyano group, or a halogen atom, particularly preferably an alkyl group, an alkenyl group, a heterocyclic group, an alkoxy group, an alkoxycarbonyl group, an amino group, an acylamino group, or a cyano group.

When a compound, a substituent group, or the like includes an alkyl group, an alkenyl group, or the like, the groups may be linear or branched and may be substituted or unsubstituted. In addition, when an aryl group, a hetero cyclic group, or the like is included, the groups may be monocyclic or condensed and may be substituted or unsubstituted.

(Manufacturing of Siloxane Resin)

It is possible to obtain the siloxane resin which is included in the resin composition for forming the optically transparent cured film of the present embodiment via a hydrolysis reaction and a condensation reaction using the alkoxysilane raw material described above.

As the hydrolysis reaction and the condensation reaction, it is possible to use known methods and a catalyst such as an acid or a base may be used as necessary. The catalyst is not particularly limited as long as the catalyst changes pH, and specific examples of the acids (organic acids or inorganic acids) include nitric acid, oxalic acid, acetic acid, formic acid, hydrochloric acid, and the like, and examples of alkalis include ammonia, triethylamine, ethylenediamine, and the like. The amount to be used is not particularly limited as long as the siloxane resin satisfies a predetermined molecular weight.

A solvent may be added to the reaction system of the hydrolysis reaction and the condensation reaction as necessary. The solvent is not particularly limited as long as it is possible to carry out the hydrolysis reaction and the condensation reaction, and examples thereof include water, alcohols such as methanol, ethanol, and propanol, ethers such as ethylene glycol monomethyl ether, ethylene glycol monoethyl ether, and ethylene glycol monopropyl ether, esters such as methyl acetate, ethyl acetate, butyl acetate, propylene glycol monomethyl ether acetate, ketones such as acetone, methyl ethyl ketone, and methyl isobutyl ketone, and the like. Among these, here, it is preferable to apply a solvent which is different from a solvent which contains a siloxane resin which is described later, and it is more preferable to use an alcohol compound which has 1 to 5 carbon atoms or an ether compound which has 2 to 6 carbon atoms.

For the conditions (the temperature, the time, and the amount of solvent) of the hydrolysis reaction and the condensation reaction, the optimal conditions are selected according to the types of material which are used.

The weight average molecular weight of the siloxane resin which is used in the present embodiment is 1,000 to 50,000. Here, 2,000 to 45,000 is preferable, 2,500 to 25,000 is more preferable, and 3,000 to 25,000 is most preferable. In a case where the weight average molecular weight is within the ranges described above, the coating property with respect to the substrate is particularly good, and the planarity after coating is favorably maintained, which is preferable.

Here, the weight average molecular weight is a value which is measured using a known GPC (gel permeation chromatography) and calculated in terms of standard polystyrene. Unless otherwise specified, the GPC measurement was conducted by using Waters 2695 and Shodex GPC Column KF-805L (where three columns are directly connected) as columns, introducing 50 µl of a tetrahydrofuran solution where the column temperature is 40° C. and the sample density is 0.5 mass %, flowing tetrahydrofuran as an elution solvent at a flow rate of 1 ml per minute, and detecting sample peaks in an RI detecting apparatus (Waters 2414) and UV detecting apparatus (Waters 2996).

The content of the siloxane resin described above in the composition of the present embodiment is preferably more than 5 mass % to 50 mass % or less with respect to the total mass of the composition. Here, 10 mass % to 45 mass % is more preferable and 15 mass % to 40 mass % is particularly preferable.

(Surfactant)

From the viewpoint of improving the coating property and the planarity, the resin for forming the optically transparent cured film of the present embodiment preferably contains a surfactant which has a polyoxyalkylene structure. The polyoxyalkylene structure refers to a structure where an alkylene group and a divalent oxygen atom are adjacently present, and specific examples thereof include an ethylene oxide (EO) structure, a propylene oxide (PO) structure, and the like. As a surfactant which has a polyoxyalkylene structure, it is possible to use various types of surfactants such as fluorine-based surfactants, non-ionic surfactants, cationic surfactants, anionic surfactants, and silicone-based surfactants as long as the surfactant has the polyoxyalkylene structure. Among the above, the non-ionic surfactants, the anionic surfactants, and the silicone-based surfactants are preferable, the non-ionic surfactants and the anionic surfactants are more preferable, and the anionic surfactants are the most preferable.

In a case where a film is formed using a coating liquid where the resin composition for forming the optically transparent cured film of the present embodiment is applied, the wettability for the target coating surface is improved and the coating property to the target coating surface is improved by decreasing surface tension between the target coating surface and the coating liquid. In addition, the detailed operating mechanism is unclear; however, the planarity after post-baking is further improved by applying the surfactant, and it is also possible to favorably handle an applications with a high level of demand, which is preferable.

Examples of fluorine-based surfactants include Megafac F171, Megafac F172, Megafac F173, Megafac F176, Megafac F177, Megafac F141, Megafac F142, Megafac F143, Megafac F144, Megafac R30, Megafac F437, Megafac F479, Megafac F482, Megafac F554, Megafac F780, and Megafac F781 (the above are manufactured by DIC Corp.), Fluorad FC430, Fluorad FC431, and Fluorad FC 171 (the above are manufactured by Sumitomo 3M Inc.), Surflon S-382, Surflon S-141, Surflon S-145, Surflon SC-101, Surflon SC-103, Surflon SC-104, Surflon SC-105, Surflon SC 1068, Surflon SC-381, Surflon SC-383, Surflon S393, and Surflon KH-40 (the above are manufactured by Asahi Glass Co., Ltd.), Eftop EF301, Eftop EF303, Eftop EF351, and Eftop EF352 (the above are manufactured by Gemco Inc.), PF636, PF656, PF6320, PF6520, and PF7002 (manufactured by OMNOVA Inc.) and the like.

Specific examples of non-ionic type surfactants include ethoxylates and propoxylates of glycerol, trimethylol propane, and trimethylol ethane (for example, glycerol propoxylate, glycerin ethoxylate, and the like), polyoxyethylene lauryl ether, polyoxyethylene stearyl ether, polyoxyethylene oleyl ether, (Emulgen 404 and the like manufactured by Kao Corp.), polyoxyethylene octyl phenyl ether, polyoxyethylene nonylphenyl ether, polyethylene glycol dilaurate, polyethylene glycol distearate, and ELEBASE BUB-3 or the like manufactured by Aoki Oil Industrial Co., Ltd.

Specific examples of anionic type surfactants include W004, W005, W017 (manufactured by Yusho Co., Ltd.), EMULSOGEN COL-020, EMULSOGEN COA-070, and EMULSOGEN COL-080 manufactured by Clariant Japan Co., Ltd., and Plysurf A208B and the like manufactured by Dai-ichi Kogyo Seiyaku Co., Ltd.

Examples of the silicone-based surfactants include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400", manufactured by Toray Dow Corning Co., Ltd., "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Silicone Co., Ltd., "BYK307", "BYK323", and "BYK330", manufactured by BYK Chemie GmbH, "DBE-224", "DBE-621", manufactured by GELEST Ltd., and the like.

Regarding the surfactants, only one type may be used, or two or more types may be combined.

In addition, examples of the surfactant which has a preferable polyoxyalkylene structure of the present embodiment include the surfactant which is represented by the following general formula (4).

$R^5O(R^6O)_mR^7$        Formula (4)

(In the formula, $R^5$ represents an alkyl group which has 1 to 20 carbon atoms, $R^6$ represents an alkylene group which has 1 to 4 carbon atoms, and $R^7$ represents a hydrogen atom, a carboxyl group, or $—PO_3H_2$. m represents an integer from 1 to 8.)

More specifically, $R^5$ in the formula (4) may be a linear or branched alkyl group. Here, 5 to 20 carbon atoms is preferable and 12 to 18 carbon atoms is more preferable. $R^6$ in the formula (4) may be a linear or branched alkylene group and examples thereof include a methylene group, an ethylene group, a propylene group, an isopropylene group, a butylene group, an isobutylene group, and the like. Among these, an ethylene group and an isobutylene group (a group which forms an ethylene oxide structure or a propylene oxide structure with an adjacent O atom) are preferable. $R^7$ in the formula (4) is preferably a hydrogen atom or a carboxyl group, and the carboxyl group is most preferable.

By using the surfactant which is represented by the general formula (4) described above, it is possible to satisfy the above in a range where the planarity is further preferable.

The added amount of the surfactant is not particularly limited; however, the lower limit value of the added amount is preferably in a range of 1 part by mass or more with respect to 100 parts by mass of the curable resin described above, more preferably 1.5 parts by mass or more, and most preferably 7.5 parts by mass or more. The upper limit value is also not particularly limited; however, 30 parts by mass or less is preferable, and 15 parts by mass or less is more preferable. By the added amount being within these ranges, the planarity is excellent.

In the resin composition of the present embodiment, other surfactants may be used together along with or separately from the surfactant which has the polyoxyalkylene structure described above. It is possible to use ordinarily used surfactants as the surfactants which may be used together, and in particular, it is preferable to use a silicone-based surfactant together with the ordinarily used surfactant. Examples of a preferable silicone-based surfactant include a polysiloxane type surfactant where an organic group is introduced to the side chain or the terminal, or to the side chain and the terminal. Examples of a side chain group include an amino group, an epoxy group, a carbinol group, a mercapto group, a carboxyl group, a hydrogen group, a polyether group, an aralkyl group, a fluoroalkyl group, and a phenyl group, and examples of terminal groups, include an amino group, an epoxy group, a carbinol group, a methacrylic group, a polyether group, a mercapto group, a carboxyl group, a phenolic group, a silanol group, a diol group, and the like.

Alternatively, an alkylalkoxysilane compound (referred to below as alkoxysilane compound α') which has a specific number of carbon atoms is preferably contained along with the surfactant which has the polyoxyalkylene structure described above, or three types of surfactant of the surfactant which has the polyoxyalkylene structure described above, the silicone-based surfactant, and the alkoxysilane compound a may be used together. As the alkoxysilane compound α, it is preferable to apply an alkoxysilane compound which has an alkyl group which has 4 to 12 carbon atoms (more preferably 6 to 10 carbon atoms). When the alkoxysilane compound α is represented by a general formula, the compound which is represented by the following formula (5) is preferable.

$Si(OR^{51})_{n-4}(R^{52})_n$        Formula (5)

Here, $R^{51}$ is a group with the same meaning as $R^4$ described above. $R^{52}$ is preferably an alkyl group which has 4 to 12 carbon atoms and more preferably an alkyl group which has 6 to 10 carbon atoms. n is an integer from 1 to 3.

The blended amount of the surfactant which is used together with the surfactant which has a polyoxyalkylene structure may be arbitrarily adjusted; however, for example, with respect to 100 parts by mass of the surfactant which has a polyoxyalkylene structure, it is preferable to use the surfactant which is used together in a range of 0.01 to 100 parts by mass, more preferably 1 to 100 parts by mass, and even more preferably 10 to 100 parts by mass.

(Hollow Particles)

The curable resin composition described above or the cured film formed by curing the curable resin composition preferably includes hollow particles. As the hollow particles, porous fine particles may be used in addition to particles with a hollow structure. The hollow particles have a structure which has hollows inside and indicate particles which have hollows surrounded by an outline, and the porous particles indicate porous particles which have many hollows. Below, the hollow particles or the porous particle will be appropriately referred to as 'specific particles'. The specific particles may be organic particles or inorganic particles.

The porosity of the specific particles is preferably 10 to 80%, more preferably 20 to 60%, and most preferably 30 to 60%. Setting the porosity of the specific particles to the range described above is preferable from the point of view of reducing the refractive index and maintaining the durability of the particles.

Among the specific particles, from the point of view that it is easier to reduce the refractive index, hollow particles are more preferable, and hollow silica particles are even more preferable. For example, in a case where the hollow particles are configured of silica, since the hollow silica particles have air which has a low refractive index (refractive index=1.0), the refractive index is remarkably low in comparison with ordinary silica (refractive index=1.6).

As a method of manufacturing the hollow particles, for example, it is possible to apply the method which is described in JP2001-233611A. In addition, as a method of manufacturing the porous particles, for example, it is possible to apply the methods which are described in JP2003-327424A, JP2003-335515A, JP2003-226516A, JP2003-238140A, and the like.

In addition, the average primary particle diameter of the specific particles is preferably 1 nm to 200 nm, and more preferably 10 nm to 100 nm.

It is possible to calculate the average primary particle diameter of the specific particles from a photograph which is obtained by observing dispersed particles with a transmission type electron microscope. The circle equivalent diameter which is obtained by calculating the projected area of the particles is set as the average primary particle diameter. The average primary particle diameter in the present specification is calculated by determining the circle equivalent diameter by measuring the projected area for 300 or more particles.

The refractive index of the specific particles is preferably 1.10 to 1.40, more preferably 1.15 to 1.35, and most preferably 1.15 to 1.30.

Here, the refractive index represents the refractive index of the particles as a whole, and does not represent only the refractive index of the shells which form the hollow particles is represented in a case where the particles are hollow particles. In a case where the particles are porous particles, it is possible to measure the refractive index of the porous particles with an Abbe refractometer (manufactured by Atago Co., Ltd.) (measuring temperature 25° C., wavelength 633 nm).

The specific particles are preferably hollow or porous inorganic particles from the point of view of reducing the refractive index. Examples of inorganic low refractive index particles include magnesium fluoride particles and silica particles, and the silica particles are more preferable from the point of view of reducing the refractive index, of the dispersion stability, and of the cost.

The average primary particle diameter of these inorganic particles is preferably 1 nm to 100 nm, and more preferably 1 nm to 60 nm.

As long as the necessary porosity is satisfied, the crystal system of the inorganic particles may be crystalline or amorphous, and the inorganic particles may be monodispersed particles or aggregated particles as long as the predetermined particle diameter is satisfied. Regarding the shape, a spherical shape is most preferable; however, the shape may be a rosary shape, a shape where the ratio of the long diameter and the short diameter is 1 or more, or an irregular shape.

The specific surface area of an inorganic particle is preferably 10 $m^2/g$ to 2000 $m^2/g$, more preferably 20 $m^2/g$ to 1800 $m^2/g$, and most preferably 50 $m^2/g$ to 1500 $m^2/g$.

For the inorganic particles, physical surface treatments such as a plasma discharge treatment or a corona discharge treatment, chemical surface treatments using a surfactant or a coupling agent, or the like may be carried out in order to stabilize the dispersion or improve the affinity with the binder component and the bonding property in the curable resin composition. The use of the coupling agent is particularly preferable. As a coupling agent, an alkoxymetal compound (for example, a titanium coupling agent, or a silane coupling agent) is preferably used. Here, a silane coupling treatment is particularly effective.

That is, in a case where the inorganic particles are silica particles and the coupling agent is a silane compound, an organosilyl group (monoorganosilyl, diorganosilyl, and triorganosilyl groups) bonds with the surface of the silica particles due to the reaction between the silane compound and a silanol group. Examples of organic groups which have surface-treated silica particles on the surface thereof include a saturated or unsaturated hydrocarbon group which has 1 to 18 carbon atoms, a halogenated hydrocarbon group which has 1 to 18 carbon atoms, and the like.

The coupling agent described above may be used as a surface treatment agent of inorganic particles in order to carry out a surface treatment in advance before preparing the coating liquid for the low refractive index film, or may be added as a further additive at the time of preparing the coating liquid.

Dispersing the inorganic particles in the medium in advance before the surface treatment is preferable in order to reduce the load in the surface treatment.

A more favorable aspect of the specific particles is silica particles.

It is possible to preferably use commercial products as the specific particles formed of silica.

For example, it is possible to use silica particles such as the Thrulya series manufactured by JGC C&C (hollow particles, isopropanol (IPA) dispersion, 4-methyl-2-pentanone (MIBK) dispersion, and the like. For example, Thrulya 2320, and the like.), OSCAL series, Snowtex series manufactured by Nissan Chemical Industries Ltd., (porous particles, an IPA dispersion, an ethylene glycol dispersion, a methyl ethyl ketone (MEK) dispersion, a dimethylacetamide dispersion, a MIBK dispersion, a propylene glycol monomethyl acetate dispersion, a propylene glycol monomethyl ether dispersion, a methanol dispersion, an ethyl acetate dispersion, a butyl acetate dispersion, a xylene-n-butanol dispersion, a toluene dispersion, and the like. For example, MIBK-SD-L, MIBK-ST, and the like), Silinax manufactured by Nittetsu Mining Co., Ltd. (porous particles), PL series manufactured by Fuso Chemical Co., Ltd. (porous particles, an IPA dispersion, a toluene dispersion, a propylene glycol monomethyl ether dispersion, a methyl ethyl ketone dispersion, and the like. For example, PL-1-IPA, PL-2L-PGME, and the like), Aerosil series manufactured by EVONIK (porous particles, a propylene glycol acetate dispersion, an ethylene glycol dispersion, an MIBK dispersion, and the like).

In a case where silica particles are added to a photosensitive composition as a dispersion which contains silica particles and a particle dispersing agent (the details of the particle dispersing agent will be described later), the content of the silica particles in the silica dispersing agent is preferably 10 mass % to 50 mass %, more preferably 15 mass % to 40 mass %, and even more preferably 15 mass % to 30 mass %.

The content of the specific particles with respect to the total solid content in the curable resin composition is preferably 5 mass % to 95 mass %, more preferably 10 mass % to 90 mass %, and even more preferably 20 mass % to 90 mass %.

In a case where a film is formed using the curable resin composition, the coating amount of the specific particles is preferably 1 mg/m² to 100 mg/m², more preferably 5 mg/m² to 80 mg/m², and even more preferably 10 mg/m² to 60 mg/m². By the coating amount being 1 mg/m² or more, it is possible to reliably obtain an effect of reducing the refractive index and an effect of improving the scratch resistance, and along with this, by the coating amount being 100 mg/m² or less, it is possible to suppress the deterioration of the integral reflectance caused by making fine concavities and convexities on the surface of the cured film.

(Fluorine-Based Resin)

The curable resin composition or a cured film formed by curing the curable resin composition preferably includes a fluorine-based resin. Examples thereof include a fluorine-based siloxane polymer which is described in JP2004-21036A.

The fluorine-based resin is a resin which contains fluorine in the substance molecule, and specific examples include polytetrafluoroethylene, polyhexafluoropropylene, tetrafluoroethylene/hexafluoropropylene copolymers, tetrafluoroethylene/perfluoroalkyl vinyl ether copolymers, tetrafluoroethylene/ethylene copolymers, hexafluoropropylene/propylene copolymers, polyvinylidene fluoride, vinylidene fluoride/ethylene copolymers, and the like, among these, polytetrafluoroethylene, tetrafluoroethylene/perfluoroalkyl vinyl ether copolymers, tetrafluoroethylene/hexafluoropropylene copolymers, tetrafluoroethylene/ethylene copolymers, and polyvinylidene fluoride are preferable, in particular, polytetrafluoroethylene, tetrafluoroethylene/ethylene copolymers are preferable, polytetrafluoroethylene is more preferable, and a polytetrafluoroethylene-containing mixed powder formed of polytetrafluoroethylene particles and an organic polymer is also preferably used. The molecular weight of a fluorine-based resin such as polytetrafluoroethylene is preferably in the range of 100,000 to 10,000,000, particularly preferably in the range of 100,000 to 1,000,000, which is particularly effective for the extrusion molding property and the flame retardance. As commercial products of polytetrafluoroethylene, 'Teflon (registered trademark)' 6-J, 'Teflon (registered trademark)' 6C-J, and 'Teflon (registered trademark)' 62-J which are manufactured by Du Pont-Mitsui Fluorochemicals Co., Ltd., 'Fluon' CD1 or CD076 which are manufactured by Asahi Glass Co., Ltd., and the like are commercially available. In addition, as commercial products of polytetrafluoroethylene-containing mixed powder formed of polytetrafluoroethylene particles and an organic polymer, 'Metablen (registered trademark)' A-3000, and 'Metablen (registered trademark)' A-3800 are commercially available from Mitsubishi Rayon Co., Ltd. In addition, since 'Teflon (registered trademark)' 6-J and the like which are polytetrafluoroethylene are easily aggregated, there are cases where lumps are created due to the aggregation when strongly mixed with other resin compositions mechanically by a Henschel mixer or the like, and there are problems with the handling property or the dispersibility according to the mixing conditions. On the other hand, the polytetrafluoroethylene-containing mixed powder formed of polytetrafluoroethyl ene particles and an organic-based polymer is excellent in the handling property or dispersibility and is particularly preferably used. The polytetrafluoroethylene-containing mixed powder formed of the polytetrafluoroethylene particles and the organic polymer is not limited; however, examples thereof include the polytetrafluoroethylene-containing mixed powder formed of the polytetrafluoroethylene particles and organic-based polymer which are disclosed in Japanese Unexamined Patent Application Publication No. 2000-226523, and the organic polymer may be organic polymers and the like which contain 10 mass % or more of an aromatic vinyl monomer, an acrylate ester monomer, and a vinyl cyanide monomer, or may be a mixture thereof, and the content of the polytetrafluoroethylene in the polytetrafluoroethylene-containing mixed powder is preferably 0.1 mass % to 90 mass %.

Furthermore, as the fluorine-based resin, an amorphous fluorine resin, a copolymer oligomer which contains an acrylate or a methacrylate containing a perfluoroalkyl group, a fluorine-based coating agent, a fluorine-based surfactant, a fluorine-based surface treatment agent which contains an electron beam or an ultraviolet ray curing component, a fluorine-based surface treatment agent which contains a thermosetting component, and the like are also preferable. As other copolymer components than the copolymer oligomer which contains an acrylate or a methacrylate containing a perfluoroalkyl group, an alkyl acrylate or an alkyl methacrylate are preferable.

Specific examples will be shown below. Examples of an amorphous fluorine resin include Lumiflon manufactured by Asahi Glass Co., Ltd., CYTOP by Asahi Glass Co., Ltd., and the like. Examples of a copolymer oligomer which is mainly composed of a (meth)acrylate and an alkyl(meth)acrylate containing a perfluoroalkyl group include the Modiper F series manufactured by NOF Corp., Unidyne manufactured by Daikin Industries, Ltd., Megafac F470 series, Megafac F480 series, Megafac F110 series manufactured by DIC Corp., and the like, and the copolymer is more preferably a block copolymer. Examples of a fluorine-based coating agent include EGC1700 manufactured by Sumitomo 3M Inc. Examples of a fluorine-based surfactant include Megafac F114, Megafac F410 series, Megafac F440 series, Megafac F450, Megafac F490 series, and the like manufactured by DIC Corp. Examples of a fluorine-based surface treatment agent which contains an electron beam or ultraviolet ray curable component include PolyFox PF-3320 manufactured by OMNOVA Solutions, CHEMINOX FAMAC-8 manufactured by Unimatec Co., Ltd., EGC1720 manufactured by Sumitomo 3M Inc., and the like. Examples of a fluorine-based surface treatment agent which includes a thermosetting component include EGC1720 manufactured by Sumitomo 3M Inc., NH-10, NH-15, and the like manufactured by DIC Corp.

Examples of an amorphous fluorine resin include a resin which has the following structural formula.

[Chem. 2]

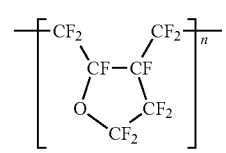

The fluorine resin may be a mixture of a plurality of types of fluorine-containing compounds.

The added amount of the fluorine-based resin is not particularly limited; however, from the same point of view as the siloxane resin described above, it is preferable that the content ratio is in the same range as that of the siloxane resin described above.

(Curing Agent)

The resin composition for foaming the optically transparent cured film of the present embodiment may further contain a curing agent. As a curing agent, curing agents formed of Al, Mg, Mn, Ti, Cu, Co, Zn, Hf, and Zr are preferable and it is possible to use these together.

It is possible to easily obtain these curing agents by reacting a chelating agent with metal alkoxides. As examples of a chelating agent, it is possible to use β-diketones such as acetylacetone, benzoylacetone and dibenzoylmethane; β-keto acid esters such as ethyl acetoacetate and benzoylethylacetate, and the like.

The preferable specific examples of a metallic chelate compound include aluminum chelate compounds such as ethyl acetoacetate aluminum diisopropylate, aluminum tris (ethyl acetoacetate), alkyl acetoacetate diisopropylate, aluminum mono acetyl acetate bis(ethyl acetoacetate), aluminum tris(acetylacetonate), or the like; magnesium chelate compound such as ethyl acetoacetate magnesium mono diisopropylate, magnesium bis(ethyl acetoacetate); alkyl acetoacetate magnesium mono diisopropylate, magnesium bis(acetylacetonate), or the like; zirconium tetraacetyl acetonate, zirconium tributoxy acetylacetonate, zirconium acetylacetonate bis(ethyl acetoacetate), manganese acetylacetonate, cobalt acetylacetonate, copper acetylacetonate, titanium acetylacetonate, titanium oxy acetylacetonate, and the like. Among these, aluminum tris(acetylacetonate), aluminum tris(ethyl acetoacetate), magnesium bis(acetylacetonate), magnesium bis(ethyl acetoacetate), and zirconium tetraacetylacetonate are preferable, and aluminum tris (acetylacetonate) and aluminum tris(ethyl acetoacetate) are particularly preferable in consideration of storage stability and availability.

With respect to 100 parts by mass of the total content of the siloxane resin, the total content of a curing agent is preferably 0:001 parts by mass to 10 parts by mass, more preferably 0.01 parts by mass to 5 parts by mass, and particularly preferably 0.01 parts by mass to 0.5 parts by mass. When there is a curing agent, the curing progresses sufficiently, and in a case of a cured film, it is possible to obtain a favorable chemical resistance, and the planarity is excellent.

(Solvent)

In general, it is possible to configure the resin composition for forming the optically transparent cured film (the curable resin composition) of the present embodiment by using an organic solvent. The organic solvent is basically not particularly limited as long as the solubility of each of the components or the coating property of the resin composition for forming the optically transparent cured film is satisfied; however, it is particularly preferable to select the organic solvent by taking the solubility of the binder, the coating property, and safety into consideration. In addition, two types of organic solvent may be included when preparing the resin composition for forming the optically transparent cured film in the present embodiment.

Favorable examples of an organic solvent include, as esters, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, oxyacetic acid alkyl (for example: oxy-methyl acetate, oxy ethyl acetate, and oxy-butyl acetate (for example, methoxy methyl acetate, methoxy ethyl acetate, methoxy butyl acetate, ethoxy methyl acetate, ethoxy ethyl acetate, and the like)), 3-oxypropionate alkyl esters (for example: 3-oxypropionate methyl, 3-oxypropionate ethyl, and the like (for example, methyl 3-methoxy propionate, ethyl 3-methoxy propionate, methyl 3-ethoxy propionate, ethyl 3-ethoxy propionate, and the like)), 2-oxy propionatealkyl esters (for example: 2-oxypropionate methyl, 2-oxy propionate ethyl, 2-oxypropionate propyl, and the like (for example, 2-methoxy propionate methyl, 2-methoxy propionate ethyl, 2-methoxy-propionate propyl, 2-ethoxy propionate methyl, 2-ethoxy propionate ethyl)), 2-oxy-2-methyl-propionate methyl, and 2-oxy-2-methyl propionate ethyl (for example, 2-methoxy-2-methyl propionate methyl, 2-ethoxy-2-methyl propionate ethyl, and the like), methyl pyruvate, ethyl pyruvate, propyl pyruvate, methyl acetoacetate, ethyl acetoacetate, 2-oxobutanoate methyl, 2-oxobutanoate ethyl, and the like; in addition to, as ethers, for example, diethylene glycol dimethyl ether, dipropylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol mono-n-butyl ether, propylene glycol mono-tert-butyl ether, propylene glycol monomethyl ether acetate, propylene glycol monoethyl ether acetate, propylene glycol mono-propyl ether acetate, and the like; in addition to, as ketones, for example, methyl ethyl ketone, cyclohexanone, 2-heptanone, and 3-heptanone; in addition to, as aromatic hydrocarbons, for example, toluene, and xylene.

The 3-ethoxy propionate methyl, 3-ethoxy propionate ethyl, ethyl cellosolve acetate, ethyl lactate, diethylene glycol dimethyl ether, butyl acetate, 3-methoxy propionate methyl, 2-heptanone, cyclohexanone, ethylcarbitol acetate, butylcarbitolacetate, propylene glycol methyl ether, dipropylene glycol dimethyl ether, propylene glycol mono-n-butyl ether, propylene glycol mono-tert-butyl ether, and propylene glycol methyl ether acetate described above are particularly preferable.

In the resin composition for forming the optically transparent cured film of the present embodiment, the applied solvent is preferably 50 to 99.9 mass % of the total amount of the resin composition for forming the optically transparent cured film, and more preferably 60 to 95 mass %. In a case where the amount of the compound is the lower limit value described above or more, the coating property is good, which is preferable. In a case where the amount of the compound is the upper limit value described above or less, the coating property is good in the same manner, which is preferable.

(Viscosity)

It is preferable that the viscosity of the resin composition for forming the optically transparent cured film of the present embodiment be adjusted from the point of view of forming a good transparent film with a certain thickness. The specific range of the viscosity is not particularly limited; however, 1 cP to 20 cP is preferable, 2 cP to 15 cP is more preferable, and 4 cP to 6 cP is particularly preferable. Unless otherwise specified, the value of the viscosity in the present specification is obtained by the measuring method described below.

Measuring Method

Measurement is carried out at room temperature (approximately 25° C.), using an E-type viscometer 'TV-20 type viscometer-cone plate type TVE-20L' (manufactured by Toki Sangyo Co., Ltd.). The sampling is the average of the values from measuring the viscosity five times every 100 seconds.

Here, the composition in the present invention refers to two or more components which substantially uniformly exist in a specific composition. Here, substantially uniform has the meaning that each of the components may be unevenly distributed in a range where the effect of the invention is achieved. In addition, composition also has the meaning that the form of the composition is not particularly limited as long as the definition described above is satisfied, that the composition is not limited to a liquid or paste with fluidity, and that solids, powders, and the like formed of a plurality of components are included. Furthermore, the composition also has a meaning which things which are included in the composition so as to preserve a dispersion state for a predetermined time by stirring even in a case where there is sedimentation.

<Microlens Unit (Optical Member Set)>

The microlens unit according to a preferable embodiment of the present invention is incorporated in a solid-state imaging element and has a microlens body and an optically transparent cured film which covers the microlens body. Here, the term microlens body includes the meaning of a microlens array and may simply refer collectively to a lens body (lens member, lens members). In a case where a microlens array is used as a microlens body, ideally, groove sections which are gaps between the microlens bodies are embedded in the optically transparent cured film without intervals, and spaces (voids) or the like are not generated at all. In such a form, the microlens unit does not generate noise from the voids in the light which passes through the unit and achieves a high quality performance.

The shape of the microlens body according to the present embodiment is not particularly limited; however, a convex lens is preferably used. Unless otherwise specified, the convex lens in the present invention includes a plano-convex lens, a biconvex lens, a convex meniscus lens and the like, and indicates a lens which has a part which swells in at least one direction. Specific examples of shapes of the convex lens include a polyhedral shape, a spherical shape, an aspheric shape (a shape which does not have a spherical aberration which is formed on a freely curved surface), and the like. Examples of shapes of the polyhedron include a regular polyhedral shape, a semi regular polyhedral shape, a columnar shape, a cylindrical shape, and the like. In addition, Fresnel lenses or the like with a light condensing effect are also included in the convex lens in the present invention.

<Microlens Body (Second Optical Member)>

In the present embodiment, the contact angle with the water on the surface, which comes into contact with the optically transparent cured film, of the microlens body is 70° or more, and preferably 75° or more. By setting this lower limit value or more, it is possible to improve the planarity of the optically transparent cured film. Furthermore, from the same point of view, the contact angle is 97° or less, preferably 92° or less, and more preferably 85° or less. Here, unless otherwise specified, the contact angle is measured by the method which is adopted in the examples described later.

In the present embodiment, the lens body is preferably made of materials which exhibit a high refractive index property. Specifically, the refractive index (wavelength 633 nm, measuring temperature 25° C.) of the lens body is preferably 1.8 or more, and more preferably 1.85 to 1.95. By the refractive index being within these ranges, when used in combination with the antireflection film described above, it is possible to obtain a lens unit with a high quality performance.

It is preferable that the lower layer be formed containing titania or zirconia and that the lower layer have particles of titania or zirconia or hollow particles. By selecting such a lower layer, variation between pixels is reduced, which is preferable. The particle diameter of the particles described above is not particularly limited; however, the primary particle diameter is 1 nm to 100 nm, preferably 1 nm to 80 nm, and particularly preferably 1 nm to 50 nm. Unless otherwise specified, the average particle diameter in the present specification refers to the value measured by the measuring method which is adopted in the examples described later. The specific configuration of the particles is not particularly limited; however, it is possible to use a configuration which is generally applied to this type of product after appropriate selection.

As in the present embodiment, the aspect where the microlens body is used as a microlens array is preferably arranged to face in substantially the same direction as the swelling direction. Here, an array refers to two or more lenses being lined up at predetermined intervals, and the intervals may be uniform or may be different. Preferably, the array is two-dimensionally arranged on one flat surface, and more preferably two-dimensionally arranged at equal intervals. In addition, the intervals between the lenses are normally in a range of 100 nm to 1,000 nm, and in a case of being arranged densely, 100 nm to 400 nm is more preferable. Concave sections are formed between the lenses in most cases, the shapes of which are determined according to the shape of the swollen convex lenses. With convex lenses whose cross-section is an arched shape (the side defined by the arc and the chord), a concave section, which has a cross-section where two lines of a V shape are configured of the opposite arc, is formed.

The height (thickness) of the lens body (a lower layer) is not particularly limited; however, 200 nm (0.2 µm) or more is preferable, and 250 nm (0.25 µm) or more is more preferable. The upper limit is preferably 2,000 nm (2 µm) or less, more preferably 1,000 nm (1 µm) or less, and particularly preferably 900 nm (0.9 µm) or less. The width of the lens body is not particularly limited; however, with respect to the color filter size below, 70% to 80% is practical (for example, in a case where the color filter size is 1,400 nm, the width of the lens body is 980 nm to 1,120 nm). Here, the height of the lens body refers to the height of the longest point of the lens body.

<Manufacturing Method of Microlens Unit>

In the present invention, the embodiments into which the microlens unit is able to be incorporated are not particularly limited, and it is possible to appropriately select the embodiments according to the use of the microlens unit, and the object. Specific aspects are described below; however, the present invention is not limited to these configurations. Here, referring to 'cover' in the present specification, the meaning encompasses not only a case of covering by directly coming into contact with the target object, but also covering via other layers.

First aspect: An aspect where a microlens body is formed by being directly covered with an optically transparent cured film.

Second aspect: An aspect where a microlens body is formed by being covered with an overcoat layer and is further formed by being covered with an optically transparent cured film.

Third aspect: An aspect where a layer of an optically transparent cured film is formed between a microlens body and a semiconductor light receiving unit.

Among these, the first aspect is preferable. Below, detailed description will be given of the manufacturing method for the first aspect.

(Coating Composition)

The resin composition for forming the optically transparent cured film of the present embodiment is preferably used as a forming material of an antireflection film or a low refractive index film. The method of coating a work piece such as a lens body in order to form a cured film is not particularly limited; however, it is possible to apply an appropriate known coating method. For example, it is possible to apply a spin coating method, a dip coating method, a rollerblade method, a spray method, or the like. As necessary, it is preferable to carry out a heat treatment or the like on the coated coating film and to remove the solvent which is included in the coating film.

(Formation of Cured Film)

It is preferable to form the cured film by removing the solvent after applying the resin composition for forming the optically transparent cured film onto a work piece. Therefore, the coating film after coating is preferably left to stand for 1 minute to 10 minutes, more preferably 1 minute to 5 minutes, under conditions of preferably 60° C. to 200° C., more preferably 100° C. to 150° C. Here, the solvent removal may be carried out two or more times under different conditions.

In the present embodiment, the coated resin composition for forming the optically transparent cured film described above is preferably heated to further promote the curing. By doing so, it is possible to realize a more stable form and improve the developing-resisting property. The heating temperature is not particularly limited as long as the coating film is cured; however, normally, 150° C. to 400° C. is preferable. Here, 150° C. to 280° C. is preferable and 150° C. to 240° C. is more preferable. Under the heating conditions described above, it is possible for the coating film to be sufficiently cured and to form an excellent film. The heating time is not particularly limited; however, 1 minute to 60 minutes is preferable and 1 minute to 30 minutes is more preferable. The method of heating is not particularly limited; however, it is possible to apply heating using a hot plate, an oven, a furnace, or the like.

The atmosphere at the time of heating is not particularly limited, and it is possible to apply an inert atmosphere, an oxidizing atmosphere, or the like. It is possible to realize the inert atmosphere using an inert gas such as nitrogen, helium, or argon. It is possible to realize the oxidizing atmosphere using a mixed gas of the above inert gases and an oxidizing gas, and air may also be used. Examples of the oxidizing gas include oxygen, carbon monoxide, diinitrogen monoxide, and the like. It is possible to carry out the heating process under any pressure of added pressure, normal pressure, or reduced pressure, or in a vacuum.

The cured film which is obtained by the heating treatment described above is mainly configured of organic silicon oxide (SiOC). Due to this, for example, it is possible to carry out etching treatment with high precision as necessary on the work piece or the cured film even with a fine pattern, and it is also possible to favorably handle the manufacturing processes of minute solid-state imaging elements.

(Antireflection Film)

Examples of a favorably used aspect of the cured film in the present invention include an antireflection film. In particular, the cured film is favorable as an antireflection film for use in an optical device where solid-state imaging elements and the like are used, such as a microlens for image sensors, a plasma display panel, a liquid crystal display, or an organic electroluminescence device. In a case of being used as an antireflection film, the reflectance is preferably as low as possible. Specifically, the average specular reflectance in the wavelength region of 450 nm to 650 nm is preferably 3% or less, more preferably 2% or less, and most preferably 1% or less. Here, the smaller the reflectance is, the more preferable, and 0 is the most preferable.

The haze of the antireflection film is preferably 3% or less, more preferably 1% or less, and most preferably 0.5% or less. Here, the smaller the reflectance is, the more preferable, and substantially 0 is the most preferable.

<Solid-State Imaging Element>

The solid-state imaging element according to a preferable embodiment of the present invention has a microlens unit on a semiconductor light receiving unit and is incorporated such that the microlens body comes into contact with a color filter. A light receiving element receives light which passes through the optically transparent cured film, the lens body and the color filter in order, and functions as an image sensor. Specifically, the optically transparent cured film functions as an antireflection film, improves the light collection efficiency of the lens body, and the light which is efficiently collected by the lens body is detected by the light receiving element via the color filter. Since the above function across all of the elements which detect the light which corresponds to each of RGB, it is possible to obtain an extremely clear picture even in a case where light receiving elements and lens bodies are arranged at a high density.

Here, which is the upper or the lower of the elements and units is not limited; however, unless otherwise specified, the optically transparent cured film side is the upper or the outer side, and the light receiving element side is the lower or the inner side.

An example of the solid-state imaging element where the microlens array is applied is described in JP2007-119744A. Specifically, there are transfer electrodes between the CCD region, which is formed on the surface of a semiconductor substrate, and the photoelectric conversion sections, and a light shielding film is formed on the transfer electrodes via an interlayer film. An interlayer insulation film using BPSG (Boro-Phospho-Silicate Grass) or the like, a passivation film, and a transparent flattening film with a low refractive index using an acrylic-based resin and the like are laminated on the interlayer film, and a color filter where R, G, and B are incorporated is formed thereon. Furthermore, a large number of microlenses are arranged and formed via a protective film to be positioned at the upper side of the photoelectric conversion sections which are a light receiving region.

The microlens unit according to a preferable embodiment in the present invention is preferably configured as described below. That is, a plurality of convex lenses are applied as the microlens body described above, the plurality of convex lenses are arranged to face in substantially the same direction as the swelling direction of the convex lenses, the plurality of convex lenses are covered by the optically transparent cured film described above from the swelling direction, the optically transparent cured film described above is filled into concave sections which are formed between the plurality of convex lenses substantially without gaps while the opposite side of the lens body described above in the optically transparent cured film is a flat surface.

The microlens unit in this present invention is favorably used in other uses than for a solid-state imaging element. Examples of other uses include various types of automated office equipment, liquid crystal televisions, cellular phones, liquid crystal display elements for projectors and the like, facsimile machines, electronic copying machines, imaging optical systems of on-chip color filters of solid-state imaging elements or the like, and the like, and it is possible to use the microlens unit for these various uses.

Below, detailed description will be given of a preferable embodiment of the lower layer (high refractive index layer) in the present invention. The description of the configuration conditions described below is based on a representative embodiment of the present invention; however, the present invention is not limited to such an embodiment.

The lower layer (a high refractive index layer) in the present invention is preferably formed from at least one dispersible composition which is selected from the dispersible composition I or II described below.

<Dispersible Composition I>

The dispersible composition I is a dispersible composition which contains metal oxide particles (A) where the primary particle diameter is 1 nm to 100 nm, a graft copolymer (B) which has a graft chain where the number of atoms excluding hydrogen atoms is the range of 40 to 10,000, and a solvent (C), and refers to a dispersible composition where the content of the metal oxide particle (A) is 50 mass % or more to 90 mass % or less with respect to the total solid content of the dispersible composition.

Here, in the present invention, it is possible to favorably use commercially available curable resins other than the resin compositions of the embodiments described later. The name of the products (product numbers) will be given below.
(1) Super high refractive index and highly heat resistant coating materials: UR-108, UR-202, UR-501, HR-102 (manufactured by Nissan Chemical Industries, Ltd.)
(2) Coating materials with a high refractive index for thick films: UR-108, UR-204, HR-201 (manufactured by Nissan Chemical Industries, Ltd.)
(3) Thioepoxy resin LPH1101 (manufactured by Mitsubishi Gas Chemical Company, Inc.)
(4) Episulfide resin MR-174 (manufactured by Mitsui Chemicals, Inc.)
(5) Thiourethane resin MR-7 (manufactured by Mitsui Chemicals, Inc.)

(A) Metal Oxide Particles

The metal oxide particles are inorganic particles with a high refractive index, and examples thereof include an oxide particles of titanium (Ti), zirconium (Zr), aluminum (Al), silicon (Si), zinc (Zn), or magnesium (Mg), preferably titanium dioxide ($TiO_2$) particles, zirconium dioxide ($ZrO_2$) particles, or silicon dioxide ($SiO_2$) particles, and among these, titanium dioxide particles (may be referred to below simply as 'titanium dioxide') are more preferable.

It is possible for colorless or transparent titanium dioxide particles to be represented by the chemical formula $TiO_2$, and the purity is preferably 70% or more, more preferably 80% purity or more, and even more preferably 85% purity or more. Lower titanium oxide, titanium oxynitride, or the like which is represented by the general formula $Ti_nO_{2n-1}$ (n represents a number from 2 to 4) is preferably 30 mass % or less, more preferably 20 mass % or less, and even more preferably 15 mass % or less.

The primary particle diameter of the metal oxide particles is preferably 1 nm to 100 nm, more preferably 1 nm to 80 nm, and particularly preferably 1 nm to 50 nm. When the primary particle diameter of the metal oxide particles is more than 100 nm, the refractive index and the transmissivity may be reduced. In addition, in a case where the primary particle diameter is less than 1 nm, there are cases where the dispersibility or the dispersion stability is reduced due to aggregation.

The average particle diameter of the metal oxide particles is obtained by the measuring method which is adopted in the examples described below.

The refractive index of the metal oxide particles is not particularly limited; however, from the point of view of obtaining a high refractive index, 1.75 to 2.70 is preferable, and 1.90 to 2.70 is more preferable. The measuring method of the refractive index is the same as that of the hollow particles.

In addition, the specific surface area of the metal oxide particles is preferably 10 $m^2/g$ to 400 $m^2/g$, more preferably 20 $m^2/g$ to 200 $m^2/g$, and most preferably 30 $m^2/g$ to 150 $m^2/g$.

In addition, the shape of the metal oxide particles is not particularly limited. For example, the shape may be the shape of a grain of rice, a spherical shape, a cubic shape, a spindle shape, or an irregular shape.

A surface treatment may be carried out on the metal oxide particles using an organic compound. Examples of the organic compound which is used for the surface treatment include a polyol, an alkanolamine, a stearic acid, a silane coupling agent, and a titanate coupling agent. Among these, the silane coupling agent is preferable.

The surface treatment may be carried out by one type of surface treatment agent alone or by combining two or more types of surface treatment agent.

In addition, the surfaces of the metal oxide particles are also preferably covered with oxides such as aluminum, silicon and zirconium. Due to this, the weather resistance is improved.

It is possible to preferably use a commercially available product as the metal oxide particles.

Examples of commercially available titanium dioxide particles include TTO series (TTO-51 (A), TTO-51(C), and the like), TTO-S, and V series (TTO-S-1, TTO-S-2, TTO-V-3, and the like) manufactured by Ishihara Sangyo Kaisha, Ltd., MT series (MT-01, MT-05, and the like) manufactured by Tayca Corp., and the like.

Examples of commercially available zirconium dioxide particles include UEP (manufactured by Daiichi Kigenso Kagaku Kogyo Co., Ltd.), PCS (manufactured by Nippon Denko Co., Ltd.), JS-01, JS-03 and JS-04 (manufactured by Nippon Denko Co., Ltd.), UEP-100 (manufactured by Daiichi Kigenso Kagaku Kogyo Co., Ltd.), and the like.

Examples of commercially available silicon dioxide particles include OG502-31 manufactured by Clariant Co., Ltd. and the like.

One type alone or two or more types of metal oxide particles may be used in combination.

In addition, when configuring the dispersible composition (T) of the present embodiment, in order to obtain an extremely high refractive index and from the point of view of the dispersion stability, the content of the metal oxide particles in the composition is preferably 10 mass % to 90 mass % with respect to the total solid content of the dispersible composition, more preferably 10 mass % to 50 mass %, even more preferably 12 mass % to 40 mass %, and particularly preferably 15 mass % to 35 mass %.

On the other hand, for use in the microlens with a high refractive index in particular, the content is 50 mass % to 90 mass % with respect to the total solid content of the dispersible composition, more preferably 52 mass % to 85 mass %, and most preferably 55 mass % to 80 mass %.

As described above, the size of single pixels has been greatly reduced along with an increase in the number of pixels in recent years, and there is a demand for a microlens which has a higher refractive index so as to collect light more efficiently; however, when the content of the metal oxide particles is less than 50 mass % with respect to the total solid content of the dispersible composition, it is difficult to obtain such a microlens.

In addition, when the content of the metal oxide particles is more than 90 mass % with respect to the total solid content of the dispersible composition (I), the dispersibility and the dispersion stability are easily impaired for the reason that it is difficult for a sufficient amount of the graft copolymer (B) to be present, and the like. Furthermore, in a case where the dispersible composition (a curable composition) is coated on a large size (for example, 12 inches) wafer, it is difficult to form a film where the film thickness difference between the center section of the wafer and the peripheral section is small.

(B) Graft Copolymer

The dispersible composition of the present embodiment includes a graft copolymer (also referred to below as a "specific resin"). The graft copolymer of the present embodiment has a graft chain which has a number of atoms excluding hydrogen atoms in the range of 40 to 10000. The graft chain in this case indicates from the base of the main chain of the copolymer (an atom which bonds with the main chain in the group which branches off from the main chain) to the terminal of the group which branches off from the main chain. This specific resin in the dispersible composition is a dispersible resin which grants dispersibility to the metal oxide particles, and is excellent in the dispersibility of the metal oxide particles and the dispersion stability after a certain time due to having an affinity with the solvent by the graft chain. In addition, when set as a dispersible composition, it is considered that the deterioration of the uniformity of the film thickness in the coating film is suppressed by the graft chain and the solvent expressing a good interaction.

As the (B) graft copolymer, the number of atoms excluding hydrogen atoms per graft chain is preferably 40 to 10,000, more preferably 100 to 500, and even more preferably 150 to 260. When the number is excessively low, there are cases where a steric repulsion effect is reduced and the dispersibility or the dispersion stability is decreased since the graft chain is short. On the other hand, when the number is excessively high, the graft chain is excessively long, and there are cases where the dispersibility or the dispersion stability is decreased due to the adsorptive power to the metal oxide particles being decreased. Here, the number of atoms excluding hydrogen atoms per graft chain is the number of atoms except for hydrogen atoms which are included from the base atom which bonds with the polymer chain which configures the main chain to the terminal of the branched polymer which branches off from the main chain. In addition, in a case where two or more types of graft chains are included in the graft copolymer, it is sufficient if the number of atoms excluding hydrogen atoms of at least one type of the graft chain satisfies the conditions described above.

As a polymer structure of the graft chain, it is possible to use a poly(meth)acrylic structure, a polyester structure, a polyurethane structure, a polyurea structure, a polyamide structure, a polyether structure, or the like; however, in order to increase the dispersibility or the dispersion stability by improving the interactivity between the graft chain and the solvent, the graft chain preferably has a poly(meth)acrylic structure, a polyester structure, or a polyether structure, and more preferably has a polyester structure or a polyether structure.

The graft copolymer preferably has the structural unit (a repeating unit) which has the graft chain described above, and for example, it is possible to obtain a macromonomer which has a polymer structure as a graft chain by polymerization based on an ordinary method, and the structure of such a macromonomer is not particularly limited as long as there is a substituent group which is able to react with the polymer main chain section and a graft chain which satisfies the conditions; however, it is preferably able to favorably use a macromonomer which has a reactive double-bonded group.

Examples of commercially available macromonomers which are favorably used for the synthesis of specific resins include AA-6 (manufactured by Toagosei Co., Ltd.), AA-10 (manufactured by Toagosei Co., Ltd.), AB-6 (manufactured by Toagosei Co., Ltd.), AS-6 (manufactured by Toagosei Co., Ltd.), AN-6 (manufactured by Toagosei Co., Ltd.), AW-6 (manufactured by Toagosei Co., Ltd.), AA-714 (manufactured by Toagosei Co., Ltd.), AY-707 (manufactured by Toagosei Co., Ltd.), AY-714 (manufactured by Toagosei Co., Ltd.), AK-5 (manufactured by Toagosei Co., Ltd.), AK-30 (manufactured by Toagosei Co., Ltd.), AK-32 (manufactured by Toagosei Co., Ltd.), Blemmer PP-100 (manufactured by NOF Corporation), Blemmer PP-500 (manufactured by NOF Corporation), Blemmer PP-800 (manufactured by NOF Corporation), Blemmer PP-1000 (manufactured by NOF Corporation), Blemmer 55-PET-800 (manufactured by NOF Corporation), Blemmer PME-4000 (manufactured by NOF Corporation), Blemmer PSE-400 (manufactured by NOF Corporation), Blemmer PSE-1300 (manufactured by NOF Corporation), Blemmer 43 PAPE-600B (manufactured by NOF Corporation), and the like. Among these, preferable examples include AA-6 (manufactured by Toagosei Co., Ltd.), AA-10 (manufactured by Toagosei Co., Ltd.), AB-6 (manufactured by Toagosei Co., Ltd.), AS-6 (manufactured by Toagosei Co., Ltd.), AN-6 (manufactured by Toagosei Co., Ltd.), Blemmer PME-4000 (manufactured by NOF Corporation), and the like.

The specific resin which is used in the present embodiment preferably includes a structural unit represented by at least one of the following formulas (1) to (4) as a structural unit which has the graft chain described above

[Chem. 3]

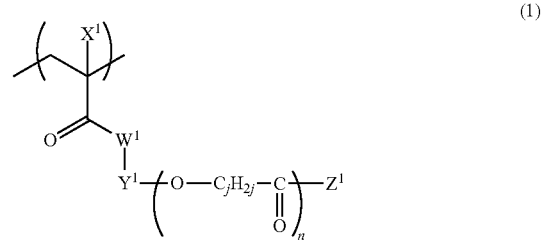

(1)

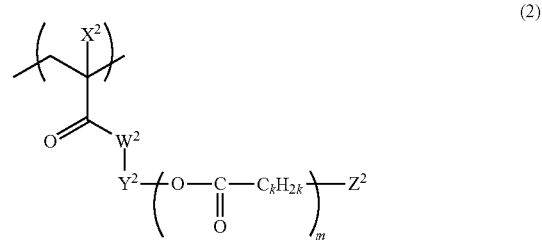

(2)

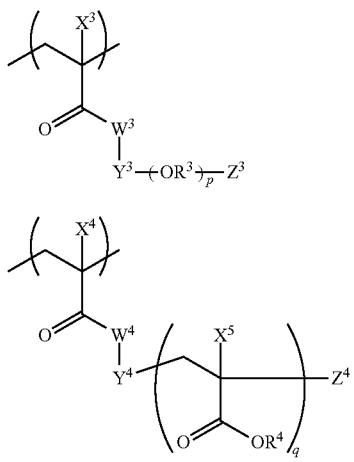

$X^2$, $X^3$, $X^4$, and $X^5$ each independently represent a hydrogen atom or a monovalent organic group. From the point of view of restrictions on the synthesis, a hydrogen atom or an alkyl group which has 1 to 12 carbon atoms is preferable, a hydrogen atom or a methyl group is more preferable, and a methyl group is particularly preferable.

$W^1$, $W^2$, $W^3$, and $W^4$ each independently represent an oxygen atom or NH, and an oxygen atom is particularly preferable.

$R^3$ represents a branched or linear alkylene group (the number of carbon atoms is preferably 1 to 10, and 2 or 3 is more preferable), from the point of view of the dispersion stability, a group which is represented by —$CH_2$—CH($CH_3$)—, or a group which is represented by —CH($CH_3$)—$CH_2$— is preferable. Two or more types of $R^3$ which have different structures may be used by being mixed in the specific resin.

$Y^1$, $Y^2$, $Y^3$ and $Y^4$ are each independently a divalent linking group, and are not particularly restricted in terms of structure. Specific examples thereof include the linking groups (Y-1) to (Y-21) described below, and the like. A and B in the structures described below each have the meaning of a bond with a left terminal group and a right terminal group in the formula (1) to the formula (4) Among the structures described below, due to the convenience of the synthesis, (Y-2) or (Y-13) is more preferable.

[Chem. 4]

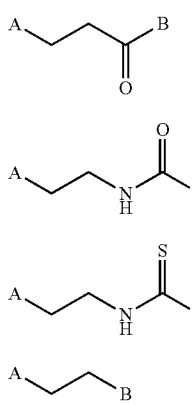

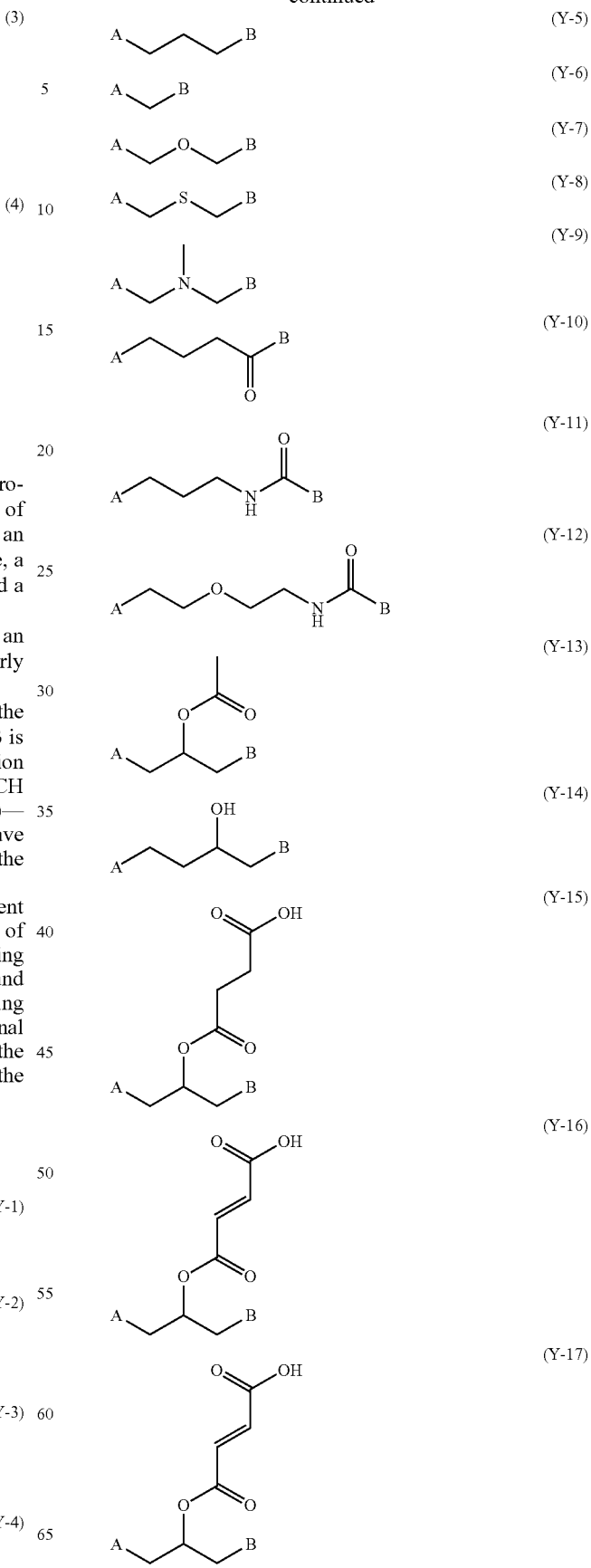

-continued

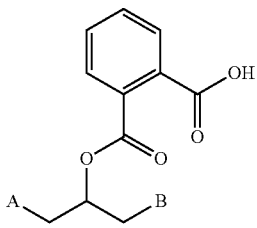
(Y-18)

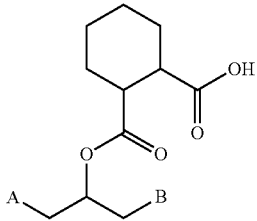
(Y-19)

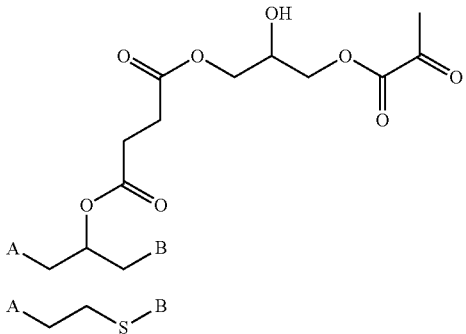
(Y-20)

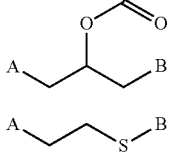
(Y-21)

$Z^1$, $Z^2$, $Z^3$, and $Z^4$ are each independently a hydrogen atom or a monovalent substituent group, and the structure of the substituent group is not particularly limited; however, specific examples include an alkyl group, a hydroxyl group, an alkoxy group, an aryloxy group, or a heteroaryloxy group, an alkylthioether group, an arylthioether group, or a heteroarylthioether group, an amino group, and the like. Among these, particularly from the point of view of improvement of the dispersibility, it is preferable to have a steric repulsion effect, and the monovalent substituent groups which are represented by $Z^1$ to $Z^3$ are preferably each independently an alkyl group which has 5 to 24 carbon atoms or an alkoxy group which has 5 to 24 carbon atoms, and it is particularly preferable that, among these, the monovalent substituent groups each be independently an alkoxy group which has a branched alkyl group which has 5 to 24 carbon atoms or an alkoxy group which has a cyclic alkyl group which has 5 to 24 carbon atoms. In addition, as the monovalent substituent group which is represented by $Z^4$, an alkyl group which has 5 to 24 carbon atoms is preferable, and it is preferable that among these, the monovalent substituent groups each be independently a branched alkyl group which has 5 to 24 carbon atoms or a circular alkyl group which has 5 to 24 carbon atoms.

n, m, p, and q each represent an integer from 1 to 500.

j and k each independently represent an integer from 2 to 8

From the point of view of the dispersion stability, j and k are preferably integers from 4 to 6, and 5 is most preferable.

$R^4$ represents a hydrogen atom or a monovalent organic group, and is not particularly limited in terms of structure; however, a hydrogen atom, an alkyl group, an aryl group, and a heteroaryl group are preferable, and a hydrogen atom and an alkyl group are more preferable. In a case where $R^4$ is an alkyl group, the alkyl group is preferably a linear alkyl group which has 1 to 20 carbon atoms, a branched alkyl group which has 3 to 20 carbon atoms, or a cyclic alkyl group which has 5 to 20 carbon atoms, more preferably a linear alkyl group which has 1 to 20 carbon atoms, and most preferably a linear alkyl group which has 1 to 6 carbon atoms. Two or more types of $R^4$ which have different structures may be used by being mixed in the specific resin.

As a structural unit which is represented by the formula (1), from the point of view of the dispersion stability, a structural unit which is represented by the following formulas (1A) or (2A) is more preferable.

[Chem. 5]

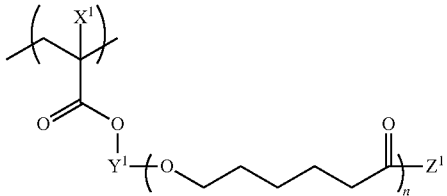
(1A)

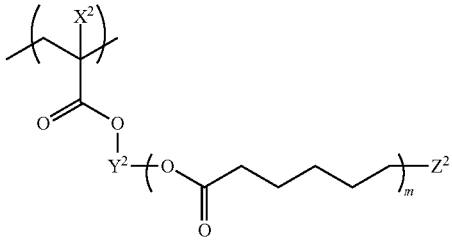
(2A)

$X^1$, $Y^1$, $Z^1$, and n in the formula (IA) have the same meaning as $X^1$, $Y^1$, $Z^1$, and n in the formula (1), and the preferable ranges are also the same.

$X^2$, $Y^2$, $Z^2$, and m in the formula (2A) have the same meaning as $X^2$, $Y^2$, $Z^2$, and m in the formula (2), and the preferable ranges are also the same.

It is more preferable that the specific resin have the structural unit which is represented by the formula (IA).

In the specific resin, the structural unit (a repeating unit) which has the graft chain described above is preferably included in a range of 10% to 75% with a mass conversion with respect to the total mass of the specific resin, more preferably included in a range of 12% to 50%, and particularly preferably included in a range of 15% to 40%. Within these ranges, the dispersibility or the dispersion stability of the metal oxide particles is high, and the uniformity of the film thickness in the coating film which is formed using the dispersible composition is further improved. In addition, as the specific resin, two or more types of a graft copolymers which have different structures may be combined.

In addition, the specific resin is preferably a polymer which has a structural unit (a repeating unit), which has an acid group, from 25 mass % or more to 90 mass % or less with respect to the total mass of the specific resin. The content of the structural units which have an acid group is more preferably 50 mass % or more to 80 mass % or less with respect to the total mass of the specific resin, and most preferably 60 mass % or more to 75 mass % or less. When the content of the structural units which have an acid group is less than 25 mass % with respect to the total mass of the specific resin, the dispersion stability deteriorates due to the adsorptive power to the metal oxide particles of the specific resin being insufficient, and in a case of coating the dispersible composition (a curable composition) on a large size (for example, 12 inches) wafer, it is difficult to form a film where the film thickness difference between the center section of the wafer and the peripheral section is small.

When the content of the structural units which have an acid group is more than 90 mass % with respect to the total mass of the specific resin, the dispersion stability deteriorates due to the introduction amount to the specific resin of the graft chain described above being insufficient, and in the same manner, it is difficult to form a film where the film thickness difference between the center section of the wafer and the peripheral section is small.

In addition, by the content of the structural units which have an acid group being within the range described above, it is possible to favorably adjust the acid value of the specific resin within the preferable range described below.

In addition, it is possible for the acid group to function as a functional group which may form the interaction with the metal oxide particles excluding the graft chain.

Examples of the acid group include a carboxylic acid group, a sulfonic acid group, a phosphoric acid group, a phenolic hydroxy group, and the like, and from the point of view of the adsorptive power to the metal oxide particles, the dispersibility, and the dispersion stability, at least one type which is selected from a carboxylic acid group, a sulfonic acid group, and a phosphoric acid group is preferable, and a carboxylic acid group is particularly preferable.

Furthermore, the acid group structure is preferably a structure which is five or more atoms away from the main chain of the resin structure. Furthermore, the acid group is most preferably a carboxylic acid which is bonded to an aromatic ring.

As the acid group, it is possible to use one type of the above alone or two types or more in combination.

The acid value of the specific resin described above is preferably in a range of 70 mgKOH/g or more to 350 mgKOH/g or less, more preferably 80 mgKOH/g or more to 300 mgKOH/g or less, and even more preferably 100 mgKOH/g or more to 250 mgKOH/g or less. By setting the acid value within the range described above, it is possible to more reliably obtain a film where the film thickness difference between the center section of the wafer and the peripheral section is small even in a case where the dispersible composition is coated on a large size (for example, 12 inches) wafer.

It is possible to calculate the acid value of the specific resin, for example, from the average content of the acid groups in the specific resin. In addition, by changing the content of the monomer units which contain an acid group which configure the specific resin, it is possible to obtain a resin which has a desired acid value.

The specific resin may further have a structural unit (a repeating unit) which has a functional group which may form the interaction with the metal oxide particles excluding the graft chain and the acid group described above. Such a structural unit which has a functional group which may form the interaction with other metal oxide particles is not particularly limited in terms of structure; however, examples thereof include a structural unit which has a basic group, a structural unit which has a coordinating group, a structural unit which has reactivity, or the like.

Examples of the basic group include a heterocycle, an amide group, and the like which include a primary amino group, a secondary amino group, a tertiary amino group, and N atoms. A tertiary amino group where the adsorptive power to the metal oxide particles is good and the dispersibility and dispersion stability are high is particularly preferable. As the basic group, it is possible to use one type of the above alone or two types or more in combination.

The specific resin may or may not contain the structural unit (a repeating unit) which has the basic group; however, where contained, the content of the structural units which have a basic group is 0.1 mass % or more to 50 mass % or less with respect to the total mass of the specific resin, and particularly preferably 0.1 mass % or more to 30 mass % or less.

Examples of the coordinating group and the group which has reactivity include an acetylacetoxy group, a trialkoxysilyl group, an isocyanate group, acid anhydride residue, acid chloride residue and the like. An acetylacetoxy group with high dispersibility and dispersion stability is particularly preferable as the adsorptive power to the metal oxide particles is good. As the coordinating group and the group which has reactivity, it is possible to use one type of the above alone or two or more types in combination.

The specific resin may or may not contain a structural unit (a repeating unit) which has a coordinating group or a group which has reactivity, however, where contained, the content of the structural unit which has a coordinating group or a group which has reactivity is 0.1 mass % or more and 50 mass % or less with respect to the total mass of the specific resin, particularly preferably 0.1 mass % or more to 30 mass % or less.

In addition, for the specific resin, the structural unit which has the graft chain described above and the structural unit which has the acid group described above are different, and the specific resin may have at least one type of repeating unit which is obtained from a monomer represented by any of the following general formulas (i) to (iii) as a structural unit which has a functional group which is able to form an interaction with the metal oxide particles.

[Chem. 6]

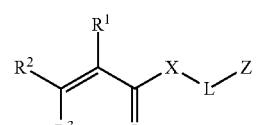 (i)

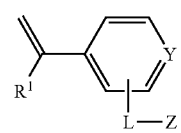 (ii)

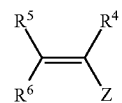 (iii)

In the formulas (i) to (iii) described above, $R^1$, $R^2$, and $R^3$ each independently represent a hydrogen atom, a halogen atom (for example, fluorine, chlorine, bromine, or the like), or an alkyl group which has 1 to 6 carbon atoms (for example, a methyl group, an ethyl group, a propyl group, or the like).

$R^1$, $R^2$, and $R^3$ are more preferably a hydrogen atom or an alkyl group which has 1 to 3 carbon atoms, and most preferably a hydrogen atom or a methyl group $R^2$ and $R^3$ are particularly preferably a hydrogen atom X represents an oxygen atom (—O—) or an imino group (—NH—), and is preferably an oxygen atom.

L is single bond or a divalent linking group. Examples of divalent linking groups include divalent aliphatic groups (for example, an alkylene group, a substituted alkylene group, an alkenylene group, a substituted alkenylene group, an alkinylene group, and a substituted alkinylene group), divalent aromatic groups (for example, an arylene group, and a substituted arylene group), and divalent heterocyclic groups and combinations of the above with oxygen atoms (—O—), sulfur atoms (—S—), imino groups (—NH—), substituted imino groups (—NR$^{31}$—, here R$^{31}$ is an aliphatic group, an aromatic group, or a heterocyclic group), or carbonyl groups (—CO—), and the like.

The divalent aliphatic group may have a cyclic structure or a branched structure. The number of carbon atoms of the aliphatic group is preferably 1 to 20, more preferably 1 to 15, and even more preferably 1 to 10.

For the aliphatic groups, saturated aliphatic groups are preferable to unsaturated aliphatic groups. In addition, the aliphatic groups may have a substituent group. Examples of the substituent group include a halogen atom, a hydroxyl group, an aromatic group, and a heterocyclic group.

The number of carbon atoms in the divalent aromatic group is preferably 6 to 20, more preferably 6 to 15, and most preferably 6 to 10. In addition, the aromatic group may have a substituent group. Examples of the substituent group include a halogen atom, a hydroxyl group, an aliphatic group, an aromatic group, and a heterocyclic group.

The divalent heterocyclic group preferably has a 5-membered ring or a 6-membered ring as a heterocyclic ring. Another heterocyclic ring, an aliphatic ring or an aromatic ring may be condensed with the heterocycle. In addition, the heterocyclic group may have a substituent group. Examples of the substituent group include a halogen atom, a hydroxyl group, an oxo group (=O), a thioxo group (=S), an imino group (=NH), a substituted imino group (=N—R$^{32}$, here R$^{32}$ is an aliphatic group, an aromatic group, or a heterocyclic group), an aliphatic group, an aromatic group, and a heterocyclic group.

L is preferably a divalent linking group which includes a single bond, an alkylene group, or an oxyalkylene structure. The oxyalkylene structure is more preferably an oxyethylene structure or an oxypropylene structure. In addition, L may include a polyoxyalkylene structure which includes two or more repeating oxyalkylene structures. As the polyoxyalkylene structure, a polyoxyethylene structure or polyoxypropylene structure is preferable. The polyoxyethylene structure is represented by —(OCH$_2$CH$_2$)$_n$—, and n is preferably an integer of 2 or more, more preferably an integer of 2 to 10.

In the formulas (i) to (iii) described above, Z represents a functional group which is able to form an interaction with the metal oxide particles, and is preferably an acid group, a basic group, or a group which has reactivity as described above, more preferably a carboxylic acid group or a tertiary amino group, and even more preferably a carboxylic acid group. In addition, Y represents a methine group or a nitrogen atom.

In the formula (iii) described above, R$^4$, R$^5$, and R$^6$ each independently represent a hydrogen atom, a halogen atom (for example, fluorine, chlorine, bromine, or the like), an alkyl group which has 1 to 6 carbon atoms (for example, a methyl group, an ethyl group, a propyl group, or the like), Z, or -L-Z. Here, L and Z have the same meaning as in the above description. As R$^4$, R$^5$, and R$^6$, a hydrogen atom, or an alkyl group which has 1 to 3 carbon atoms is preferable, and a hydrogen atom is more preferable.

As the monomer which is represented by the general formula (1) described above, a compound where R$^1$, R$^2$, and R$^3$ are a hydrogen atom or a methyl group, L is a divalent linking group which includes an alkylene group or an oxyalkylene structure, X is an oxygen atom or an imino group, and Z is a carboxylic acid group, is preferable.

In addition, as the monomer which is represented by the general formula (ii) described above, a compound where R$^1$ is a hydrogen atom or a methyl group, L is an alkylene group, Z is a carboxylic acid group, and Y is a methine group is preferable. In addition, as the monomer which is represented by the general formula (iii) described above, a compound where R$^4$, R$^5$, and R$^6$ are a hydrogen atom or a methyl group, and Z is a carboxylic acid group is preferable.

Examples of representative compounds which are represented by formulas (i) to (iii) include methacrylic acid, crotonic acid, isocrotonic acid, a reaction product of a compound (for example, methacrylate 2-hydroxyethyl) which has an addition-polymerizable double bond in the molecule and a hydroxyl group with succinic anhydride, a reaction product of a compound which has an addition-polymerizable double bond in the molecule and a hydroxyl group with phthalic anhydride, a reaction product of a compound which has an addition-polymerizable double bond in the molecule and a hydroxyl group with tetrahydroxy phthalic anhydride, a reaction product of a compound which has an addition-polymerizable double bond in the molecule and a hydroxyl group with trimellitic anhydride, a reaction product of a compound which has an addition-polymerizable double bond in the molecule and a hydroxyl group with pyromellitic anhydride, acrylic acid, acrylic acid dimers, acrylic acid oligomers, maleic acid, itaconic acid, fumaric acid, 4-vinyl benzoic acid, vinyl phenol, 4-hydroxyphenyl methacrylamide, and the like.

Furthermore, with the object of improving various performances such as image strength while not impairing the effects of the present invention, it is possible for the specific resin which is included in the dispersion composition of the metal oxide particles to include other structural units which further have various functions, for example, a structural unit which is derived from a copolymer component and which has a functional group which has affinity with a dispersion medium which is used in a dispersion, or the likein addition to the structural unit which has the graft chain, the structural unit which has the acid group, and the structural unit which is different to these structural units and which has a functional group which is able to form an interaction with the metal oxide particles.

Examples of the copolymer component which is copolymerizable with the particular resin include radical polymerizable compounds which are selected from acrylic acid esters, methacrylic acid esters, styrenes, acrylonitriles, methacrylonitriles, acrylamides, methacrylamides, and the like.

Specifically, examples include acrylic acid esters such as alkyl acrylates (the number of carbon atoms of the alkyl group is preferably 1 to 20) (specifically, for example, benzyl acrylate, 4-biphenyl acrylate, butyl acrylate, sec-butyl acrylate, t-butyl acrylate, 4-t-butyl phenyl acrylate, 4-chlorophenyl acrylate, pentachlorophenyl acrylate, 4-cyano benzyl acrylate, cyano methyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methyl acrylate, 3,5-dimethyl adamantyl acrylate, 2-naphthyl acrylate, neopentyl acrylate, octyl acrylate, phenethyl acrylate, phenyl acrylate, propyl acrylate, tolyl acrylate, amyl acrylate, tetrahydrofurfuryl acrylate, 2-hydroxyethyl acrylate, 3-hydroxypropyl acrylate, 2-hydroxypropyl acrylate, 4-hydroxybutyl acrylate, 5-hydroxypentyl acrylate, allyl acrylate, 2-allyloxyethyl acrylate, propargyl acrylate, and the like), methacrylic acid esters such as alkyl methacrylate (the number of carbon atoms of the alkyl group is preferably 1 to 20) (for example, benzyl methacrylate, 4-biphenyl methacrylate, butyl methacrylate, sec-butyl methacrylate, t-butyl methacrylate, 4-t-butyl phenyl methacrylate, 4-chlorophenyl methacrylate, pentachlorophenyl methacrylate, 4-cyanophenyl methacrylate, cyano methyl methacrylate, cyclohexyl methacrylate, 2-ethoxyethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyl-adamantyl methacrylate, 2-naphthyl methacrylate, neopentyl methacrylate, octyl methacrylate, phenethyl methacrylate, phenyl methacrylate, propyl methacrylate, tolyl methacrylate, amyl methacrylate, tetrahydrofurfuryl methacrylate, 2-hydroxyethyl ethacrylate, 3-hydroxypropyl methacrylate, 2-hydroxypropyl methacrylate, 4-hydroxybutyl methacrylate, 5-hydroxypentyl methacrylate, allyl methacrylate, 2-allyloxyethyl methacrylate, propargyl methacrylate, 2-diethylaminoethyl methacrylate, 2-dimethylaminomethyl methacrylate, and the like), styrenes such as styrenes or alkyl styrenes (for example, methyl styrene, dimethyl styrene, trimethyl styrene, ethyl styrene, diethyl styrene, isopropyl styrene, butyl styrene, hexylstyrene, cyclohexyl styrene, decylstyrene, benzyl styrene, chloromethyl styrene, trifluoromethyl styrene, ethoxy methyl styrene, acetoxymethyl styrene, and the like), alkoxy styrenes (for example, methoxy styrene, 4-methoxy-3-methyl styrene, dimethoxystyrene, and the like), halogen styrene (for example, chloro styrene, dichloro styrene, trichloro styrene, tetrachloro styrene, pentachloro styrene, bromo styrene, dibromo styrene, iodo styrene, fluoro styrene, trifluoro styrene, 2-bromo-4-trifluoromethyl styrene, 4-fluoro-3-trifluoromethyl styrene, and the like), acrylonitrile, methacrylonitrile, and the like.

Among these radical polymerizable compounds, methacrylic acid esters, acrylamides, methacrylamides and styrenes are preferably used, and the following are particularly preferably used: benzyl methacrylate, t-butyl methacrylate, 4-t-butyl phenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyl-adamantyl methacrylate, 2-naphthyl methacrylate, neopentyl methacrylate, phenyl methacrylate, tetrahydrofurfuryl methacrylate, 2-hydroxyethyl methacrylate, 3-hydroxypropyl methacrylate, 2-hydroxypropyl methacrylate, and allyl methacrylate, acrylamide, N-methyl acrylamide, N-isopropyl acrylamide, morpholyl acrylamide, piperidyl acrylamide, N-t-butyl acrylamide, N-cyclohexyl acrylamide, N-phenyl acrylamide, N-naphthyl acrylamide, N-hydroxymethyl acrylamide, N-hydroxyethyl acrylamide, N-allyl acrylamide, 4-hydroxyphenyl acrylamide, 2-hydroxyphenyl acrylamide, N,N-dimethyl acrylamide, N,N-diisopropyl acrylamide, N,N-di-t-butyl acrylamide, N,N-dicyclohexyl acrylamide, N,N-phenyl acrylamide, N,N-dihydroxyethyl acrylamide, N,N-diallyl acrylamide, methacrylamide, N-methyl methacrylamide, N-isopropyl methacrylamide, morpholyl methacrylamide, piperidyl methacrylamide, N-t-butyl methacrylamide, N-cyclohexyl methacrylamide, N-phenyl methacrylamide, N-naphthyl methacrylamide, N-hydroxymethyl methacrylamide, N-hydroxyethyl methacrylamide, N-allyl methacrylamide, 4-hydroxyphenyl methacrylamide, 2-hydroxyphenyl methacrylamide, N,N-dimethyl methacrylamide, N,N-diisopropyl methacrylamide, N,N-di-t-butyl methacrylamide, N,N-dicyclohexyl methacrylamide, N,N-phenyl methacrylamide, N,N-dihydroxyethyl methacrylamide, N,N-diallyl methacrylamide, styrene, methyl styrene, dimethyl styrene, trimethyl styrene, isopropyl styrene, butyl styrene, cyclo hexyl styrene, chloromethyl styrene, trifluoromethyl styrene, ethoxy methyl styrene, acetoxymethyl styrene, methoxy styrene, 4-methoxy-3-methyl styrene, chloro styrene, dichloro styrene, trichloro styrene, tetrachloro styrene, pentachloro styrene, bromostyrene, dibromostyrene, iodo styrene, fluoro styrene, trifluoro styrene, 2-bromo-4-trifluoromethyl styrene, 4-fluoro-3-trifluoromethyl styrene.

It is possible to use one type alone or two or more types of these radical polymerizable compounds in combination. The specific resin may or may not contain the radical polymerizable compounds described above; however, where contained, the content of the structural units which correspond with these radical polymerizable compounds is 0.1 mass % or more to 50 mass % or less with respect to the total mass of the specific resin, and particularly preferably 0.1 mass % or more to 30 mass % or less.

It is possible to synthesize the specific resins by a method which is known in the related art. Examples of a solvent which is used at the time of the synthesis include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate, ethyl lactate, and the like. These solvents may be used alone, or two or more types may be mixed.

Specific examples of the specific resin include the following example compounds 1 to 32; however, the present invention is not limited to these. In the example compounds described below, the value which is indicated alongside each structural unit (the value which is indicated alongside the main chain repeating unit) represents the content of the structural unit [described as mass %: (wt %)]. The value which is indicated alongside the repeating section of the side chain indicates the repeating number of the repeating unit.

[Chem. 7]

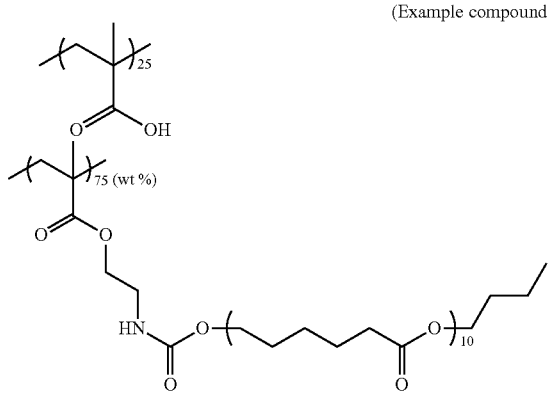

(Example compound 1)

Acid value 163 mg/KOH/g (Example compound 2)
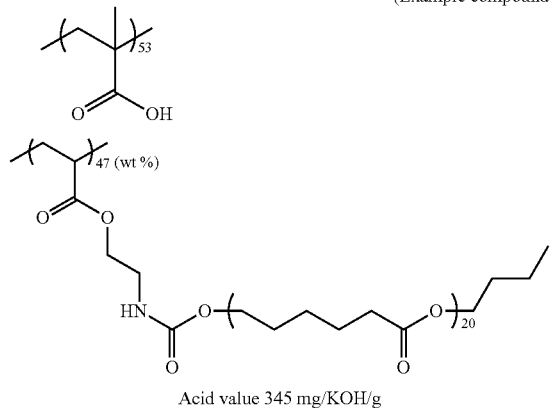
Acid value 345 mg/KOH/g
(Example compound 3)
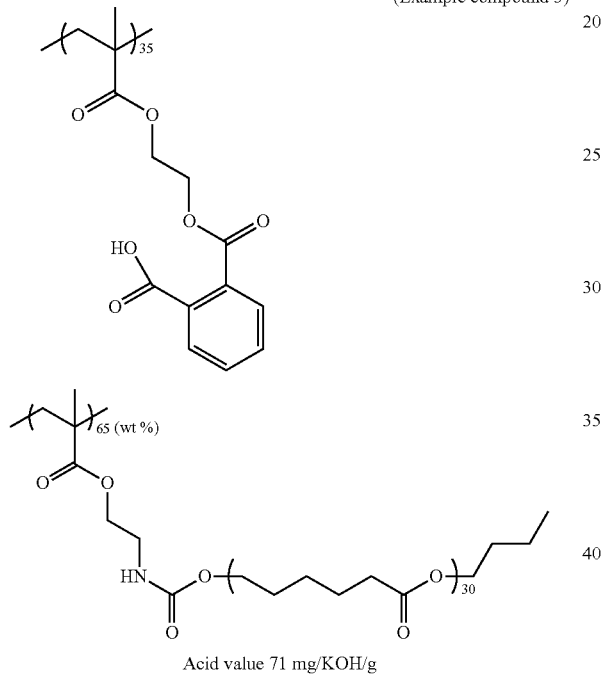
Acid value 71 mg/KOH/g
[Chem. 8]
(Example compound 4)
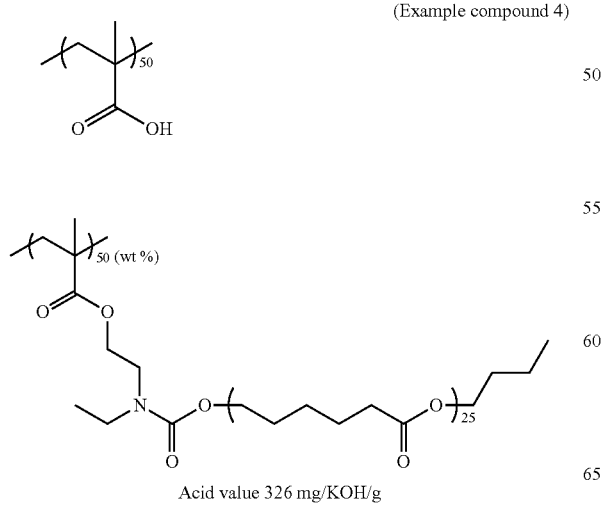
Acid value 326 mg/KOH/g
(Example compound 5)
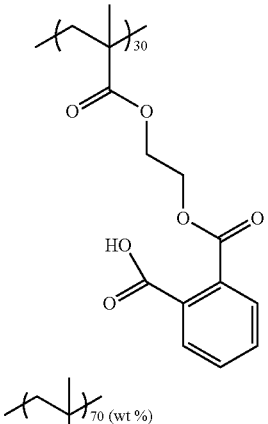
(Example compound 5 continued)
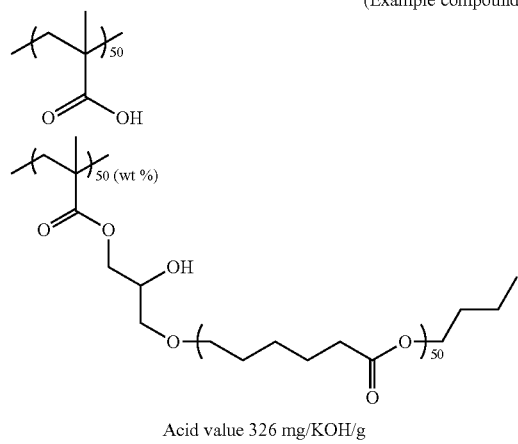
Acid value 60 mg/KOH/g
(Example compound 6)
Acid value 326 mg/KOH/g
(Example compound 7)
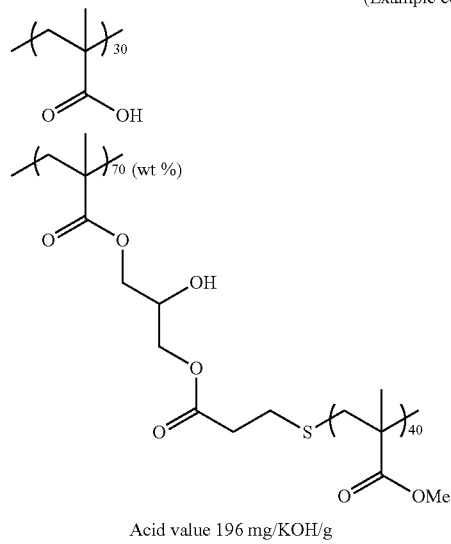
Acid value 196 mg/KOH/g (Chem. 9)
(Example compound 8)
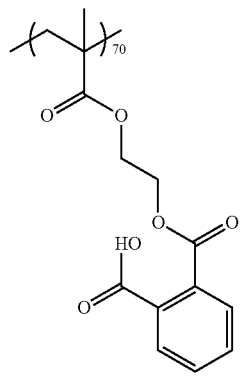
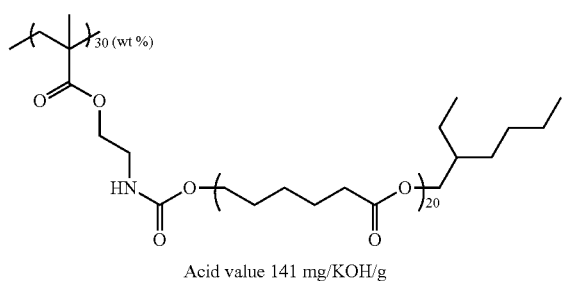
Acid value 141 mg/KOH/g
(Example compound 9)
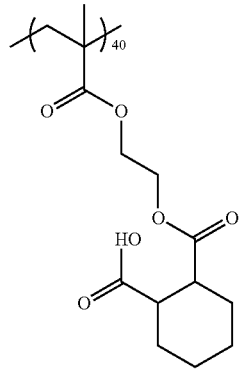
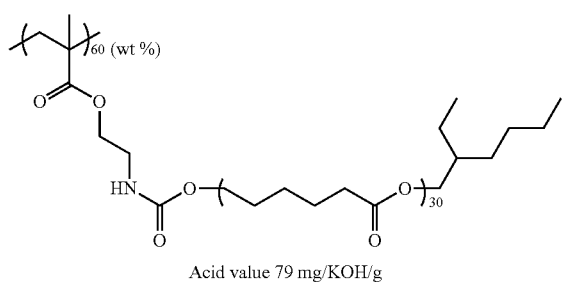
Acid value 79 mg/KOH/g
(Example compound 10)
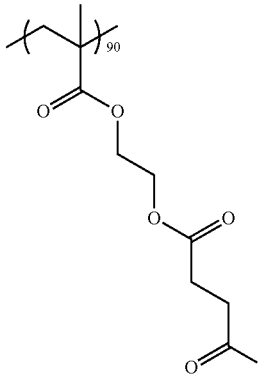
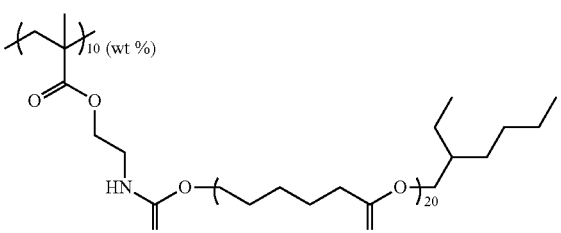
Acid value 219 mg/KOH/g
(Example compound 11)
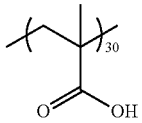
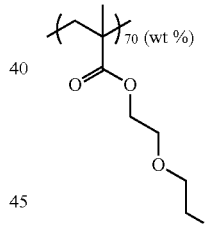
Acid value 196 mg/KOH/g
[Chem. 10]
(Example compound 12)
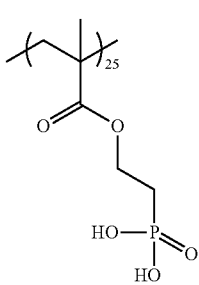

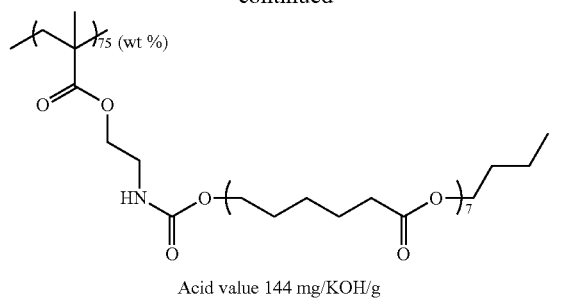
Acid value 144 mg/KOH/g
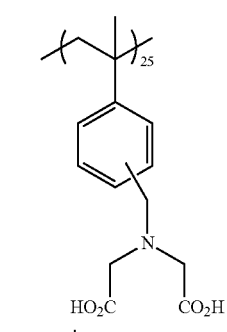
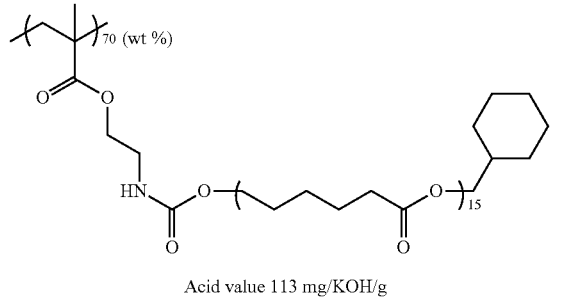
Acid value 113 mg/KOH/g
[Chem. 11]
(Example compound 14)
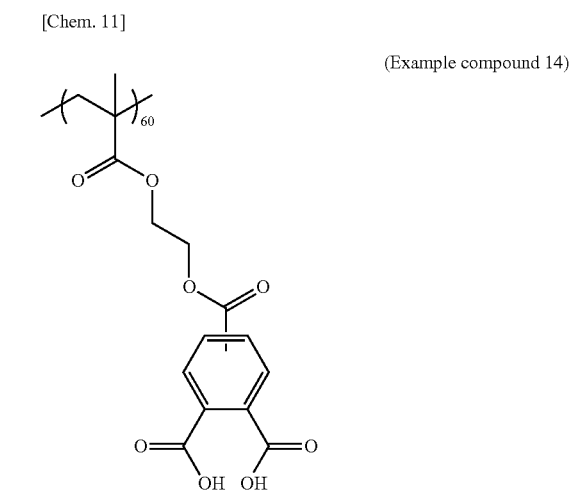
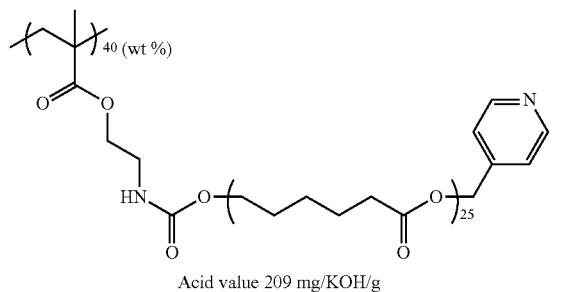
Acid value 209 mg/KOH/g
(Example compound 15)
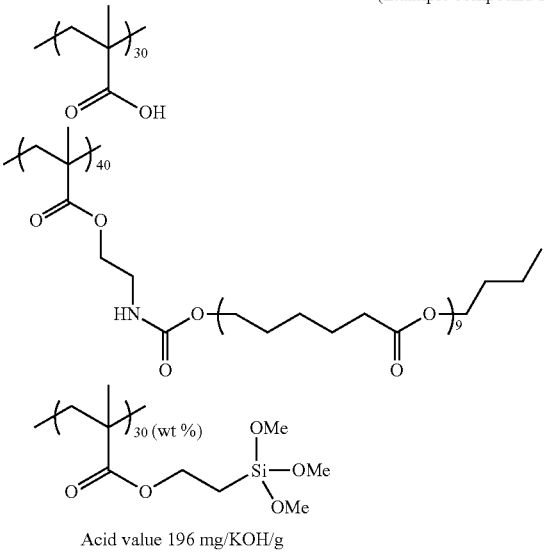
Acid value 196 mg/KOH/g
(Example compound 16)
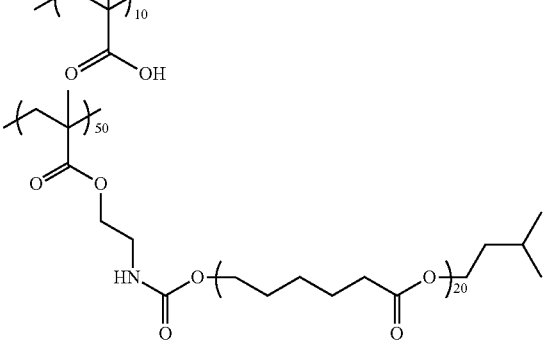
Acid value 296 mg/KOH/g
(Example compound 17)
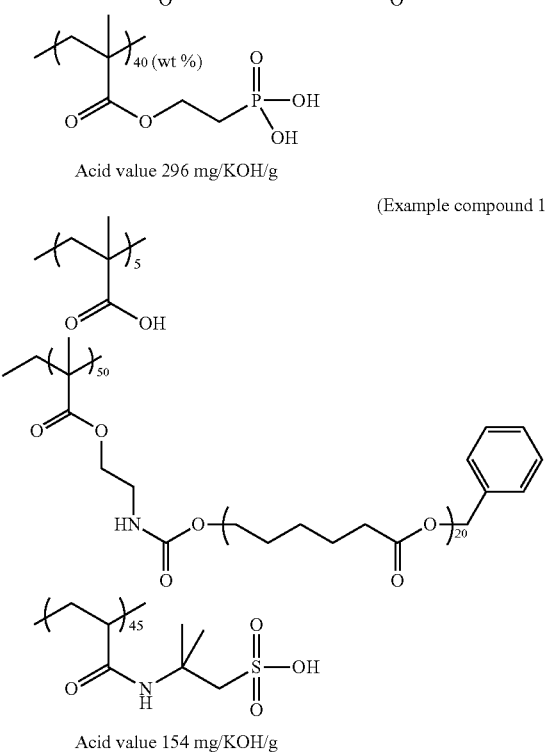
Acid value 154 mg/KOH/g (Example compound 18)
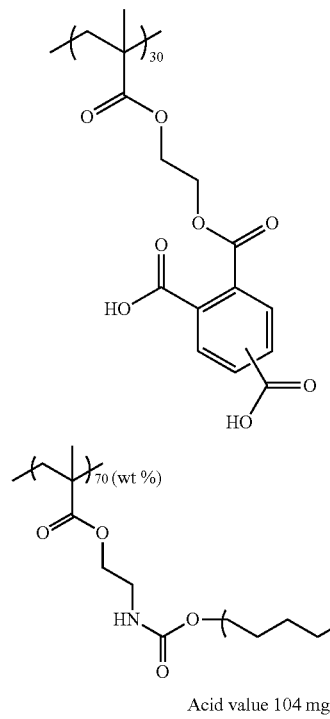
Acid value 104 mg.KOH/g
(Example compound 19)
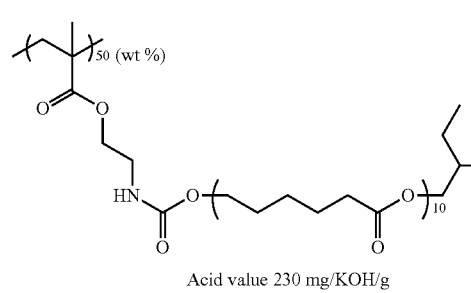
Acid value 230 mg/KOH/g
(Example compound 20)
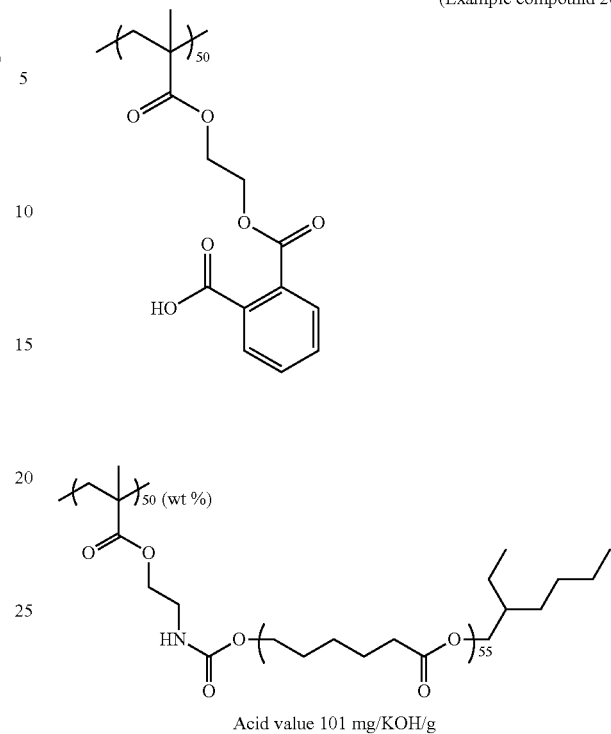
Acid value 101 mg/KOH/g
(Example compound 21)
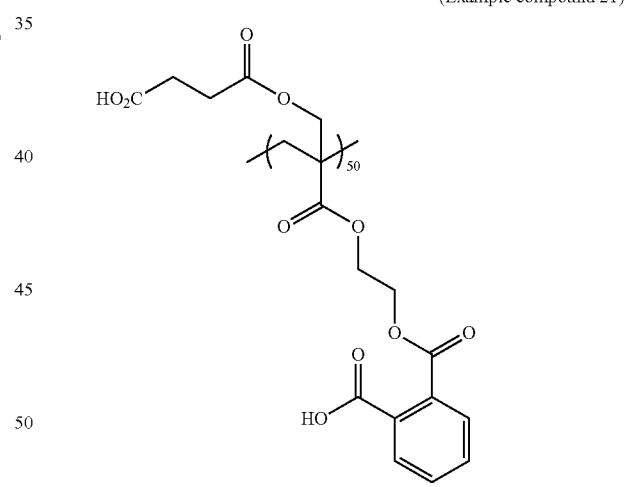
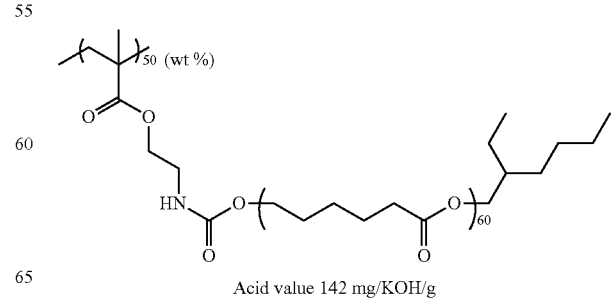
Acid value 142 mg/KOH/g

[Chem. 13]
(Example compound 22)
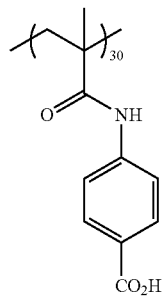
Acid value 82 mg/KOH/g
(Example compound 23)
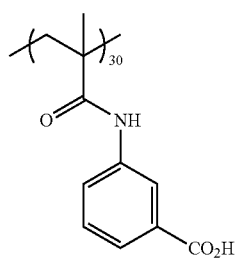
Acid value 58 mg/KOH/g
(Example compound 24)
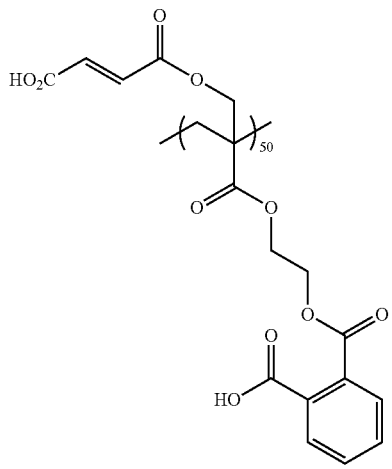
Acid value 143 mg/KOH/g
(Example compound 25)
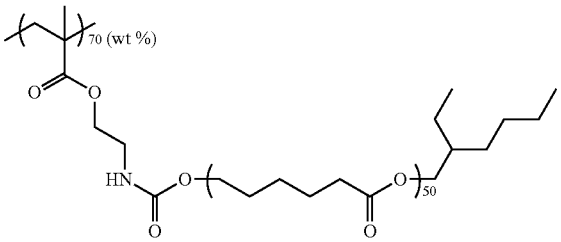
Acid value 82 mg/KOH/g -continued
[Chem. 14]
(Example compound 26)
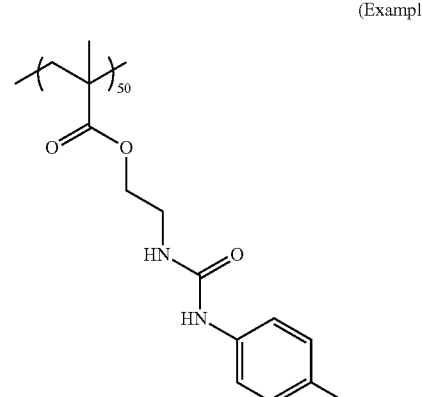
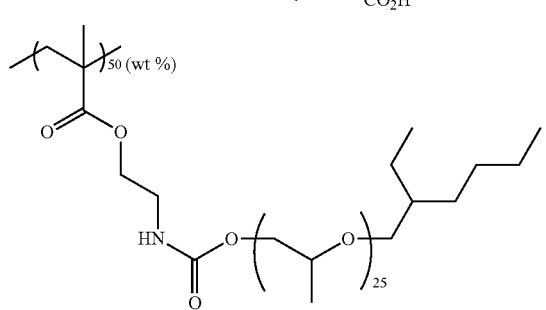
Acid value 96 mg/KOH/g
(Example compound 27)
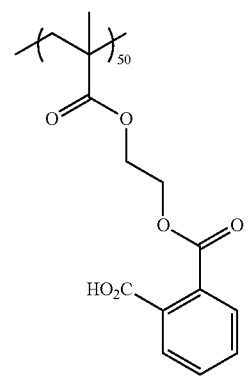
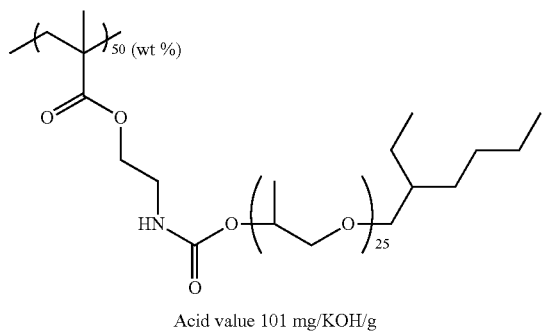
Acid value 101 mg/KOH/g
(Example compound 28)
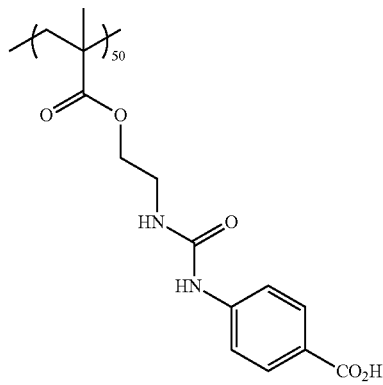
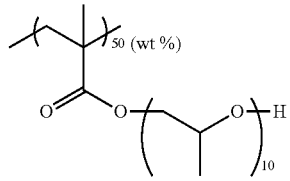
Acid value 96 mg/KOH/g
(Example compound 29)
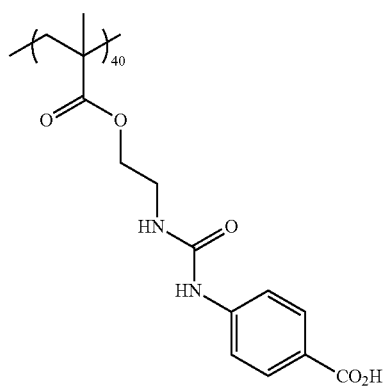
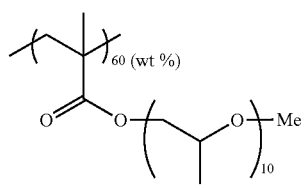
Acid value 77 mg/KOH/g
[Chem. 15]
(Example compound 30)
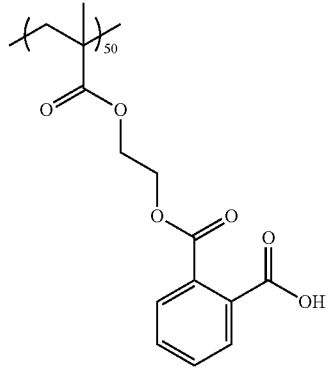

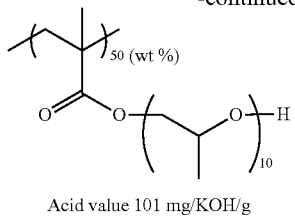

Acid value 101 mg/KOH/g (Example compound 31)

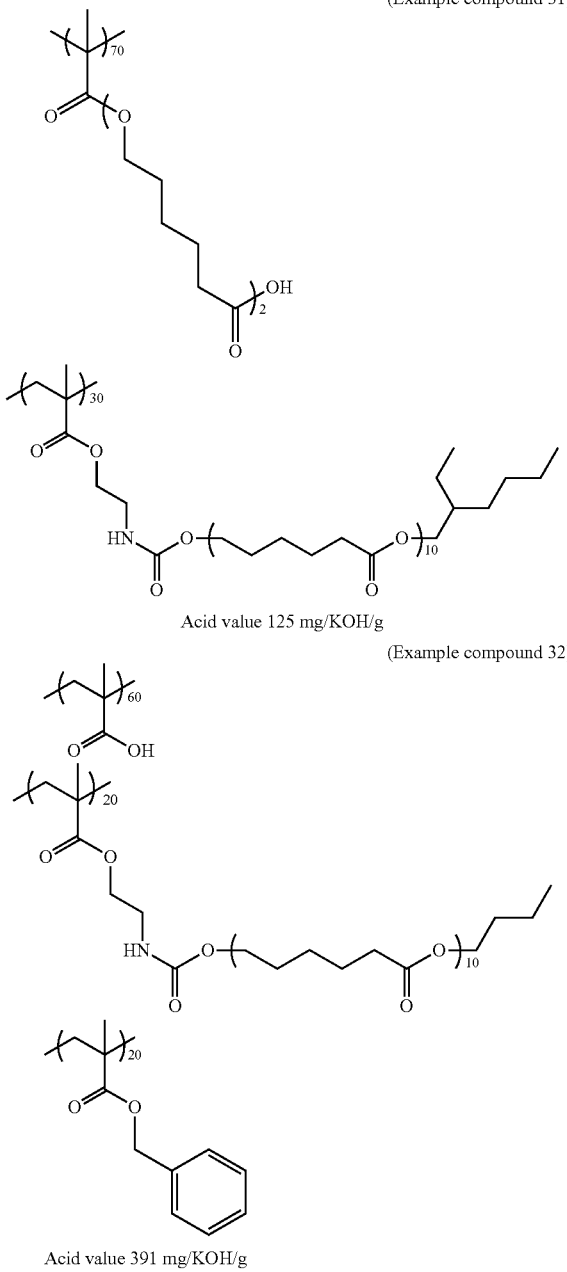

(Example compound 32)

The weight average molecular weight (the polystyrene equivalent value measured by the GPC method) of the specific resin is preferably 5,000 or more to 300,000 or less, more preferably 7,000 or more to 100,000 or less, and particularly preferably 10,000 or more to 50,000 or less.

In the dispersible composition (I), it is possible to use one type alone or two or more types of the specific resin in combination.

From the point of view of the dispersibility and the dispersion stability, the content of the specific resin with respect to the total solid content of the dispersible composition (I) is preferably in a range of 10 mass % to 50 mass %, more preferably 11 mass % to 40 mass %, and more preferably 12 mass % to 30 mass %.

—Other Dispersible Resins—

The dispersible composition (I) may contain dispersible resins other than the specific resins described above (referred to below as 'other dispersible resins') with an object such as adjustment of the dispersibility of the metal oxide particles.

Examples of the other dispersible resins which it is possible to use in the present invention include polymer dispersing agents [for example, polyamide amine and salts thereof, polycarboxylic acid and salts thereof, high molecular weight unsaturated acid esters, modified polyurethane, modified polyester, modified poly(meth)acrylate, (meth)acrylic copolymers, and naphthalene sulfonic acid formalin condensates], and, polyoxyethylene alkyl phosphoric acid esters, polyoxyethylene alkyl amines, alkanolamines, pigment derivatives, and the like.

It is possible to further classify the other dispersible resins as linear polymers, terminal modified polymers, graft type polymers, and block type polymers by structure.

Specific examples of the other dispersible resins include 'Disperbyk-101 (polyamideamine phosphate), 107 (carboxylate ester), 110 (a copolymer which includes an acid group), 130 (polyamide), 161, 162, 163, 164, 165, 166, and 170 (high molecular copolymer)', and 'BYK-P104 and P105 (high molecular weight unsaturated polycarboxylic acid)' manufactured by BYK Chemie Co., Ltd., 'EFKA4047, 4050, 4010, and 4165 (polyurethane-based), EFKA4330 and 4340 (block copolymers), 4400 and 4402 (modified polyacrylate), 5010 (polyesteramide), 5765 (high molecular weight polycarboxylate), 6220 (aliphatic polyester), 6745 (phthalocyanines derivative), and 6750 (an azo pigment derivative)' manufactured by EFKA Ltd., 'Ajisper PB821 and PB822' manufactured by Ajinomoto Fine-Techno Co., Inc., 'Flowren TG-710 (urethane oligomer)' and 'Polyflow No. 50E and No. 300 (acrylic copolymer)' manufactured by Kyoeisha Chemical Co., Ltd., 'Disparlon KS-860, 873SN, 874, and #2150 (aliphatic polycarboxylic acid), #7004 (polyetherester), DA-703-50, DA-705, and DA-725' manufactured by Kusumoto Chemicals, Ltd., 'Demol RN and N (naphthalenesulfonic acid formalin polycondensate), and MS, C, and SN—B (aromatic sulfonic acid formalin polycondensate)', 'Homogenol L-18 (high molecular polycarboxylic acid)', 'Emulgen 920, 930, 935, and 985 (polyoxyethylene nonyl phenyl ether)' and 'Acetamin 86 (stearylamine acetate)' manufactured by Kao Corp., 'Solsperse 5000 (phthalocyanine derivative), 22000 (azo pigment derivative), 13240 (polyester amine), 3000, 17000, and 27000 (polymers which have a functional section in the terminal), 24000, 28000, 32000, and 385000(graft type polymer)' manufactured by Lubrizol Corp., 'Nikkol T106 (polyoxyethylene sorbitan mono-oleate) and MYS-IEX (polyoxyethylene monostearate)' manufactured by Nikko Chemicals Co., Ltd., and the like.

It is possible to use one type alone or two or more types of these other specific resins in combination.

The dispersible composition (I) may or may not contain the other dispersible resins; however, where contained, the content of the other dispersible resins with respect to the total solid content of the dispersible composition (I) is preferably in a range of 1 mass % to 20 mass %, and more preferably in a range of 1 mass % to 10 mass %.

(C) Solvent

The dispersible composition (I) includes a solvent, and it is possible to configure the solvent by using various types of organic solvent.

Examples of an organic solvent which is possible to use here include acetone, methyl ethyl ketone, cyclohexane, ethyl acetate, ethylene dichloride, tetrahydrofuran, toluene, ethylene glycol monomethyl ether, ethylene glycol mono ethyl ether, ethylene glycol dimethyl ether, propylene glycol monomethyl ether, propylene glycol mono ethyl ether, acetylacetone, cyclohexanone, diacetone alcohol, ethylene glycol monomethyl ether acetate, ethylene glycol ethyl ether acetate, ethylene glycol mono isopropyl ether, ethylene glycol monobutyl ether acetate, 3-methoxy propanol, methoxy methoxy ethanol, diethylene glycol monomethyl ether, diethylene glycol mono ethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethylformamide, dimethyl sulfoxide, γ-butyrolactone, methyl lactate, ethyl lactate, and the like.

It is possible to use these organic solvents alone or in a mixture. The concentration of the solid content in the dispersible composition (1) is preferably 2 mass % to 60 mass %.

The manufacturing method of the dispersible composition (I) is not particularly limited, and it is possible to apply ordinarily used manufacturing methods of a dispersible composition. For example, it is possible to manufacture the dispersible composition (I) by mixing metal oxide particles, graft copolymers and solvents and carrying out the dispersing treatment using a cycloid type dispersing apparatus (a bead mill), or the like.

<Curable Composition>

The dispersible composition (I) of the present embodiment is preferably a curable composition for forming the high refractive index layer which is configured by including a polymerizable compound (D), a polymerization initiator, and including other components as necessary.

In such a manner, in the present embodiment, since the 'curable composition' is one form of the 'dispersible composition', as described above, the content of the metal oxide particles with respect to the total solid content of the curable composition for forming the high refractive index layer is 50 mass % to 90 mass %, more preferably 52 mass % to 85 mass %, and most preferably 55 mass % to 80 mass %.

By setting the dispersible composition as a curable composition for forming the high refractive index layer, the dispersible composition has an extremely high refractive index along with excellent dispersibility and dispersion stability, and even in a case of being coated on a large size wafer, it is possible to form a film (representatively, a transparent film) where the film thickness difference between the center section and the peripheral section is small.

In addition, the present invention also relates to a transparent film which is formed by using the curable composition for forming the high refractive index layer of the present embodiment.

In addition, the composition (I) of the present embodiment is preferably a transparent composition, and more specifically, a composition where the luminous transmittance with respect to the thickness direction of the cured film is 90% or more throughout the wavelength region of 400 nm to 700 nm when a cured film with a film thickness of 1.0 µm is formed by the composition.

That is, the transparent film of the present embodiment refers to a film where the luminous transmittance with respect to the thickness direction of the film with a film thickness of 1.0 µm is 90% or more throughout the wavelength region of 400 nm to 700 nm.

The physical property of the luminous transmittance may be realized by any means as long as the curable composition contains the dispersible composition (I), the polymerizable compound (D) and the polymerization initiator (E) of the present embodiment, and for example, is favorably realized by adjusting the polymerizable compound (D) or the type and the content of the binder polymer which may be further added. In addition, it is possible to favorably realize the physical property of the luminous transmittance described above by adjusting the particle diameter of the metal oxide particles (A), and the type and added amount of the graft copolymer (B).

It is an important element for the curable composition for forming the high refractive index layer and the transparent film of the present embodiment that the luminous transmittance described above be 90% or more throughout the wavelength region of 400 nm to 700 nm, in particular, for a microlens to realize the desired characteristics.

The luminous transmittance described above is preferably 95% or more throughout the wavelength region of 400 nm to 700 nm, more preferably 99% or more, and most preferably 100%.

In view of the above, the curable composition for forming the high refractive index layer of the present embodiment substantially does not contain a coloring agent (the content of the coloring agent is preferably 0 mass % with respect to the total solid content of the composition).

(D) Polymerizable Compound

The (D) polymerizable compound is an addition-polymerizable compound which has at least one polymerizable group such as an ethylenically unsaturated double bond, an epoxy group, and an oxetanyl group, and is selected from compounds which have at least one, preferably two or more, of these polymerizable groups. Such compounds are widely known in the technical field, and it is possible to use these in the present invention without being particularly limited.

These have a chemical form of, for example, a monomer and a prepolymer, that is, a multimer such as a dimer or a trimer, and an oligomer, or the mixture thereof, a copolymer thereof, and the like. Examples of the monomer and the copolymers thereof include unsaturated carboxylic acid (for example, acrylic acid, methacrylic acid, itaconic acid, crotonic acid, isocrotonic acid, maleic acid, and the like), esters thereof, or amides, and esters of unsaturated carboxylic acid and an aliphatic polyhydric alcohol compound and the amides of unsaturated carboxylic acid and an aliphatic polyhydric amine compound are preferably used. In addition, an addition reactant with the unsaturated carboxylic acid esters or the unsaturated carboxylic acid amides which have a nucleophilic substituent group such as a hydroxyl group, an amino group or a mercapto group and monofunctional or multifunctional isocyanates or epoxies, a dehydration condensation reactant with a monofunctional or multifunctional carboxylic acid, and the like are also favorably used. In addition, an addition reactant with unsaturated carboxylic acid ester which has an electrophilic substituent group such as an isocyanate group or an epoxy group or unsaturated carboxylic acid amides and monofunctional or multifunctional alcohols, amines, and thiols; and a substituent reactant with an unsaturated carboxylic acid ester which has a leaving substituent group such as a halogen group or a tosyloxy group or unsaturated carboxylic acid amides and monofunctional or multifunctional alcohols, amines, and thiols are also favorable. In addition, as another example, it is possible to use a compound group where unsaturated phosphonic acid, styrene, vinyl ether, and the like are substituted for the unsaturated carboxylic acid described above. As these specific compounds, it is also possible to favorably use the compounds, which are described in paragraph number 0095 to paragraph number 0108 in JP2009-288705A, in the present invention.

The first preferable form of the polymerizable compound is an aspect which includes a monomer (a polymerizable monomer) which has at least one ethylenically unsaturated double bond, or an oligomer (a polymerizable oligomer) which has a polymerizable group (combining the polymerizable monomer and the polymerizable oligomer may be referred to below as 'a polymerizable monomer and the like').

In addition, the polymerizable monomer and the like have at least one ethylene group which is addition-polymerizable. A compound which has an ethylenically unsaturated group which has the boiling point of 100° C. or more under ordinary pressure is also preferable. Examples thereof include monofunctional acrylates and methacrylates such as polyethylene glycol mono(meth)acrylate, polypropylene glycol mono(meth)acrylate, and phenoxyethyl(meth)acrylate; and those which are methacrylated after adding ethylene oxide or propylene oxide to multifunctional alcohols such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl)ether, tri(acryloyloxyethyl) isocyanurate, glycerin, and trimethylolethane; urethane(meth)acrylates as described in JP1973-41708B (JP-S48-41708B), JP1975-6034B (JP-S50-6034B), and JP1976-37193A (JP-S51-37193A); polyester acrylates as described in JP1973-64183A (JP-S48-64183A), JP1974-43191B (JP-S49-43191B), and JP1977-30490B (JP-S52-30490B); multifunctional acrylates and methacrylates such as epoxy acrylates which are reaction products of epoxy polymers and (meth)acrylic acid, and mixtures thereof.

Examples thereof also include multifunctional (meth) acrylate which is obtained by reacting a compound which has a cyclic ether and an ethylenically unsaturated group such as glycidyl(meth)acrylate with multifunction carboxylic acid, and the like.

In addition, as other preferable polymerizable monomers and the like, it is also possible to use a cardopolymer which is a compound which has a fluorene ring and two or more ethylenically polymerizable groups, as described in JP2010-160418A, IP2010-129825A, JP4364216, and the like.

In addition, as a compound which has a boiling point of 100° C. or more under ordinary pressure and which has at least one ethylenically unsaturated group which is addition-polymerizable, the compounds described in the paragraph number 0254 to 0257 in JP2008-292970A are also favorable.

In addition, it is also possible to use a compound which is (meth)acrylated after adding ethylene oxide or propylene oxide to a multifunctional alcohol, which is described along with the specific examples as the general formula (1) and (2) in JP1998-62986A (JP-H10-62986A) as a polymerizable monomer.

Furthermore, it is preferable that the polymerizable monomer which is used in the present invention be a polymerizable monomer which is represented by the following general formulas (MO-1) to (MO-6).

[Chem. 16]

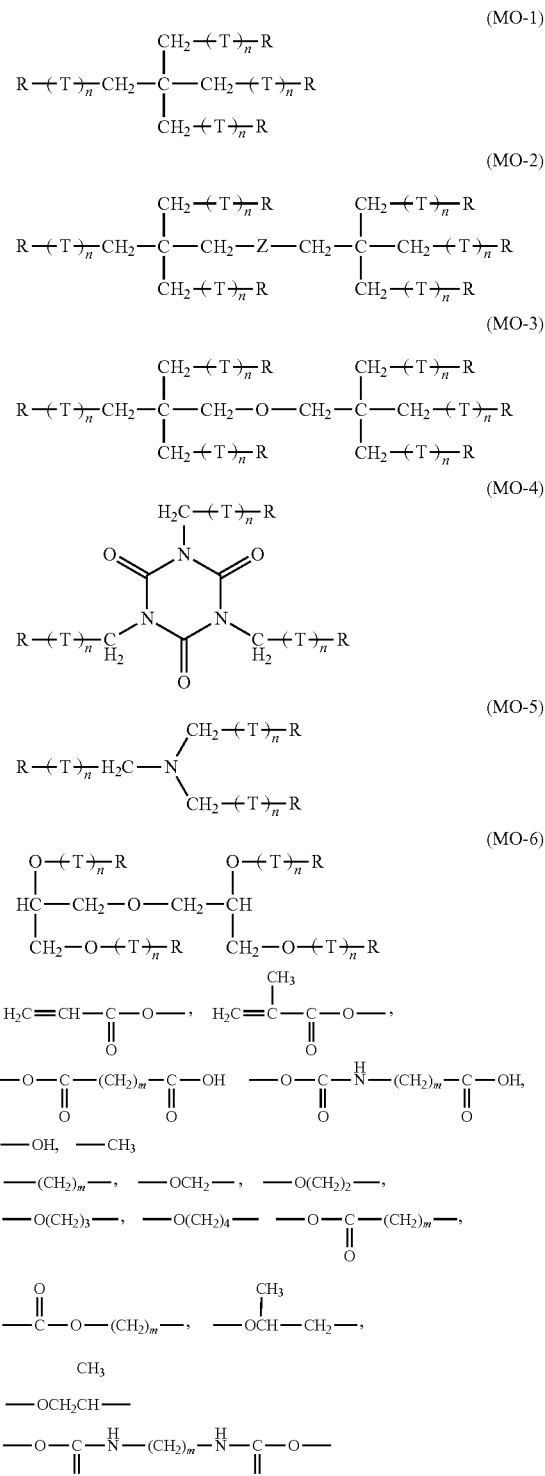

(In the formulas, n each represents 0 to 14, and m each represents 1 to 8. R, T and Z, a plurality of which exist in one molecule, may each be the same or different. In a case where T is an oxyalkylene group, the terminal of the carbon atom side is bonded to R. At least one among the R's is a polymerizable group.)

n is preferably 0 to 5, and more preferably 1 to 3.
m is preferably 1 to 5, and more preferably 1 to 3.
R is preferably:

[Chem. 17]

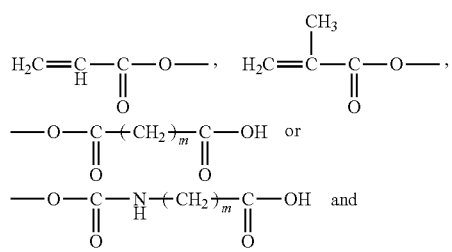

is more preferable.

As specific examples of the radical polymerizable monomers which are represented by the general formulas (MO-1) to (MO-6) described above, it is also possible to favorably use the compounds, which are described in paragraph number 0248 to the paragraph number 0251 in JP2007-269779A, in the present invention.

Among these, as a polymerizable monomer and the like, dipentaerythritol triacrylate (KAYARAD D-330 as a commercially available product, manufactured by Nippon Kayaku Co., Ltd.), dipentaerythritol tetraacrylate (KAYARAD D-320, manufactured by Nippon. Kayaku Co., Ltd.), dipentaerythritol penta(meth)acrylate (KAYARAD D-310, manufactured by Nippon Kayaku Co., Ltd.), dipentaerythritol hexa(meth)acrylate (KAYARAD DPHA, manufactured by Nippon Kayaku Co., Ltd.), and a structure where these (meth)acryloyl groups are via ethylene glycol or propylene glycol residues, or diglycerine EO (ethylene oxide) modified (meth)acrylate (M-460, manufactured by Toagosei Co., Ltd. as a commercially available product) is preferable. It is also possible to use the oligomer types thereof.

Examples thereof include RP-1040 (manufactured by Nippon Kayaku Co., Ltd.) and the like.

The polymerizable monomer or the like is a multifunctional monomer and may have an acid group such as a carboxyl group, a sulfonic acid group, or a phosphoric acid group. Therefore, if the ethylenic compound has an unreacted carboxyl group as the case as described above where the ethylenic compound is a mixture, it is possible to use the ethylenic compound as it is; however, an acid group may be introduced by reacting a non-aromatic carboxylic anhydride with a hydroxyl group of the ethylenic compound described above as necessary. In such a case, specific examples of the non-aromatic carboxylic anhydride to be used include anhydrous tetrahydrophthalic acid, alkyl anhydrous tetrahydrophthalic acid, anhydrous hexahydrophthalic acid, alkyl anhydrous hexahydro phthalic acid, anhydrous, succinic acid, and anhydrous maleic acid.

In the present invention, a monomer which has an acid group is an ester of an aliphatic polyhydroxy compound and an unsaturated carboxylic acid, preferably a multifunctional monomer which has an acid group by reacting the non-aromatic carboxylic anhydride with the unreacted hydroxyl group of the aliphatic polyhydroxy compound, particularly preferably an ester where the aliphatic polyhydroxy compound is pentaerythritol and/or dipentaerythritol Examples of commercially available products include Aronics series M-305, M-510, M-520, and the like as polybasic acid, modified acryl oligomers manufactured by Toagosei Co., Ltd The preferable acid value of the multifunctional monomer which has an acid group is 0.1 mgKOH/g to 40 mgKOH/g, and particularly preferably 5 mgKOH/g to 30 mgKOH/g. In a case of using two or more types of the multifunctional monomer which is a different acid group together, or in a case of using multifunctional monomers which do not have an acid group together, it is essential to carry out preparation such that the acid value of the multifunctional monomer as a whole falls within the range described above.

In addition, the polymerizable monomer and the like preferably contain a multifunctional monomer which has a caprolactone modified structure The multifunctional monomer which has a caprolactone modified structure is not particularly limited as long as there is a caprolactone modified structure in the molecule; however, examples thereof include polyhydric alcohols such as trimethylol ethane, ditrimethylol ethane, tritnethylol propane, ditrimethylol propane, pentaerythritol, dipentaerythritol, tripentaerythritol, glycerin, diglycerol, and trimethylol melamine, and ε-caprolactone-modified multifunctional (meth)acrylate which is obtained by esterifying the (meth)acrylic acid and ε-caprolactone. Among these, the multifunctional monomer which has the caprolactone modified structure which is represented by the following formula (1) is preferable.

[Chem. 19]

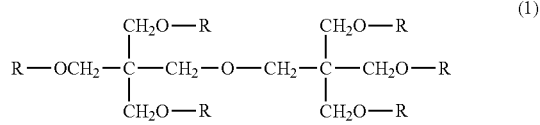

(In the formula, the six R's are all groups which are represented by the following formula (2), or 1 to 5 of the six R's are groups which are represented by the following formula (2), and the rest are a group which is represented by the following formula (3).)

[Chem. 20]

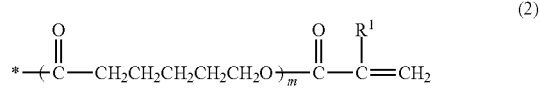

(In the formula, indicates a hydrogen atom or a methyl group, m indicates a number of 1 or 2, and [*] indicates an atomic bond)

[Chem. 21]

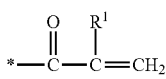

(3)

(In the formula, $R^1$ indicates a hydrogen atom or a methyl group, and [*] indicates an atomic bond.)

Multifunctional monomers which have such a caprolactone modified structure are commercially available, for example, as the KAYARAD DPCA series from Nippon Kayaku Co., Ltd., and examples thereof include DPCA-20 (a compound where, in the formulas (1) to (3) described above, m=1, the number of the groups which are represented by the formula (2)=2, and $R^1$ is all hydrogen atoms), DPCA-30 (a compound where, in the same formulas, m=1, the number of the groups which are represented by the formula (2)=3, and $R^1$ is all hydrogen atoms), DPCA-60 (a compound where, in the same formulas, m=1, the number of the groups which are represented by the formula (2)=6, and $R^1$ is all hydrogen atoms), DPCA-120 (a compound where, in the same formulas, m=2, the number of the groups which are represented by the formula (2)=6, and $R^1$ is all hydrogen atoms), and the like.

In the present invention, it is possible to use the multifunctional monomer which has a caprolactone modified structure alone or in a mixture of two or more types.

In addition, it is also preferable that the polymerizable monomer and the like in the present invention be at least one type which is selected from the groups of compounds which are represented by the following general formula (i) or (ii).

[Chem. 22]

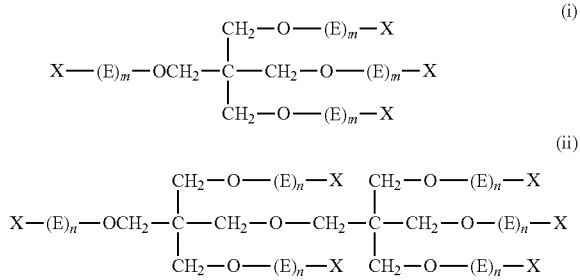

In the general formulas (i) and (ii), E each independently represents $—((CH_2)_yCH_2O)-$ or $((CH_2)_yCH(CH_3)O)—$, y each independently represents an integer from 0 to 10, and X each independently represents an acryloyl group, a methacryloyl group, a hydrogen atom, or a carboxyl group.

In the general formula (1), the total of the acryloyl groups and the methacryloyl groups is 3 or 4, m each independently represents an integer from 0 to 10, and the total of each m is an integer from 0 to 40. Here, in case where the total of each of the m's is 0, any one of the X's is a carboxyl group.

In the general formula (ii), the total of the acryloyl groups and the methacryloyl groups is 5 or 6, n each independently represents an integer from 0 to 10, and the total of each of the n's is an integer from 0 to 60. Here, in a case where the total of each of the n's is 0, any one of the X's is a carboxyl group.

In the general formula (1), m is preferably an integer from 0 to 6, and more preferably an integer from 0 to 4. In addition, the total of each of the m's is preferably an integer from 2 to 40, more preferably an integer from 2 to 16, and particularly preferably an integer from 4 to 8.

In the general formula (ii), n is preferably an integer from 0 to 6, and more preferably an integer from 0 to 4. In addition, the total of each of the n's is preferably an integer from 3 to 60, more preferably an integer from 3 to 24, and particularly preferably an integer from 6 to 12.

In addition, $—((CH_2)_3CH_2O)—$ and $((CH_2)_yCH(CH_3)O)—$ in the general formula (1) and the general formula (ii) are preferably in a form where the terminal of the oxygen atom side is bonded to X.

Regarding the compounds which are represented by the general formula (1) or (ii), one type alone may be used or two or more types may be used together. In particular, in the general formula (ii), a form where all of the six X's are acryloyl groups is preferable.

It is possible to synthesize the compounds which are represented by the general formula (i) or (ii) from a process which bonds a ring-opening skeleton with pentaerythritol or dipentaerythritol by a ring-opening adding reaction of ethylene oxide or propylene oxide, and a process which introduces a (meth)acryloyl group by reacting, for example, (meth)acryloyl chloride with the terminal hydroxyl group of the ring-opening skeleton, which are processes which are known in the related art. Each of the processes is a well-known process, and it is possible for a person skilled in the art to easily synthesize the compounds which are represented by the general formula (i) or (ii).

Among the compounds which are represented by the general formula (1) or (ii), a pentaerythritol derivative and/or a dipentaerythritol derivative is more preferable.

Specific examples thereof include the compounds which are represented by the following formulas (a) to (f) (also referred to below as 'example compounds (a) to (f)'), and among these, the example compounds (a), (b), (e), and (f) are preferable.

[Chem. 23]

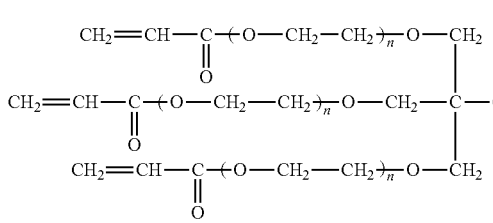 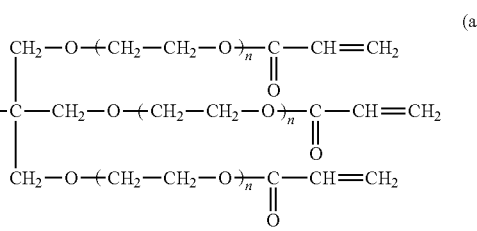

(a)

(The total of each of the n's is 6)

-continued

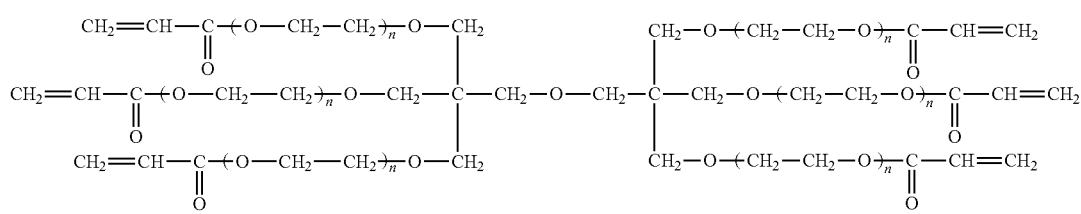

(The total of each of the n's is 12)    (b)

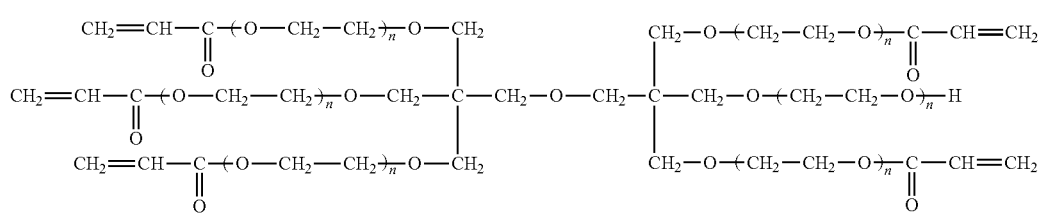

(The total of each of the n's is 12)    (c)

[Chem. 24]

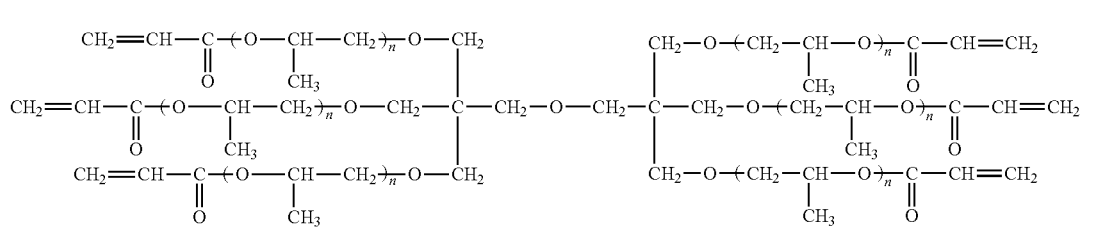

(The total of each of the n's is 6)    (d)

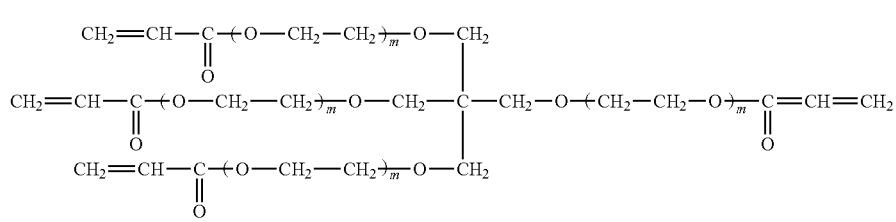

(The total of each of the m's is 4)    (e)

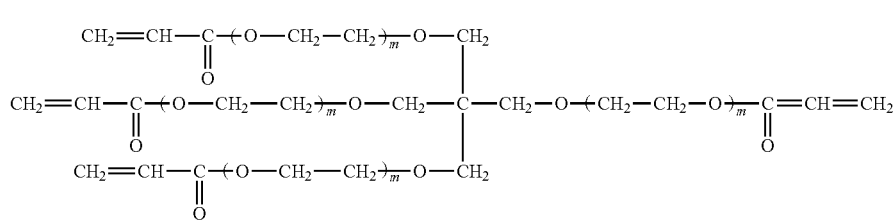

(The total of each of the m's is 12)    (f)

Examples of commercially available products of the polymerizable monomer and the like represented by the general formulas (i) and (ii) include SR-494 which is a tetrafunctional acrylate which has four ethylene oxy chains manufactured by Sartomer Corp., DPCA-60 which is a hexafunctional acrylate which has six pentyleneoxy chains and TPA-330 which is a trifunctional acrylate which has three isobutylene oxy chains manufactured by Nippon Kayaku. Co., Ltd., and the like.

In addition, as the polymerizable monomer, the urethane acrylates as described in JP1973-41708B (JP-S48-41708B), JP1976-37193A (JP-S51-37193A), JP1990-32293B (JP-H2-32293B), and JP1990-16765B (JP-H2-16765B), and the urethane compounds which have an ethylene oxide skeleton as described in JP1983-49860B (JP-S58-49860B), JP1981-17654B (JP-S56-17654B), JP1987-39417B (JP-S62-39417B), and JP1987-39418B (TP-S62-39418B) are also suitable. Furthermore, as the polymerizable monomers and the like, it is possible to obtain a curable composition with an extremely excellent photosensitive speed by using the addition-polymerizable monomers which have an amino structure or a sulfide structure in the molecule as described in JP1988-277653A (JP-S63-277653A), JP1988-260909A (JP-S63-260909A), and JP1989-105238A (JP-H1-105238A)

Examples of commercially available products of the polymerizable monomers include urethane oligomer UAS-10, and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600, (manufactured by Kyoeisha Chemical Co., Ltd.), and the like.

As the polymerizable monomers, multifunctional thiol compounds which have two or more mercapto (SH) groups in the same molecule are also suitable. In particular, those which are represented by the following general formula (1) are preferable.

[Chem. 25]

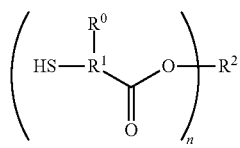

(I)

(In the formula, $R^1$ is an alkyl group, $R^2$ is an n-valent aliphatic group which may include atoms other than carbon, $R^0$ is an alkyl group which is not H, and n represents 2 to 4)

Specific examples of the multifunctional thiol compounds which are represented by the general formula (1) described above include 1,4-bis(3-mercapto butyryloxy)butane [formula (II)], 1,3,5-tris(3-mercapto butyloxyethyl)-1,3,5-triazine-2,4,6(1H,3H,5H)-trione [formula (III)], pentaerythritol tetrakis(3-mercapto butyrate) [formula (IV)], and the like. It is possible for one type of these multifunctional thiols to be used alone, or for a plurality of the thiols to be used in combination.

[Chem. 26]

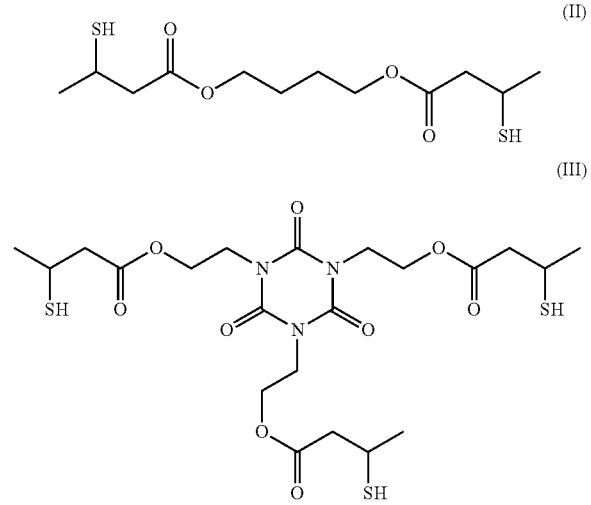

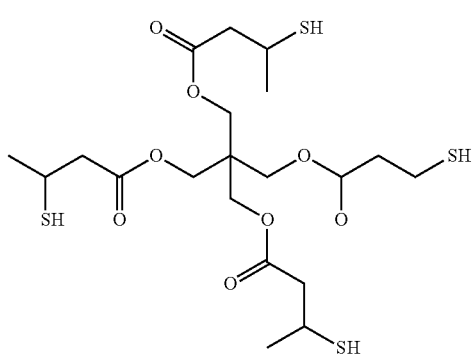

In the present invention, as the polymerizable monomers and the like, it is preferable to use polymerizable monomers or oligomers which have two or more epoxy groups or oxetanyl groups in the molecule.

<<C: Compound Which has an Epoxy Group or an Oxetanyl Group>>

In a third preferable aspect of the present invention, a compound which has an epoxy group or an oxetanyl group may be used as the polymerizable compound. Specific examples of the compound which has an epoxy group or an oxetanyl group include polymers which have an epoxy group in the side chain, and polymerizable monomers or oligomers which have two or more epoxy groups in the molecule, such as Bisphenol A type epoxy resin, bisphenol F epoxy resin, Phenol novolak type epoxy resin, Cresol novolak type epoxy resin, and aliphatic epoxy resin.

These compounds may be commercially available products or may be obtained by introducing an epoxy group into the side chain of the polymer.

Examples of the commercial products include, for example, as bisphenol A type epoxy resins, JER827, JER828, JER834, JER1001, JER1002, JER1003, JER1055, JER1007, JER1009, and JER1010 (the above are manufactured by Japan Epoxy Resins Co., Ltd.), EPICLON860, EPICLON1050, EPICLON1051, and EPICLON1055 (the above are manufactured by DIC Corp.), as bisphenol F epoxy resins, JER806, JER807, JER4004, JER4005, JER4007, and JER4010 (the above are manufactured by Japan Epoxy Resins Co., Ltd.), EPICLON830, and EPICLON835 (the above are manufactured by DIC Corp.), LCE-21, and RE-602S (the above are manufactured by Nippon Kayaku Co., Ltd.), as phenol novolak type epoxy resins, JER152, JER154, JER157S70, and JER157S65, (the above are manufactured by Japan Epoxy Resins Co., Ltd.), EPICLON N-740, EPICLON N-740, EPICLON N-770, and EPICLON N-775 (the above are manufactured by DIC Corp.), as cresol novolak type epoxy resins, EPICLON N-660, EPICLON N-665, EPICLON N-670, EPICLON N-673, EPICLON N-680, EPICLON N-690, and EPICLON N-695 (the above are manufactured by DIC Corp.), EOCN-1020 (the above are manufactured by Nippon Kayaku Co., Ltd.), as aliphatic epoxy resins, ADEKA RESIN EP-4080S, ADEKA RESIN EP-4085S, ADEKA RESIN EP-4088S (the above are manufactured by ADEKA Corp.), Celloxide 2021P, Celloxide 2081, Celloxide 2083, Celloxide 2085, EHPE3150, EPOLEAD PB 3600, and EPOLEAD PB 4700 (the above are manufactured by Daicel Chemical Industries, Ltd.), Denacol EX-211L, EX-212L, EX-214L, EX-216L, EX-321L, and EX-850L (the above are manufactured by Nagase ChemteX Corp.), and the like. In addition, examples include ADEKA RESIN EP-4000S, ADEKA RESIN EP-4003S, ADEKA RESIN EP-4010S, and ADEKA RESIN EP-4011S (the above are manufactured by ADEKA Corp.), NC-2000, NC-3000, NC-7300, XD-1000, EPPN-501, and EPPN-502 (the above are manufactured by ADEKA Corp.), JER1031S (manufactured by Japan Epoxy Resins Co., Ltd.), and the like.

As specific examples of the polymer which has an oxetanyl group in the side chain and the polymerizable monomer or oligomer which has two or more oxetanyl groups in the molecule described above, it is possible to use ARON OXETANE OXT-121, OXT-221, OX-SQ, and PNOX (the above are manufactured by Toagosei Co., Ltd.).

In the case of synthesis by being introduced into the polymer side chain, the introduction reaction may be performed by reacting, for example, triethylamine, tertiary amines such as benzyl methyl amine, quaternary ammonium salts such as dodecyl trimethyl ammonium chloride, tetramethyl ammonium chloride, and tetraethyl ammonium chloride, pyridine, triphenylphosphine, or the like in an organic solvent as catalyst for several hours to several tens of hours at a reaction temperature of 50 to 150° C. The introduction amount of the alicyclic epoxy unsaturated compound is preferably controlled such that the acid value of the polymer which is obtained is in a range which satisfies 5 to 200 KOH·mg/g. In addition, the molecular weight is preferably within a weight average of 500 to 5000000, and more preferably 1000 to 500000.

As the epoxy unsaturated compounds, it is also possible to use those which have a glycidyl group as the epoxy group such as glycidyl(meth)acrylate or allyl glycidyl ether; however, unsaturated compounds which have an alicyclic epoxy group are preferable. As the above, it is possible to exemplify the following compounds as examples.

[Chem. 27]

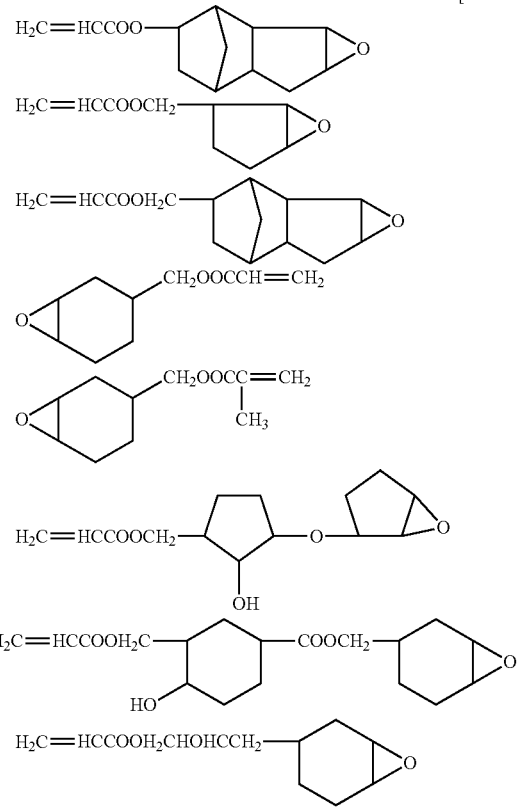
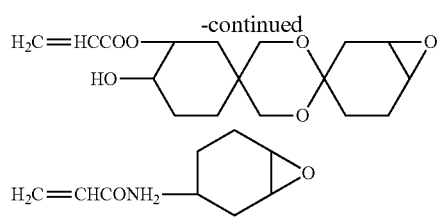

In addition, specific examples of the monomers of amides of the aliphatic multivalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris acrylamide, xylylene bis-acrylamide, xylylene bis-methacrylamide, and the like.

Examples of other preferable amide-based monomers include those which have a cyclohexylene structure as described in JP54-21726B (JP-S54-21726B), In addition, urethane-based addition-polymerizable compounds which are manufactured using an addition reaction between an isocyanate and a hydroxyl group are also suitable, and specific examples thereof include vinyl urethane compounds and the like which are represented by the following formula (V) and which contain two or more polymerizable vinyl groups in the molecule where a vinyl monomer which has a hydroxyl group is added to a polyisocyanate compound which has two or more isocyanate groups in one molecule as described in JP48-41708B (JP-S48-41708B).

In the following formula (V), $R^7$ and $R^8$ each independently represent a hydrogen atom or a methyl group.

$$H_2C=CR^7COOCH_2CH(R^8)OH \qquad \text{Formula (V)}$$

In addition, urethane acrylates as described in JP51-37193A (JP-S51-37193A), JP2-32293B (JP-H2-32293B), and JP2-16765B (JP-H2-16765B), and urethane compounds which have an ethylene oxide skeleton as described in JP58-49860B (JP-S58-49860B), JP56-17654B (JP-S56-17654B), JP62-39417B (JP-S62-39417B), and J62-39418B (JP-S62-39418B) are also suitable. Furthermore, it is possible to obtain a curable composition with an extremely excellent photosensitive speed by using the polymerizable compounds which have an amino or a sulfide structure in the molecule, as described in JP63-277653A (JP-S63-277653A), JP63-260909A (JP-S63-260909A), and JP1-105238A (JP-H1-105238A).

Other examples include multifunctional acrylates or methacrylates such as epoxy acrylates which are obtained by reacting (meth)acrylic acid with polyester acrylates and epoxy resins such as those described in each of JP48-64183A (JP-S48-64183A), JP49-43191B (JP-S49-43191B), and JP52-30490B (JP-S52-30490B). In addition, examples include specific unsaturated compounds as described in JP46-43946B (JP-S46-43946B), JP1-40337B (JP-H1-40337B), and JP1-40336B (JP-H1-40336B), and vinyl phosphonic acid-based compounds as described in JP2-25493A (JP-H2-25493A), and the like. In addition, in some cases, a structure which contains a perfluoroalkyl group as described in JP61-22048A (JP-S61-22048A) may be suitably used. Furthermore, it is also possible to use photocurable monomers and oligomers as described in the Journal of the Adhesion Society of Japan Vol. 20, No. 7, pages 300 to 308 (1984).

For these polymerizable compounds, it is possible to arbitrarily set the details of their structures, or the usage methods such as whether the compounds are used alone or in combination, and the added amounts, according to the final performance design of the curable composition. For example, selection may be made from the following points of view.

A structure where the content of the unsaturated group is high in each molecule is preferable from the point of view of sensitivity, and in many cases, bifunctional or higher is preferable. In addition, in order to increase the strength of the cured film, trifunctional or higher is good, furthermore, a method where both of the sensitivity and the strength are adjusted by using different polymerizable groups with different functional numbers (for example, acrylic acid esters, methacrylic acid ester, styrene-based compounds, vinyl ether-based compounds, epoxy-based compounds, and oxetane-based compounds) is also effective.

In addition, with respect to the compatibility and dispersibility with other components which are contained in the curable composition (for example, a polymerization initiator, metal oxide particles, and the like), the method of selecting and using the polymerizable compound is an important factor, for example, in some cases it is possible to improve the compatibility by using a low purity compound or using two or more types of the other components together. In addition, it is possible to select a specific structure with the object of improving the adhesion with a hard surface such as a substrate.

The content of the (D) polymerizable compound with respect to the total solid content of the curable composition for forming the high refractive index layer is preferably in a range of 1 mass % to 50 mass %, more preferably 3 mass % to 40 mass %, and even more preferably 5 mass % to 30 mass %.

Within these ranges, the curability is good without decreasing the refractive index, which is preferable.

(E) Polymerization Initiator

The (E) polymerization initiator is a compound which initiates and promotes the polymerization of the (D) polymerizable compound, and it is preferable that the (E) polymerization initiator be stable up to 45° C. and that the polymerization initiation ability be good during high temperature heating.

In addition, the polymerization initiator preferably contains at least one type of a compound which has a molecular extinction coefficient of at least approximately 50 in a range of approximately 300 nm to 800 nm (330 nm to 500 nm is more preferable).

In addition, it is possible to use the polymerization initiator alone or to use two or more types together.

Examples of the (E) polymerization initiator include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic boric acid compounds, disulfonic acid compounds, oxime ester compounds, onium salt compounds, and acyl phosphine (oxide) compounds.

Specific examples of an organic halogenated compound include the compounds described in Wakabayashi et al, 'Bull. Chem. Soc. Japan' 42, 2924 (1969), U.S. Pat. No. 3,905,815A, JP1971-4605B (JP-S46-4605B), JP1973-36281A (JP-S48-36281A), JP1980-32070A (JP-S55-32070A), JP1985-239736A (JP-S60-239736A), JP1986-169835A (JP-S61-169835A), JP1986-169837A (JP-S61-169837A), JP 1987-58241A (JP-S62-58241A), JP1987-212401A (JP-S62-212401A), JP1988-70243A (JP-S63-70243A), JP1988-298339A (JP-S63-298339A), M. P. Hutt "Journal of Heterocyclic Chemistry" 1 (No. 3), (1970), and the like, in particular, examples include an oxazole compound and an s-triazine compound where a trihalomethyl group is substituted.

More favorable examples of an s-triazine compound include an s-triazine derivative where at least one of mono, di, or trihalogen substituted methyl groups is bonded to an s-triazine ring, specifically, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxy)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(tri chloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

Examples of an oxydiazole compound include 2-trichloromethyl-5-styryl-1,3,4-oxodiazole, 2-trichloromethyl-5-(cyanostyryl)-1,3,4-oxodiazole, 2-trichloromethyl-5-(naphtho-1-yl)-1,3,4-oxodiazole, 2-trichloromethyl-5-(4-styryl)styryl-1,3,4-oxodiazole, and the like.

Examples of a carbonyl compound include benzophenone, Michler's ketone, benzophenone derivatives such as 2-methyl benzophenone, 3-methyl benzophenone, 4-methyl benzophenone, 2-chloro benzophenone, 4-bromo-benzophenone, and 2-carboxybenzophenone; acetophenone derivatives such as 2,2-dimethoxy-2-phenyl acetophenone, 2,2-diethoxy acetophenone, 1-hydroxy cyclo hexyl phenyl ketone, $\alpha$-hydroxy-2-methylphenylpropanone, 1-hydroxy-1-methylethyl-(p-isopropyl phenyl)ketone, 1-hydroxy-1-(p-dodecylphenyl)ketone, 2-methyl-(4'-(methylthio)phenyl)-2-morpholino-1-propanone, 2-(dimethylamino)-2-[(4-methylphenyl)methyl]-1-[4-(4-morpholinyl)phenyl]-1-butanone, 1,1,1-trichloromethyl-(p-butylphenyl)ketone, and 2-benzyl-2-dimethylamino-4-morpholinobutyrophenone; thioxanthone, thioxanthone derivatives such as 2-ethylthioxanthone, 2-isopropylthioxanthone, 2-chlorothioxanthone, 2,4-dimethylthioxanthone, 2,4-diethylthioxanthone, and 2,4-diisopropyl thioxanthone, and benzoic acid ester derivatives such as p-dimethylamino ethyl benzoate, and p-diethylamino ethyl benzoate.

Examples of a ketal compound include benzyl methyl ketal, benzyl-$\beta$-methoxyethyl acetal, and the like.

Examples of a benzoin compound include m-benzoin iso-propyl ether, benzoin isobutyl ether, benzoin methyl ether, methyl o-benzoylbenzoate, and the like.

Examples of an acridine compound include 9-phenyl acridine, 1,7-bis(9-acridinyl) heptane, and the like.

Examples of an organic peroxide compound include trimethyl cyclohexanone peroxide, acetylacetone peroxide, 1,1-bis(tert-butylperoxy)-3,3,5-trimethyl cyclohexane, 1,1-bis(tert-butylperoxy)cyclohexane, 2,2-bis(tert-butylperoxy) butane, tert-butyl hydroperoxide, cumene hydroperoxide, diisopropyl benzene hydroperoxide, 2,5-dimethylhexane-2, 5-dihydroperoxide, 1,1,3,3-tetramethyl-butyl hydroperoxide, tert-butyl cumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichloro benzoyl peroxide, diisopropylperoxydicarbonate, di-2-ethylhexyl peroxydicarbonate, di-2-ethoxyethyl peroxydicarbonate, dimethoxyisopropylperoxydicarbonate, di(3-methyl-3-methoxy butyl)peroxy dicarbonate, tert-butyl peroxy acetate, tert-butylperoxy pivalate, tert-butyl peroxyneodecanoate, tert-butyl peroxyoctanoate, tert-butylperoxy laurate, 3,3',4,4'-tetra(t-butyl peroxy)benzophenone, 3,3',4,4'-tetra(t-hexylperoxycarbonyl)benzophenone, 3,3',4,4'-tetra (p-isopropyl cumylperoxycarbonyl)benzophenone, carbonyl di(t-butylperoxy dihydrogen diphthalate), carbonyl di(t-hexyl peroxy dihydrogen diphthalate), and the like.

Examples of an azo compound include the azo compounds as described in JP1996-108621A (JP-H8-108621A), and the like.

Examples of a coumarin compound include 3-methyl-5-amino-((s-triazin-2-yl)amino)-3-phenyl coumarin, 3-chloro-5-diethylamino-((s-triazin-2-yl)amino)-3-phenyl coumarin, 3-butyl-5-dimethylamino-((s-triazin-2-yl)amino)-3-phenyl coumarin, and the like.

Examples of an azide compound include the organic azide compounds as described in U.S. Pat. No. 2,848,328A, U.S. Pat. No. 2,852,379A and U.S. Pat. No. 2,940,853A, 2,6-bis (4-azide benzylidene)-4-ethyl cyclohexanone (BAC-E), and the like.

Examples of a metallocene compound include various types of titanocene compounds as described in JP1984-152396A (JP-S59-152396A), JP1986-151197A (JP-S61-151197A), JP1988-41484A (JP-S63-41484A), JP1990-249A (JP-H2-249A), JP1990-4705A (JP-H2-4705A) and JP1993-83588A (JP-H5-83588A), such as dicyclopentadienyl-Ti-bis-phenyl, dicyclopentadienyl-Ti-bis-2,6-difluoro-phenyl-1-yl, dicyclopentadienyl-Ti-bis-2,4-difluoro-phenyl-1-yl, dicyclopentadienyl-Ti-bis 2,4,6-trifluoro-phenyl-1-yl, dicyclopentadienyl-Ti-bis-2,3,5,6-tetra-fluoro-phenyl-1-yl, dicyclopentadienyl-Ti-bis-2,3,4,5,6-pentafluorophenyl-1-yl, dimethylcyclopentadienyl-Ti-bis-2,6-difluoro-phenyl-1-yl, dimethylcyclopentadienyl-Ti-bis 2,4,6-trifluoro-phenyl-1-yl, dimethylcyclopentadienyl-Ti-bis-2,3,5,6-tetra-fluoro-phenyl-1-yl, dimethyl cyclopentadienyl-Ti-bis-2,3,4,5,6-pentafluorophenyl-1-yl, ion arene complexes described in JP1989-304453A (JP-H1-304453A), JP1989-152109A (JP-H1-152109A), and the like.

Examples of a preferable biimidazole-based compound include a hexaarylbiimidazole compound (a lophine dimer-based compound), and the like.

Examples of a hexaarylbiimidazole compound include lophine dimers as described in JP1970-37377B (JP-S45-37377B) and JP1969-86516B (JP-S44-86516B), and various types of compounds as described in each of the specifications such as JP1994-29285B (JP-H6-29285B), U.S. Pat. No. 3,479,185A, U.S. Pat. No. 4,311,783A, U.S. Pat. No. 4,622,286A, specifically, 2,2'-bis(o-chlorophenyl)-4,4',5,5'-tetraphenylbiimidazole, 2,2'-bis(o-bromophenyl))4,4',5,5'-tetraphenylbiimidazole, 2,2'-bis(o,p-dichlorophenyl)-4,4',5, 5'-tetraphenylbiimidazole, 2,2'-bis(o-chlorophenyl)-4,4',5, 5'-tetra(m-methoxyphenyl)biimidazole, 2,2'-bis(o, o'-dichlorophenyl)-4,4',5,5'-tetraphenylbiimidazole, 2,2'-bis (o-nitrophenyl)-4,4',5,5'-tetraphenylbiimidazole, 2,2'-bis(o-methyl)-4,4',5,5'-tetraphenylbiimidazole, 2,2'-bis(o-trifluoromethylphenyl)-4,4',5,5'-tetraphenyl biimidazole, and the like.

Specific examples of an organic borate compound include organic borate as described in each of the official gazettes such as JP1987-143044A (JP-S62-143044A), JP1987-150242A (JP-S62-150242A), JP1997-188685A (JP-H9-188685A), JP1997-188686A (JP-H9-188686A), JP1997-188710A (JP-H9-188710A), JP2000-131837A, JP2002-107916A, JP2764769B, and JP2001-16539A, and Kunz, Martin "Rad Tech'98. Proceeding Apr. 19-22, 1998, Chicago", and the like, an organic boron sulfonium complex or an organic boron oxosulfonium complex as described in JP1994-157623A (JP-H6-157623A), JP1994-175564A (JP-H6-175564A) and JP1994-175561A (JP-H6-175561A), an organic boron iodonium complex as described in JP1994-175554A (JP-H6-175554A) and JP1994-175553A (JP-H6-175553A), an organic boron phosphonium complex described in JP1997-188710A (JP-H9-188710A), an organic boron transition metal coordination complex as described in JP1994-348011A (JP-H6-348011A), JP1995-128785A (JP-H7-128785A), JP1995-140589A (JP-H7-140589A), JP1995-306527A (JP-H7-306527A), JP1995-292014A (JP-H7-292014A) or the like, and the like.

Examples of a disulfone compound include the compounds as described in JP1986-166544A (JP-S61-166544A), JP2002-328465A and the like, and the like.

As the polymerization initiator, it is also possible to favorably use a hydroxyacetophenone compound, an aminoacetophenone compound, and an acyl phosphine compound. More specifically, it is also possible to use the aminoacetophenone initiator as described in JP1998-291969A (JP-H10-291969A) and the acylphosphine oxido initiator as described in JP4225898B.

As a hydroxyacetophenone initiator, it is possible to use IRGACURE-184, DAROCUR-1173, IRGACURE-500, IRGACURE-2959, and IRGACURE-127 (product names: all manufactured by BASF Ltd.). As an aminoacetophenone initiator, it is possible to use IRGACURE-907, IRGACURE-369 and IRGACURE-379 (product names: all manufactured by BASF Ltd.) which are commercially available products. As an aminoacetophenone initiator, it is also possible to use the compounds, where the absorption wavelength matches a long wave light source of 365 nm, 405 nm or the like, as described in JP2009-191179A. In addition, as an acylphosphine initiator, it is possible to use the commercially available products IRGACURE-819 or DAROCUR-TPO (product names: both manufactured by BASF Ltd.).

From the point of view of the curability, the stability over time, and hindering coloring during post-heating, the (E) polymerization initiator is preferably an oxime compound.

Examples of an oxime compound include the compounds and the like as described in J. C. S. Perkin II (1979) 1653-1660), J. C. S. Perkin II (1979) 156-162, Journal of Photopolymer Science and Technology (1995) 202-232, Journal of Applied Polymer Science (2012) pp. 725-731, and JP2000-66385A, and the compounds described in JP2000-80068A and JP2004-534797A.

In addition, as an oxime ester compound other than the compounds described above, the compound where oxime is linked to the carbazole N position as described in JP2009-519904A, the compound where a hetero substituent group is introduced to a benzophenone unit as described in U.S. Pat. No. 7,626,957A, the compound where a nitro group is introduced to a pigment unit as described in JP2010-15025A and US2009-292039A, a ketoxime compound as described in WO2009-131189A, the compound which contains a triazine skeleton and an oxime skeleton in the same molecule as described in U.S. Pat. No. 7,556,910A, the compound which has an absorption maximum of 405 nm and has a good sensitivity with respect to a g line light source as described in JP2009-221114A, and the like may be used.

Furthermore, it is also possible to favorably use the cyclic oxime compounds as described in JP2007-231000A and JP2007-322744A. Among cyclic oxime compounds, from the point of view of having a high light absorption property and increasing the sensitivity, the cyclic oxime compounds which arecondensed to a carbazole pigment as described in JP2010-32985A and JP2010-185072A are particularly preferable.

In addition, it is also possible to achieve high sensitivity by reproducing an active radical from a polymerization inactive radical and to favorably use the compound which has an unsaturated bond in a specific unit of the oxime compound as described in JP2009-242469A.

Other examples thereof include the oxime compounds which have a specific substituent group as described in JP2007-269779A or the oxime compounds which have a thioaryl group as described in JP2009-191061A Specifically, the compound which is represented by the following formula (OX) is also preferable, and the compound which is represented by (OX-1) is more preferable. Here, the N—O bond of the oxime may be an oxime compound of (E) body, an oxime compound of (Z) body, or a mixture of the (E) body and the (Z) body.

[Chem. 28]

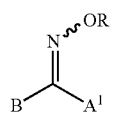

(OX)

In the formula (OX), R and B have the same meaning as the formula (OX-1) described later. $A^1$ is preferably -A-SAr in the formula (OX-1) or an alkyl group. The alkyl group preferably has 1 to 12 carbon atoms, more preferably 1 to 6, and particularly preferably 1 to 3.

[Chem. 29]

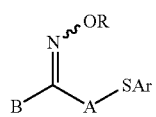

(OX-1)

(In the formula (OX-1), R and B each independently represent a monovalent substituent group, A represents a divalent organic group, and Ar represents an aryl group)

In the formula (OX-1), the monovalent substituent group which is represented by R is preferably a monovalent non-metal atom group.

Examples of the monovalent non-metal atom group include an alkyl group, an aryl group, an acyl group, an alkoxycarbonyl group, an aryloxycarbonyl group, a heterocyclic group, an alkylthiocarbonyl group, an arylthiocarbonyl group, and the like. In addition, these groups may have one or more substituent groups. In addition, the substituent groups described above may be further substituted with other substituent groups.

Examples of substituent groups include a halogen atom, an aryloxy group, an alkoxycarbonyl group or aryloxycarbonyl group, an acyloxy group, an acyl group, an alkyl group, an aryl group, and the like.

In the formula (OX-1), the monovalent substituent group which is represented by B represents an aryl group, a heterocyclic group, an arylcarbonyl group, or a heterocyclic carbonyl group. These groups may be bonded to a methylene group via a linking group, and examples of the linking group include a single bond, a carbonyl group, a substituent group Y described later, an alkyl group, or a combination thereof. In addition, these groups may have one or more substituent groups. Examples of the substituent groups include the substituent groups described above. In addition, the substituent groups described above may be further substituted with other substituent groups.

Among these, the structure shown below is particularly preferable.

In the structure described below, Y, Z, and n respectively have the same meaning as Y, X, and n in the formula (OX-2) described later, and the preferable examples are also the same

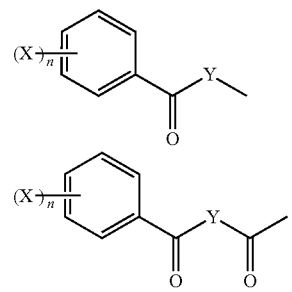

[Chem. 30]

In the formula (OX-1), examples of the divalent organic group which is represented by A include an alkylene group which has 1 to 12 carbon atoms, a cycloalkylene group which has 3 to 12 carbon atoms, and an alkynylene group which has 2 to 12 carbon atoms. In addition, these groups may have one or more substituent groups. Examples of the substituent groups include the substituent groups described above. In addition, the substituent groups described above may be further substituted with other substituent groups.

Among these, from the point of view of increasing the sensitivity and suppressing coloring due to heating over time, A in the formula (OX-1) is preferably an unsubstituted alkylene group, an alkylene group which is substituted with an alkyl group (for example, a methyl group, an ethyl group, a tert-butyl group, or a dodecyl group), an alkylene group which is substituted with an alkenyl group (for example, a vinyl group or an allyl group), or an alkylene group which is substituted with an aryl group (for example, a phenyl group, a p-tolyl group, a xylyl group, a cumenyl group, a naphthyl group, an anthryl group, a phenanthryl group, or a styryl group).

The oxime compound which is represented in the formula (OX-1) is preferably the compound which is represented by the following formula (OX-2).

[Chem. 31]

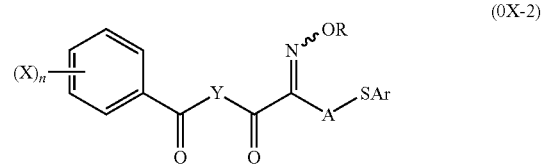

(OX-2)

In the formula (OX-2), R and X each independently represent a monovalent substituent group, A and Y each independently represent a divalent organic group, Ar represents an aryl group, and n represents an integer from 0 to 5.)

R, A, and Ar in the formula (OX-2) have the same meaning as R, A, and Ar in the formula (OX-1), and the preferable examples are also the same.

In the formula (OX-2), examples of a monovalent substituent group which is represented by X include an alkyl group, an aryl group, an alkoxy group, an aryloxy group, an aryloxy group, an acyl group, an alkoxycarbonyl group, an amino group, a heterocyclic group, and a halogen atom. In addition, these groups may have one or more substituent groups. Examples of the substituent groups include the substituent groups described above. In addition, the substituent groups described above may be further substituted with other substituent groups.

Among these, from the point of view of improvement of the solvent solubility and the absorption efficiency in the long wavelength region, X in the formula (OX-2) is preferably an alkyl group.

In addition, n in the formula (2) represents an integer from 0 to 5, and an integer from 0 to 2 is preferable.

In the formula (OX-2), examples of a divalent organic group which is represented by Y include the structures Sub-1 to Sub-11 described below. Here, in the group described below, '*' indicates the position of the bond with the carbon atom which is adjacent to Y in the formula (OX-2).

Among these, from the point of view of increasing the sensitivity, the structures Sub-1 and Sub-2 are preferable.

[Chem. 32]

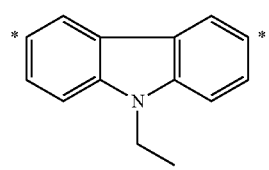
Sub-1

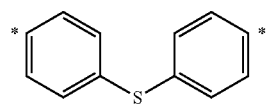
Sub-2

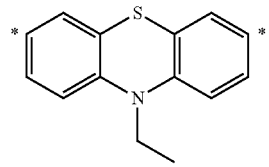
Sub-3

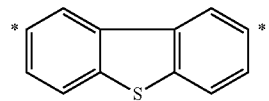
Sub-4

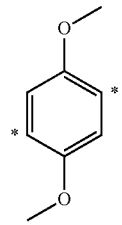
Sub-5

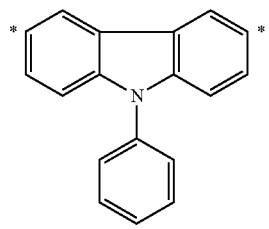
Sub-6

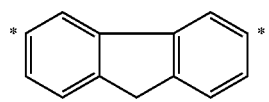
Sub-7

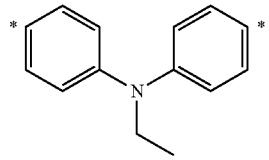
Sub-8

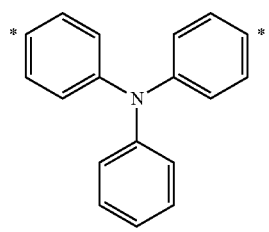
Sub-9

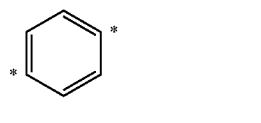
Sub-10

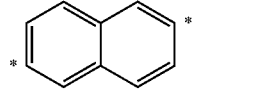
Sub-11

Furthermore, the oxime compound which is represented by the formula (OX-2) is preferably the compound which is represented by the following formula (OX-3).

[Chem. 33]

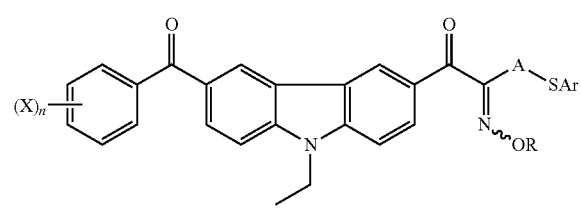
(OX-3)

In the formula (OX-3), R and X each independently represent a monovalent substituent group, A represents a divalent organic group, Ar represents an aryl group, and n represents an integer from 0 to 5)

R, X, A, Ar, and n in the formula (OX-3) respectively have the same meaning as R, X, A, Ar, and n in the formula (OX-2), and the preferable examples are the same.

Specific examples (PIox-1) to (PIox-13) of the oxime compounds which are favorably used will be shown below; however, the present invention is not limited thereto.

[Chem. 34]
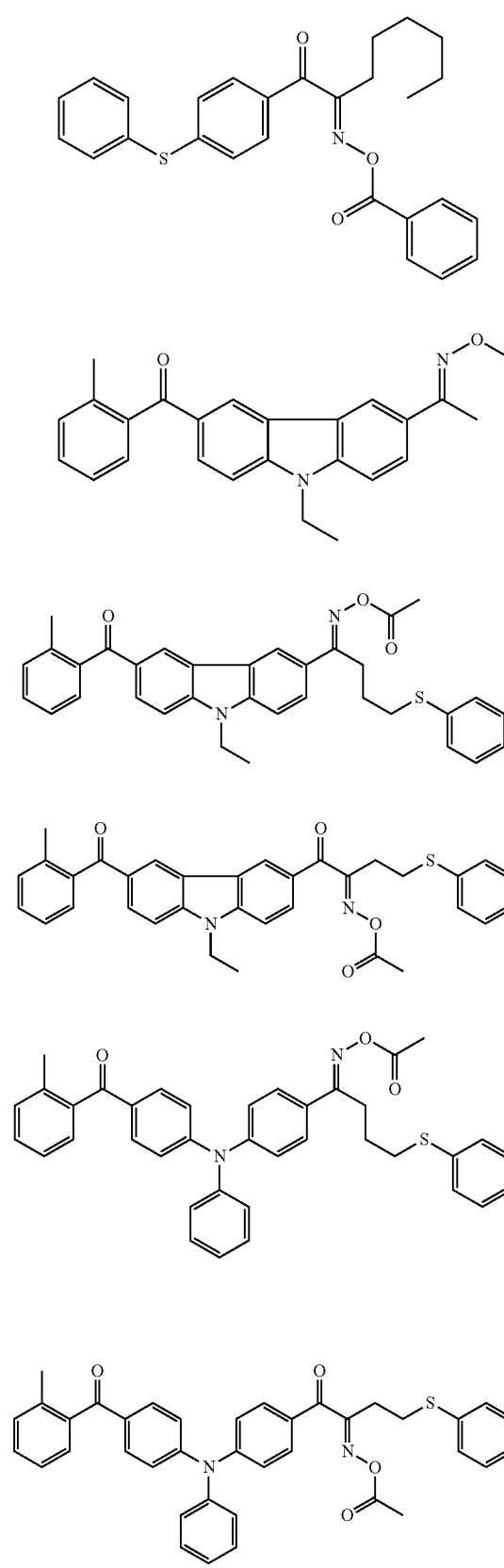
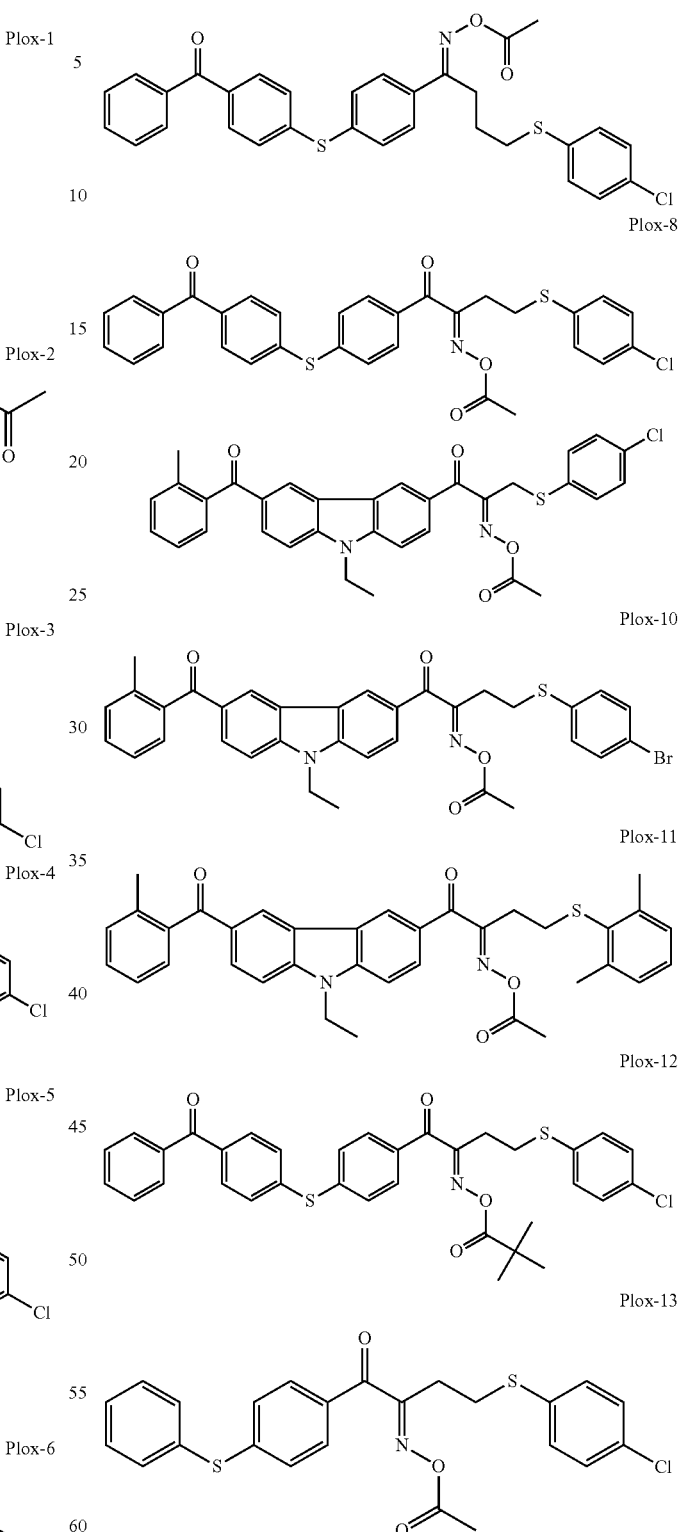
The oxime compound has a function as a heating polymerization initiator which is dispersed by being heated and which initiates and promotes polymerization.
In addition, the oxime compound preferably has a maximum absorption wavelength in the wavelength region of 350 nm to 500 nm, more preferably has an absorption wavelength in the wavelength region of 360 nm to 480 nm, and it is particularly preferable that the absorbance at 365 nm and 455 nm be high.

Regarding the oxime compound, from the point of view of the sensitivity, the molecular absorptivity at 365 nm or 405 nm is preferably 1,000 to 300,000, more preferably 2,000 to 300,000, and particularly preferably 5,000 to 200,000. It is possible to use a known method for the molar absorptivity of the compound, and specifically, for example, it is preferable to carry out measurement with an ultraviolet-visible spectrophotometer (Carry-5 spectrophotometer manufactured by Varian Medical Systems, Inc.), using ethyl acetate solvent with a concentration of 0.01 g/L.

In addition, as the oxime compound, it is also possible to favorably use commercially available products such as IRGACURE OXE01 and IRGACURE OXE02 (both manufactured by BASF Ltd.)

Examples of an onium salt compound include a diazonium salt as described in S. I. Schelesinger, Photogr. Sci. Eng., 18,387 (1974), and T. S. Bal et al, Polymer, 21,423 (1980), an ammonium salt as described in U.S. Pat. No. 4,069,055A and JP1992-365049A (JP-H4-365049A), a phosphonium salt as described in U.S. Pat. No. 4,069,055A and U.S. Pat. No. 4,069,056A, an iodonium salt as described in each of the specifications of EP104143B, each of the official gazettes of JP1990-150848A (JP-H2-150848A) and JP1990-296514A (JP-H2-296514A), and the like.

An iodonium salt is a diaryliodonium salt, and from the point of view of stability, it is preferably substituted with two or more of electron donating groups such as an alkyl group, an alkoxy group, and an aryloxy group.

Examples of a sulfonium salt include sulfonium salts as described in each of the specifications of EP370693B, EP390214B, EP233567B, EP297443B, EP297442B, U.S. Pat. Nos. 4,933,377A, 4,760,013A, 4,734,444A, 2,833,827A, DE2904626A, DE3604580A, and DE3604581A, and from the point of view of the stability and the sensitivity, it is preferably substituted with an electron attracting group. Regarding the electron attracting group, the Hammett value is preferably greater than 0. Examples of preferable electron attracting groups include a halogen atom, a carboxylic acid group, and the like.

In addition, other examples of preferable sulfonium salts include a sulfonium salt where one of the substituent groups in the triaryl sulfonium salt has a coumarin structure or an antoakinon structure and which has absorption at 300 nm or more. Other examples of preferable sulfonium salts include a sulfonium salt where the triaryl sulfonium salt has an allyloxy group and an arylthio group in the substituent group and which has absorption at 300 nm or more.

In addition, examples of onium salt compounds include a selenonium salt as described in J. V. Crivello et al, Macromolecules, 10(6), 1307 (1977) and J. V. Crivello et al, J. Polymer Sci., Polymer Chem. Ed., 17, 1047 (1979), an onium salt such as an arsonium salt as described in C. S. Wen et al, Teh, Proc. Conf. Rad. Curing ASIA, p478 Tokyo, October (1988), and the like.

Examples of acylphosphine (oxide) compounds include IRGACURE-819, DAROCUR-4265, DAROCUR-TPO, and the like manufactured by BASF Ltd.

As the (E) polymerization initiator, from the point of view of the curability, compounds which are selected from a group consisting of trihalomethyltriazine-based compounds, benzyl dimethyl ketal compounds, α-hydroxy ketone compounds, α-amino ketone compounds, acyl phosphine-based compound, phosphine oxide-based compounds, metallocene compounds, oxime-based compounds, triallylimidazole dimers, onium-based compounds, benzothiazole compounds, benzophenone-based compounds, acetophenone-based compounds and derivatives thereof, cyclopentadiene-benzene iron complexes and salts thereof, halomethyloxadiazole compounds, and 3-aryl-substituted coumarin compounds are preferable.

More preferable examples are trihalomethyltriazine-based compounds, α-amino ketone compounds, acyl phosphine-based compounds, phosphine oxide-based compounds, oxime-based compounds, triallylimidazole dimers, onium compounds, benzophenone-based compounds, and acetophenone-based compounds, most preferably at least one compound which is selected from a group consisting of trihalomethyltriazine-based compounds, α-amino ketone compounds, oxime-based compounds, triallylimidazole dimers, and benzophenone-based compounds.

In particular, in a case of providing the curable composition for forming the high refractive index layer on a color filter of a solid-state imaging element to make a microlens, in particular, it is most preferable to use an oxime-based compound as the (E) polymerization initiator since there is little coloring at the time of post-heating and the curability is good.

The content of the (E) polymerization initiator which is contained in the curable composition for forming the high refractive index layer (the total content in a case where there are two or more types) is preferably 0.1 mass % or more and 10 mass % or less with respect to the total solid content of the curable composition, more preferably 0.3 mass % or more to 8 mass % or less, and even more preferably 0.5 mass % or more to 5 mass % or less. A good curability is obtained within these ranges.

The curable composition for forming the high refractive index layer may further contain arbitrary components which will be described in detail below as necessary. Below, description will be given of arbitrary components which may be contained in the curable composition.

[Polymerization Inhibitor]

It is preferable to add a polymerization inhibitor in order to prevent unnecessary polymerization of compounds which have a polymerizable ethylenically unsaturated double bond while manufacturing or storing the curable composition.

Examples of a polymerization inhibitor include phenolic hydroxyl group-containing compounds, N-oxide compounds, piperidine 1-oxyl free radical compounds, pyrrolidine 1-oxyl free radical compounds, N-nitroso phenyl hydroxylamines, diazonium compounds, cationic dyes, sulfide group-containing compounds, nitro group-containing compounds, and transition metal compounds such as $FeCl_3$, and $CuCl_2$.

A more preferable aspect is as follows.

It is preferable that a phenol hydroxyl group-containing compound be a compound which is selected from a group consisting of hydroquinone, p-methoxyphenol, di-t-butyl-p-cresol, pyrogallol, t-butyl catechol, benzoquinone, 4,4-thiobis(3-methyl-6-t-butyl phenol), 2,2'-methylenebis(4-methyl-6-t-butyl phenol), phenolic resins, and cresol resins.

It is preferable that N-oxide compounds be compounds which are selected from a group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide.

It is preferable that piperidine 1-oxyl free radical compounds be compounds which are selected from a group consisting of piperidine 1-oxyl free radicals, 2,2,6,6-tetramethylpiperidine 1-oxyl free radicals, 4-oxo-2,2,6,6-tetramethylpiperidine 1-oxyl free radicals, 4-hydroxy-2,2,6,6-tetramethylpiperidine 1-oxyl free radicals, 4-acetamido-2,2,6,6-tetramethylpiperidine 1-oxyl free radicals, 4-maleimide 2,2,6,6-tetramethylpiperidine 1-oxyl free radicals, and 4-phosphonoxy-2,2,6,6-tetramethylpiperidine 1-oxyl free radicals.

The pyrrolidine 1-oxyl free radical compounds are preferably 3-carboxy proxy free radicals (3-carboxy-2,2,5,5 tetramethyl-pyrrolidine 1-oxyl free radicals).

The N-nitroso phenyl hydroxylamines are preferably compounds which are selected from a group consisting of N-nitrosophenylhydroxylamine first cerous salt and N-nitrosophenylhydroxylamine aluminum salt.

The diazonium compounds are preferably compounds which are selected from a group consisting of hydrogen sulfate of 4-diazo phenyl dimethyl amine, tetrafluoroborate of 4-diazodiphenylamine, and hexafluorophosphate of 3-methoxy-4-diazodiphenylamine.

Among the example compounds described above, hydroquinone, p-methoxyphenol, di-t-butyl-p-cresol, pyrogallol, t-butyl catechol, benzoquinone, 4,4-thiobis(3-methyl-6-t-butylphenol), phenolic hydroxyl group-containing compounds of 2,2'-methylenebis(4-methyl-6-t-butylphenol) piperidine 1-oxyl free radicals, or 2,2,6,6-tetramethylpiperidine 1-oxyl free radicals, 4-oxo-2,2,6,6-tetramethylpiperidine 1-oxyl free radicals, 4-hydroxy-2,2,6,6-tetramethylpiperidine 1-oxyl free radicals, 4-acetamido-2,2,6,6-tetramethylpiperidine 1-oxyl free radicals, 4-maleimide 2,2,6,6-tetramethylpiperidine 1-oxyl free radicals, and piperidine 1-oxyl free radical compounds of 4-phosphonoxy 2,2,6,6-tetramethylpiperidine 1-oxyl free radicals, or N-nitrosophenylhydroxylamine compounds of N-nitrosophenylhydroxylamine first cerous salt and N-nitrosophenylhydroxylamine aluminum salt are preferable; 2,2,6,6-tetramethylpiperidine 1-oxyl free radicals, 4-oxo-2,2,6,6-tetramethylpiperidine 1-oxyl free radicals, 4-hydroxy-2,2,6,6-tetramethylpiperidine 1-oxyl free radicals, 4-acetamido-2,2,6,6-tetramethylpiperidine 1-oxyl free radicals, 4-maleimide 2,2,6,6-tetramethylpiperidine 1-oxyl free radicals, and piperidine 1-oxyl free radical compounds of 4-phosphonoxy 2,2,6,6-tetramethylpiperidine 1-oxyl free radicals, or N-nitrosophenylhydroxylamine compounds of N-nitrosophenylhydroxylamine first cerous salt and N-nitrosophenylhydroxylamine aluminum salt are more preferable; and N-nitrosophenylhydroxylamine compounds of N-nitrosophenylhydroxylamine first cerous salt and N-nitrosophenylhydroxylamine aluminum salt are even more preferable.

The preferable added amount of the polymerization inhibitor is preferably 0.01 parts by mass or more to 10 parts by mass or less with respect to 100 parts by mass of the (E) polymerization initiator, more preferably 0.01 parts by mass or more to 8 parts by mass or less, and most preferably 0.05 parts by mass or more to 5 parts by mass or less.

By being set to the ranges described above, the suppression of the curing reaction in the non-image section and the promotion of the curing reaction in the image part are sufficiently carried out, and the image forming property and the sensitivity are good.

[Binder Polymer]

From the point of view of improving the film characteristics and the like, the curable composition for forming the high refractive index layer of the present embodiment preferably further includes a binder polymer.

Examples of the binder polymer include a resin where monomers which have a carboxyl group are polymerized or copolymerized, a resin where monomers which have an acid anhydride are polymerized or copolymerized and where acid anhydride units are hydrolyzed, half esterified, or half amidated, epoxy acrylate where epoxy resin is modified by unsaturated monocarboxylic acid and an acid anhydride, and the like. Examples of a monomer which has a carboxyl group include acryl acid, methacryl acid, itaconic acid, crotonic acid, maleic acid, fumaric acid, 4-carboxylstyrene, and the like, and examples of a monomer which has an acid anhydride include maleic anhydride, and the like.

In addition, in the same manner, there are acid cellulose derivatives which have a carboxylic acid group in the side chain. Other than the above, acid cellulose derivatives where a cyclic acid anhydride is added to the polymer which has a hydroxyl group, and the like are effective.

In a case of using a copolymer as a binder polymer, it is possible to use other monomers than the monomers described above as a compound which is copolymerized. Examples of other monomers include the compounds (1) to (12) described below.

(1) Acrylic acid esters and methacrylic acid esters which have an aliphatic hydroxyl group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, -2-chloroethyl acrylate, glycidyl acrylate, 3,4-epoxy cyclohexyl methyl acrylate, vinyl acrylate, 2-phenyl vinyl acrylate, 1-propenyl acrylate, allyl acrylate, 2-allyloxyethyl acrylate, and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethyl hexyl methacrylate, cyclohexyl methacrylate, benzyl methacrylate, -2-chloroethyl methacrylate, glycidyl methacrylate, 3,4-epoxy cyclohexyl methyl methacrylate, vinyl methacrylate, 2-phenyl vinyl methacrylate, 1-propenyl methacrylate, allyl methacrylate, 2-allyloxyethyl methacrylate, and propargyl methacrylate.

(4) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl-acrylamide, vinyl acrylamide, vinyl methacrylamide, N,N-diallyl acrylamide, N,N-diallyl methacrylamide, allyl acrylamide, and allyl methacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methyl styrene, methyl styrene, chloromethyl styrene, and p-acetoxy styrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-vinylpyrrolidone, acrylonitrile, methacrylonitrile, and the like.

(11) Unsaturated imides such as maleimide, N-acryloyl acrylamide, N-acetyl methacrylamide, N-propionyl methacrylamide, and N-(p-chlorobenzoyl)methacrylamide.

(12) Methacrylic acid-based monomers where a hetero atom is bonded at the α position. Examples thereof include the compounds as described in each of the official gazettes such as JP2002-309057A and JP2002-311569A.

In the binder polymer, it is also preferable to include a repeating unit which is formed by polymerizing, monomer components where the compound which is represented by the following general formula (ED) (also referred to below as 'ether dimer') is essential.

[Chem. 35]

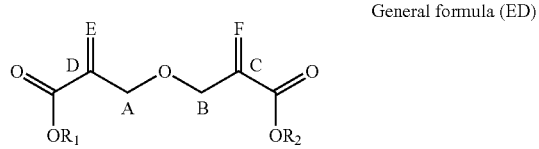

General formula (ED)

(In the formula (ED), $R_1$ and $R_2$ each independently represent a hydrocarbon group which may have a hydrogen atom or, a substituent group and which has 1 to 25 carbon atoms.)

Due to this, the curable composition for forming the high refractive index layer of the present embodiment may form a cured coating film which has extremely excellent transparency along with heat resistance. In the general formula (ED) which indicates the ether dimer, the hydrocarbon group which may have a substituent group which is represented by $R_1$ and $R_2$ and which has 1 to 25 carbon atoms is not particularly limited; however, examples thereof include a linear or branched alkyl group such as methyl, ethyl, n-propyl, isopropyl, n-butyl, isobutyl, t-butyl, t-amyl, stearyl, lauryl, and 2-ethylhexyl; an aryl group such as phenyl; an alicyclic group such as cyclohexyl, t-butylcyclohexyl, dicyclopentadienyl, tricyclodecanyl, isobornyl, adamantyl, and 2-methyl-2-adamantyl; an alkyl group which is substituted with alkoxy such as 1-methoxyethyl and 1-ethoxyethyl; an alkyl group which is substituted with an aryl group such as benzyl; and the like. Among these, a primary or secondary carbon substituent group such as methyl, ethyl, cyclohexyl, and benzyl where leaving due to acid or heat does not easily occur is particularly preferable from the point of the heat resistance.

Specific examples of the ether dimer include dimethyl 2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methyl ene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butyl cyclohexyl)-2,2'-[oxybis(methylene)]bis-2-propenoate, di(di-cyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methyl ene)]bis-2-propenoate, di(2-methyl-2-adamantyl)-2,2'-[oxybis(methylene)]bis-2-propenoate, and the like. Among these, in particular, dimethyl 2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferable. Only one type of these ether dimers may be used, or two or more types may be used. In addition, the structure body derived from the compound which is represented in the general formula (ED) may copolymerize other monomers.

Examples of other monomers which may copolymerize with the ether dimer include a monomer for introducing an acid group, a monomer for introducing a radical polymerizable double bond, a monomer for introducing an epoxy group, and other copolymerizable monomers than these. Only one type of these monomers may be used, or two or more types may be used.

Examples of a monomer for introducing an acid group include a monomer which has a carboxyl group such as (meth)acrylic acid or itaconic acid, a monomer which has a phenolic hydroxyl group such as N-hydroxyphenylmaleimide, a monomer which has a carboxylic acid anhydride group such as maleic anhydride or itaconic acid anhydride, and the like. Among these, (meth)acrylic acid is particularly preferable.

In addition, a monomer for introducing an acid group may be a monomer which may add an acid group after the polymerization, and examples thereof include a monomer which has a hydroxyl group such as 2-hydroxyethyl(meth)acrylate, a monomer which has an epoxy group such as glycidyl(meth)acrylate, a monomer which has an isocyanate group such as 2-isocyanate ethyl(meth)acrylate, and the like. In a case of using a monomer for introducing a radical polymerizable double bond or a case of using a monomer which may add an acid group after the polymerization, it is necessary to carry out the treatment which adds the acid group after the polymerization. The treatment which adds an acid group after the polymerization varies according to the type of the monomer, and examples thereof include the following treatments. In a case of using a monomer which has a hydroxyl group, examples include a treatment which adds an acid anhydride such as succinic acid anhydride, tetrahydrophthalic acid anhydride, or maleic anhydride. In a case of using a monomer which has an epoxy group, examples include a treatment which adds an acid anhydride such as succinic acid anhydride, tetrahydrophthalic acid anhydride, or maleic anhydride to a hydroxyl group which was produced after adding a compound which has an amino group and an acid group such as N-methylaminobenzoic acid or N-methylaminophenol or adding an acid such as (meth)acrylic acid. In a case of using a monomer which has an isocyanate group, examples include a treatment which adds a compound which has a hydroxyl group and an acid group such as 2-hydroxybutyric acid.

In a case where the polymer formed by polymerizing monomer components which include compounds which are represented by the general formula (ED) includes a monomer for introducing an acid group, the content ratio is not particularly limited; however, 5 to 70 mass % of the total monomer component is preferable, and 10 to 60 mass % is more preferable.

Examples of a monomer for introducing a radical polymerizable double bond include a monomer which has a carboxyl group such as (meth)acrylic acid or itaconic acid; a monomer which has a carboxylic acid anhydride group such as maleic anhydride or itaconic acid anhydride; a monomer which has an epoxy group such as glycidyl(meth) acrylate, 3,4-epoxycyclohexylmethyl(meth)acrylate, or o-(or m-, or p-)vinylbenzylglycidylether; and the like. In a case of using a monomer for introducing a radical polymerizable double bond, it is necessary to carry out a treatment for adding a radical polymerizable double bond after the polymerization. The treatment for adding the radical polymerizable double bond after the polymerization varies according to the type of the monomer which may add the radical polymerizable double bond which is used, and examples thereof include the following treatments. In a case of using a monomer which has a carboxyl group such as (meth) acrylic acid or itaconic acid, examples include a treatment which adds a compound which has an epoxy group such as glycidyl(meth)acrylate, 3,4-epoxycyclohexylmethyl(meth) acrylate, and o- (or m-, or p-)vinylbenzylglycidylether and a radical polymerizable double bond. In a case of using a monomer which has a carboxylic acid anhydride such as maleic anhydride or itaconic acid anhydride, examples include a treatment which adds a compound which has a hydroxyl group such as 2-hydroxyethyl(meth)acrylate and a radical polymerizable double bond. In a case of using a monomer which has an epoxy group such as glycidyl(meth) acrylate, 3,4-epoxycyclohexylmethyl(meth)acrylate and o- (or m-, or p-)vinylbenzylglycidylether, examples include a treatment which adds a compound which has an acid group such as (meth)acrylic acid and a radical polymerizable double bond.

In a case where the polymer formed by polymerizing monomer components which include compounds which are represented by the general formula (ED) includes a monomer for introducing a radical polymerizable double bond, the content ratio is not particularly limited; however, 5 to 70 mass % of the total monomer component is preferable, and 10 to 60 mass % is more preferable.

Examples of a monomer for introducing an epoxy group include glycidyl(meth)acrylate, 3,4-epoxycyclohexylmethyl (meth)acrylate, o-(or m-, or p-)vinylbenzylglycidylether, and the like.

In a case where the polymer formed by polymerizing monomer components which include compounds which are represented by the general formula (ED) includes a monomer for introducing an epoxy group, the content ratio is not particularly limited; however, 5 to 70 mass % of the total monomer component is preferable, and 10 to 60 mass % is more preferable.

Examples of other monomers which are possible to copolymerize include (meth)acrylate esters such as methyl(meth) acrylate, ethyl(meth)acrylate, n-propyl(meth)acrylate, isopropyl(meth)acrylate, n-butyl(meth)acrylate, isobutyl(meth) acrylate, t-butyl(meth)acrylate, methyl 2-ethylhexyl(meth) acrylate, cyclohexyl(meth)acrylate, benzyl(meth)acrylate, and 2-hydroxyethyl(meth)acrylate; aromatic vinyl compounds such as styrene, vinyl toluene, and α-methyl styrene; N-substituted maleimides such as N-phenyl maleimide, and N-cyclohexyl maleimide; butadiene or substituted butadiene compounds such as butadiene, and isoprene; ethylene or substituted ethylene compounds such as ethylene, propylene, vinyl chloride, and acrylonitrile; vinyl esters such as vinyl acetate; and the like. Among these, methyl(meth) acrylate, cyclohexyl(meth)acrylate, benzyl(meth)acrylate, and styrene are preferable from the point of view that the transparency is good and it is difficult to impair the heat resistance.

In a case where the polymer formed by polymerizing monomer components which include compounds which are represented by the general formula (ED) includes other copolymerizable monomers, the content ratio is not particularly limited; however, 95 mass % or less is preferable, and 85 mass % or less is more preferable.

The weight average molecular weight of the polymer formed by polymerizing monomer components which include compounds which are represented by the general formula (ED) is not particularly limited; however, from the point of view of the viscosity of the colorrf radiation sensitive composition and the heat resistance of the coating film which is formed by the composition, 2,000 to 200,000 is preferable, 5,000 to 100,000 is more preferable, and 5,000 to 20,000 is even more preferable.

In addition, in a case where the polymer formed by polymerizing monomer components which include compounds which are represented by the general formula (ED) has an acid group, the acid value is preferably 30 to 500 mgKOH/g, and more preferably 50 to 400 mgKOH/g.

It is possible to easily obtain the polymer formed by polymerizing monomer components, which include compounds which are represented by the general formula (ED), by polymerizing at least the monomer where an ether dimer is essential. At this time, the cyclization reaction of the ether dimer proceeds at the same time as the polymerization, and a tetrahydropyran ring structure is formed.

The polymerization method which is applied to the synthesis of the polymer formed by polymerizing monomer components which include compounds which are represented by the general formula (ED) is not particularly limited and it is possible to use various types of polymerization methods which are known in the related art; however, a solution polymerization method is particularly preferable. Specifically, for example, it is possible to synthesize the polymer formed by polymerizing monomer components which include compounds which are represented by the general formula (ED) based on the synthesis method of the polymer (a) as described in JP2004-300204A.

Example compounds of the polymer formed by polymerizing monomer components which include compounds which are represented by the general formula (ED) will be shown below, however the present invention is not limited thereto. The composition ratio of the example compounds shown below is in mol %.

[Chem. 36]

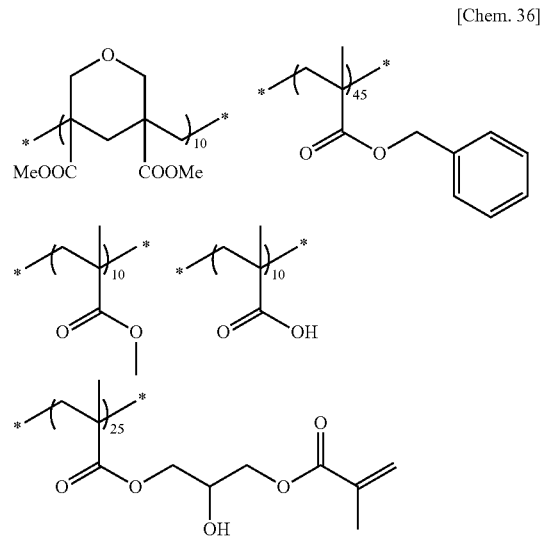

Mw = 12000

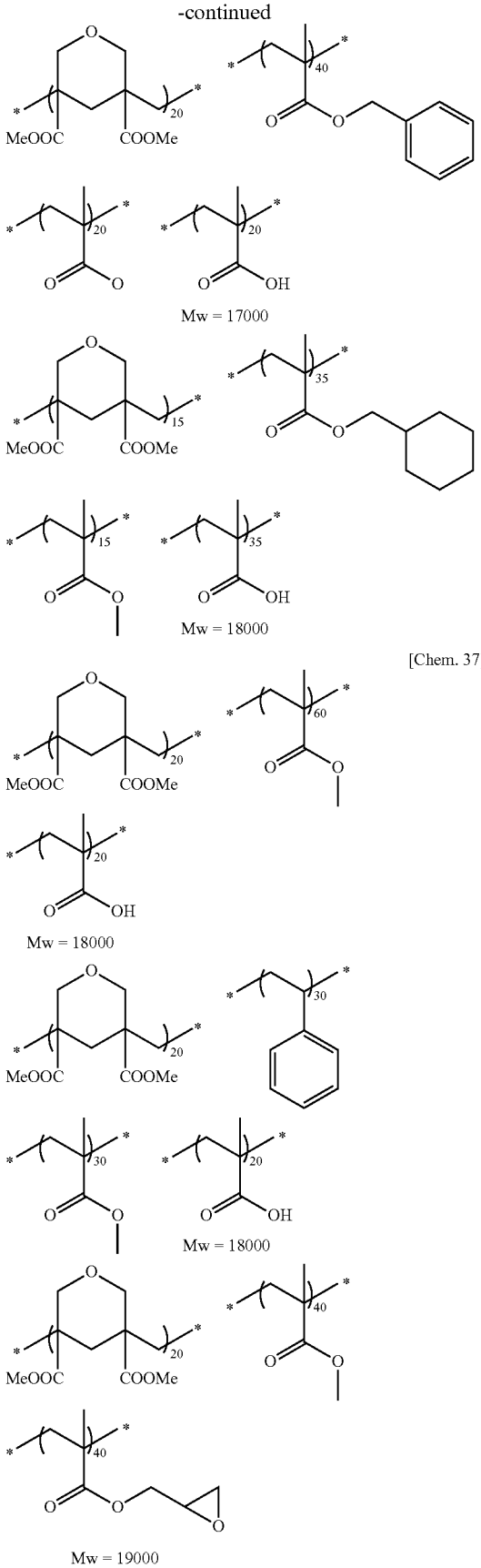

[Chem. 37]

Particularly, in the present invention, a polymer which is obtained by copolymerizing dimethyl-2,2"-[oxybis(methylene)]bis-2-propenoate (referred to below as "DM"), benzyl methacrylate (referred to below as "BzMA"), methyl methacrylate (referred to below as "MMA"), methacrylic acid (referred to below as "MAA"), and glycidyl methacrylate (referred to below as "GMA") is preferable. In particular, it is preferable that the molar ratio of DM:BzMA:MMA:MAA:GMA be 5 to 15:40 to 50:5 to 15:5 to 15:20 to 30. It is preferable that 95 mass % or more of the components which configure the copolymer which is used in the present invention be these components. In addition, it is preferable that the weight average molecular weight of the polymer be 9,000 to 20,000.

The weight average molecular weight (the polystyrene equivalent value measured by GPC method) of the polymer which is used in the present invention is preferably 1,000 to $2\times10^5$, more preferably 2,000 to $1\times10^5$, and even more preferably 5,000 to $5\times10^4$.

Among these, a (meth)acryl resin which has an allyl group or vinyl ester group in the side chain and a carboxyl group, and an alkali soluble resin which has a double bond in the side chain as described in JP2000-187322A and JP2002-62698A, or an alkali soluble resin which has an amide group in the side chain as described in W2001-242612A have an excellent balance between the film strength, sensitivity, and developing property, which is favorable. Examples of the polymers described above include Dianar NR series (manufactured by Mitsubishi Rayon Co., Ltd.), Photomer 6173 (COOH containing polyurethane acrylic oligomer manufactured by Diamond Shamrock Co., Ltd.), Viscoat R-264 and KS Resist 106 (both manufactured by Osaka Organic Chemical Industry Ltd.), Cyclomer P series such as Cyclomer P ACA230AA, and Placcel CF200 series (all manufactured by Daicel Chemical Industry Ltd.), Ebecryl 3800 (manufactured by Daicel-UCB Co., Ltd.), and the like.

In addition, a urethane binder polymer which contains the acid groups as described in JP1995-12004B (JP-H7-12004B), JP1995-120041B (JP-H7-120041B), JP1995-120042B (JP-H7-120042B), JP1996-12424B (JP-H8-12424B), JP1988-287944A (JP-S63-287944A), JP1988-287947A (JP-S63-287947A), JP1989-271741A (JP-H1-271741A), and the like, or a urethane binder polymer which has the acid groups as described in JP2002-107918A and a double bond in the side chain has extremely excellent strength, which is advantageous from the point of the film strength.

In addition, an acetal modified polyvinyl alcohol binder polymer which has the acid groups as described in EP993966B, EP1204000B, JP2001-318463A, and the like has excellent film strength, which is favorable.

Furthermore, as water-soluble linear organic polymers other than these, polyvinylpyrrolidone, polyethylene oxide, and the like are useful. In addition, in order to increase the strength of the cured film, alcohol-soluble nylon, polyethers of 2,2-bis-(4-hydroxyphenyl)-propane and epichlorohydrin, or the like are also useful.

The weight average molecular weight of the binder polymer (the polystyrene equivalent value measured by GPC method) which may be used in the curable composition of the present embodiment is preferably 5,000 or more, more preferably in a range of 10,000 or more to 300,000 or less, and the number-average molecular weight is preferably 1,000 or more, more preferably in a range of 2,000 or more to 250,000 or less. The polydispersity (the weight average molecular weight/the number-average molecular weight) is preferably 1 or more, more preferably in a range of 1.1 or more to 10 or less.

These binder polymers may be any of a random polymer, a block polymer, a graft polymer, and the like.

It is possible to synthesize the binder polymer by methods which are known in the related art. Examples of solvents which are used when synthesizing include tetrahydrofuran, ethylene dichloride, cyclohexanone, methyl ethyl ketone, acetone, methanol, ethanol, ethylene glycol monomethyl ether, ethylene glycol mono ethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, water, and the like. These solvents are used alone or in a mixture of two or more types.

Examples of a radical polymerization initiator which is used when synthesizing a binder polymer which may be used in the curable composition for forming the high refractive index layer of the present embodiment include known compounds such as an azo initiator and a peroxide initiator.

In the curable composition for forming the high refractive index layer of the present embodiment, it is possible to use one type alone or two or more types of the binder polymer in combination.

The curable composition for forming the high refractive index layer of the present embodiment may or may not contain a binder polymer; however, where contained, the content of the binder polymer with respect to the total solid content of the curable composition is preferably 1 mass % or more to 40 mass % or less, more preferably 3 mass % or more to 30 mass % or less, and even more preferably 4 mass % or more to 20 mass % or less.

[Surfactant]

From the point of view of further improving the coating property, various types of surfactants may be added to the curable composition of the present embodiment. As a surfactant, it is possible to use various types of surfactants such as a fluorine-based surfactant, a non-ionic surfactant, a cationic surfactant, an anionic surfactant and a silicone-based surfactant. Specifically, it is possible to use the same surfactants as the surfactants in the 'resin composition for forming the optically transparent cured film' listed above.

In particular, since the liquid characteristics (in particular, the fluidity) of the curable composition for forming the high refractive index layer of the present embodiment are further improved by a fluorine-based surfactant being contained therein when prepared as a coating liquid, it is possible to further improve the uniformity of the coating thickness or the liquid saving property.

That is, in a case where a film is formed using a coating liquid where a photosensitive transparent composition which contains a fluorine-based surfactant is applied, the wettability for the target coating surface is improved and the coating property to the target coating surface is improved by decreasing interfacial surface tension between the target coating surface and the coating liquid. Due to this, even in a case of forming a thin film of a few μm with a small amount of liquid, the above is effective from the point that it is possible to more favorably form a film which has a uniform thickness with little unevenness.

The content ratio of fluorine in the fluorine-based surfactant is favorably 3 mass % to 40 mass %, more preferably 5 mass % to 30 mass %, and particularly preferably 7 mass % to 25 mass %. The fluorine-based surfactant where the fluorine content ratio is within this range is effective from the point of view of the uniformity of the thickness of the coating film and the liquid saving property, and the solubility in the curable composition is also good.

Only one type of these surfactants may be used, or two or more types may be combined.

The curable composition may or may not contain a surfactant; however, where contained, the added amount of the surfactant with respect to the total mass of the curable composition is preferably 0.001 mass % to 2.0 mass %, and more preferably 0.005 mass % to 1.0 mass %.

[Other Additives]

Furthermore, a known additive such as a plasticizer or a sensitizing agent may be added with respect to the curable composition for forming the high refractive index layer in order to improve the physical properties of the cured film.

Examples of a plasticizer include dioctyl phthalate, didodecyl phthalate, triethylene glycol dicaprylate, dimethyl glycol phthalate, tricresyl phosphate, dioctyl adipate, dibutyl sebacate, tryacetyl glycerol, or the like, in a case where a binder polymer is used, it is possible to add 10 mass % or less of the plasticizer with respect to the total mass of the polymerizable compound and the binder polymer.

[Ultraviolet Absorbing Agent]

The curable composition for forming the high refractive index layer of the present embodiment may contain an ultraviolet absorbing agent. As the ultraviolet absorbing agent, a compound which is a conjugated diene-based compound and which is represented by the following general formula (1) is particularly preferable.

[Chem. 38]

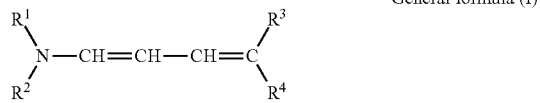

General formula (I)

In the general formula (I), $R^1$ and $R^2$ each independently represent a hydrogen atom, an alkyl group which has 1 to 20 carbon atoms, or an aryl group which has 6 to 20 carbon atoms, and $R^1$ and $R^2$ may be the same as or different from each other; however, $R^1$ and $R^2$ do not represent hydrogen atoms at the same time.

In the general formula (I), $R^3$ and $R^4$ represent an electron attracting group. Here, the electron withdrawing group is an electron withdrawing group where Hammett's substituent constant σp value (referred to below as 'σp value') is 0.20 or more to 1.0 or less. An electron withdrawing group where the σp value is 0.30 or more to 0.8 or less is preferable.

Hammett's rule is a rule of thumb which was proposed by L. P. Hammett in 1935 in order to quantitatively discuss the influence of a substituent group which affects the reaction or equilibrium of a benzene derivative, and the validity thereof is widely accepted. The substituent constants which were calculated using Hammett's rule are the σp value and σm value, and these values are described in many general books; however, detailed description is given in "Lange's Hand book of Chemistry" ed. J. A. Dean, 12th Ed., 1979 (Mc Graw-Hill), 'Journal of Japanese Chemistry', 122, pp. 96-103, 1979 (Nankodo), and "Chemical Reviews", Vol. 91, pp. 165-195, 1991. The present invention is not only limited to substituent groups which have the values known in the literature and described in these books, and even if the values are not known in the literature, the substituent group is undoubtedly included as long as the values are included within the ranges above in a case of measuring based on Hammett's rule.

Specific examples of an electron withdrawing group where the σp value is 0.20 or more to 1.0 or less include an acyl group, an acyloxy group, a carbamoyl group, an alkyloxy carbonyl group, an aryloxy carbonyl group, a cyano group, a nitro group, a dialkylphosphono group, a diarylphosphono group, a diarylphosphinyl group, an alkyl sulfinyl group, an aryl sulfinyl group, an alkylsulfonyl group, an arylsulfonyl group, a sulfonyloxy group, an acylthio group, a sulfamoyl group, a thiocyanate group, a thiocarbonyl group, an alkyl group substituted with at least two halogen atoms, an alkoxy group substituted with at least two halogen atoms, an aryloxy group substituted with at least two halogen atoms, an alkylamino group substituted with at least two halogen atoms, an alkylthio group substituted with at least two halogen atoms, an aryl group substituted with electron withdrawing groups other than groups with an σp value of 0.20 or more, a heterocyclic group, a chlorine atom, a bromine atom, an azo group, or a selenocyanate group. Among these substituent groups, a group which is able to further have a substituent group may further have a substituent group such as the above examples.

Below, preferable specific examples [example compounds (1) to (14)] of a compound which is represented by the general formula (I) will be shown. However, the present invention is not limited thereto.

[Chem. 39]

(1)
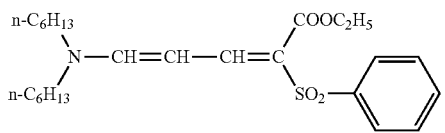

(2)
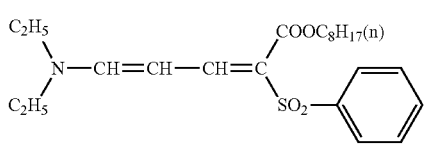

(3)
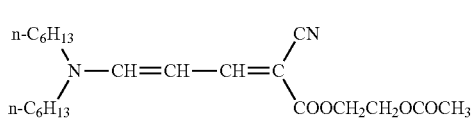

(4)
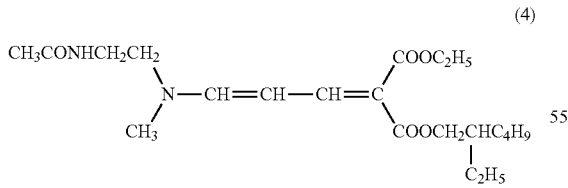

(5)
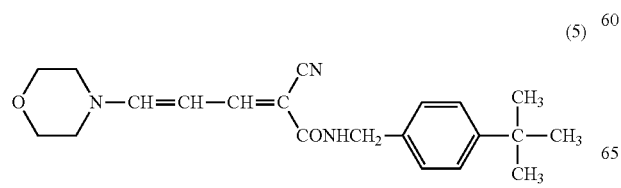

-continued (6)
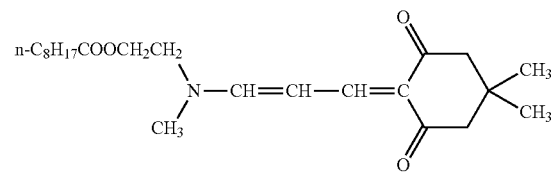

[Chem. 40]

(7)
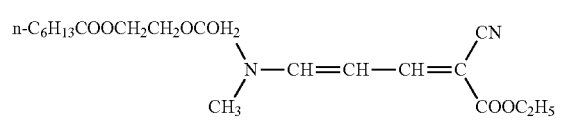

(8)
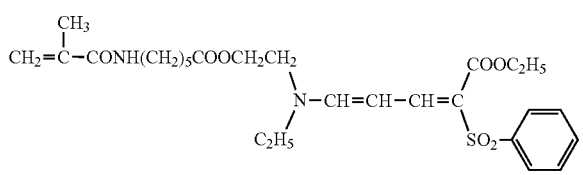

(9)
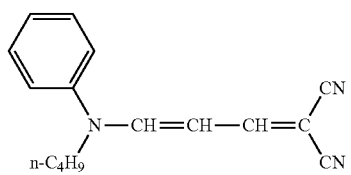

(10)
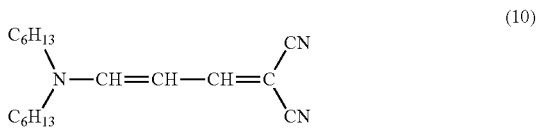

(11)
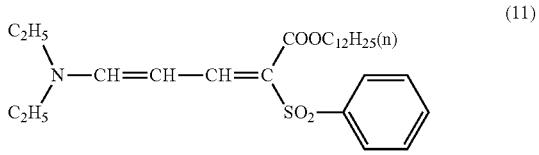

(12)
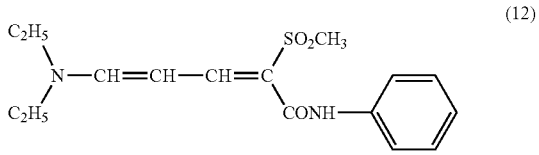

(13)
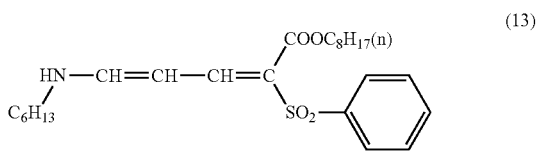

[Chem. 41]

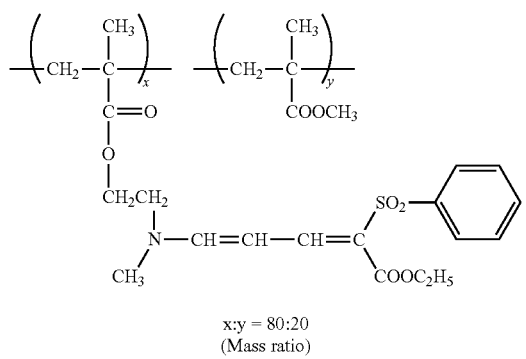

(14)

x:y = 80:20
(Mass ratio)

It is possible to synthesize the ultraviolet absorbing agent which is represented by the general formula (I) by the methods which are described in each of the official gazettes of JP1969-29620B (JP-S44-29620B), JP1978-128333A (JP-S53-128333A), JP1986-169831A (JP-S61-169831A), JP1988-53543A (JP-S63-53543A), JP1988-53544A (JP-S63-53544A), and JP1988-56651A (JP-S63-56651A), and WO2009/123109A. Specifically, it is possible to synthesize the example compound (1) described above by the method which is described in paragraph number 0040 in WO2009/123109A.

The curable composition of the present embodiment may or may not contain an ultraviolet absorbing agent; however, where contained, the content of the ultraviolet absorbing agent with the respect to the total solid content of the composition is preferably 0.1 mass % to 10 mass %, more preferably 0.1 mass % to 5 mass %, and particularly preferably 0.1 mass % to 3 mass %.

In addition, the lower layer (the high refractive index layer) may be the dispersible composition II which is described below.

<Dispersible Composition II>

The dispersible composition (II) indicates a dispersible composition which contains the metal oxide particle (A) where the primary particle diameter is 1 nm to 100 nm, the specific dispersible resin (B), and the solvent (C). Here, other components than the specific dispersible resin (B) are the same as the dispersible composition I.

Specific Dispersible Resin B

As the dispersant for dispersing the high refractive index particles, it is preferable to use an oligoimine based dispersant which includes a nitrogen atom in at least one of the main chain or the side chain. As an oligoimine based dispersant, a dispersible resin (appropriately referred to below as 'specific dispersible resin (B)'), which has a repeating unit which has a partial structure X which has a functional group with a pKa of 14 or less, and a side chain which includes the side chain Y which has 40 to 10,000 atoms, and also has a basic nitrogen atom in at least one of the main chain or the side chain, is preferable. Here, the basic nitrogen atom is not particularly limited as long as the basic nitrogen atom is a nitrogen atom which exhibits basicity.

The specific resin (B) may have a partial structure W which pairs up with the partial structure X or the like, and the partial structure W is preferably a structure section which has a nitrogen atom which is $pK_b14$ or less, more preferably containing a structure which has a nitrogen atom which is $pK_b10$ or less. The basic strength $pK_b$ refers to $pK_b$ in a water temperature of 25° C. and is one index to quantitatively represent the strength of the basic group, and has the same meaning as the basicity constant. The basic strength $pK_b$ and the acid strength $PK_a$ which is described later have a relationship of $pK_b=14-PK_a$ Here, when the partial structure X and the partial structure W form a salt structure in pairs, assuming a structure where the partial structure X and the partial structure W are each dissociated, $PK_a$ and $pK_b$ are evaluated as a compound where a proton ($H^+$) or a hydroxide ion (OH) is ionically bonded to the structure. Further details of the partial structure X will be described later.

The details of the preferable ranges of the partial structure X are the same as those of the partial structure X described later. In addition, in the same manner, the details of the preferable ranges of the side chain Y are also the same as those of the side chain Y described later. The W described above is preferably a structure where the linking section of the side chain Y is dissociated and is an ion bonding site.

An example of the specific dispersible resin (B) is a resin which is represented by the following formula [B],

[Chem. 42]

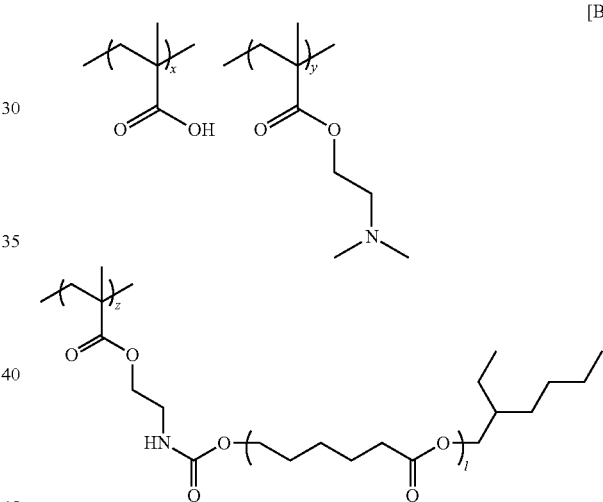

[B]

In the formula, x, y, and z each indicate the polymerization molar ratios of the repeating units, x is preferably 5 to 50, y is preferably 5 to 60, and z is preferably 10 to 90. 1 represents a linking number of the polyester chains and is an integer which is able to form a side chain with 40 to 10,000 atoms, and l is preferably 5 to 100,000, more preferably 20 to 20,000, and even more preferably 40 to 2,000. The repeating unit where the copolymerization ratio is defined in the formula by x is the partial structure X, and the repeating unit where the copolymerization ratio is defined in the formula by z is the partial structure Y It is particularly preferable that the specific dispersible resin (B) be a repeating unit, which has a basic nitrogen atom, which is at least one type which is selected from (i) a poly(lower alkyleneimine) based repeating unit, a polyallylamine based repeating unit, a polydiallylamine based repeating unit, a methaxylenediamine-epichlorohydrin polycondensate based repeating unit and polyvinylamine based repeating unit and be a dispersible resin (appropriately referred to below as 'specific dispersible resin (B1)') which has the repeating unit (i) which has the partial structure X which has a functional group which is bonded to a basic nitrogen atom and with a pKa of 14 or less and a side chain (ii) which includes the side chain Y which has 40 to 10,000 atoms.

The specific dispersible resin (B1) has the repeating unit (i) Due to this, the adsorptive power of the dispersible resin to the particle surface is improved, and it is possible to reduce the interaction among the particles. The poly(lower alkyleneimine) may have a chain form or a net form. Here, a lower alkyleneimine has the meaning of an alkyleneimine which includes an alkylene chain which has 1 to 5 carbon atoms. The repeating unit (i) preferably forms the main chain section in the specific dispersible resin. The number-average molecular weight of the main chain section, that is, the number-average molecular weight of portions excluding the side chain which includes the side chain Y portion from the specific dispersible resin (B1) is preferably 100 to 10,000, more preferably 200 to 5,000, and most preferably 300 to 2,000. It is possible for the number-average molecular weight of the main chain section to be measured using the polystyrene equivalent value according to the GPC method The specific dispersible resin (B1) is preferably a dispersible resin which includes the repeating unit which is represented by the following formula (I-1) and the repeating unit which is represented by the formula (I-2), or the repeating unit which is represented by the formula (I-1) and the repeating unit which is represented by the formula (I-2a).

[Chem. 43]

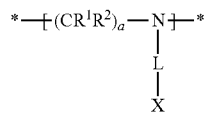
(I-1)

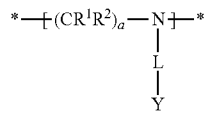
(I-2)

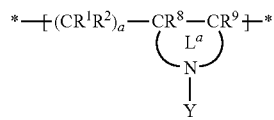
(I-2a)

$R^1$ and $R^2$ each independently represent a hydrogen atom, a halogen atom or an alkyl group (which preferably has 1 to 6 carbon atoms). a each independently represents an integer from 1 to 5. * represents a linking section between the repeating units.

$R^8$ and $R^9$ are the same groups as

L is a single bond, an alkylene group (which preferably has 1 to 6 carbon atoms), an alkenylene group (which preferably has 2 to 6 carbon atoms), an arylene group (which preferably has 6 to 24 carbon atoms), a heteroarylene group (which preferably has 1 to 6 carbon atoms), an imino group (which preferably has 0 to 6 carbon atoms), an ether group, a thioether group, a carbonyl group, or a linking group which is related to a combination thereof. Among these, a single bond or $-CR^5R^6-NR^7-$ (an imino group bonds with X or Y) is preferable. Here, $R^5$ and $R^6$ each independently represent a hydrogen atom, a halogen atom or an alkyl group (which preferably has 1 to 6 carbon atoms). $R^7$ is a hydrogen atom or an alkyl group which has 1 to 6 carbon atoms.

$L^a$ is a structural site which forms a ring structure along with $CR^8CR^9$ and N, and is preferably a structural site which forms a non-aromatic heterocycle which has 3 to 7 carbon atoms along with the carbon atoms of $CR^8CR^9$. A structural site which forms a non-aromatic heterocycle which has 5 to 7 members along with the carbon atoms of $CR^8CR^9$ and N (a nitrogen atom) is more preferable, a structural site which forms a non-aromatic heterocycle which has 5 members is even more preferable, and a structural site which forms pyrrolidine is particularly preferable. Here, the structural site may further have a substituent group such as an alkyl group.

X represents a group which has a functional group with a pKa of 14 or less.

Y represents a side chain which has 40 to 10,000 atoms.

The specific dispersible resin (B1) preferably further has a repeating unit which is represented by the formula (I-3), the formula (I-4), or the formula (I-5) as a copolymer component. It is possible to further improve the dispersibility by the specific dispersible resin (B1) including such a repeating unit.

[Chem. 44]

(I-3)

(I-4)

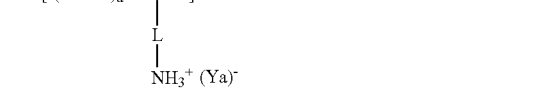

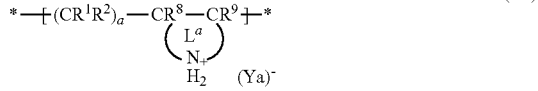
(I-5)

$R^1$, $R^2$, $R^8$, $R^9$, L, La and a have the same meaning as defined in the formulas (I-1), (I-2) and (I-2a).

Ya represents a side chain which has an anion group and which has 40 to 10,000 atoms. It is possible to form the repeating unit which is represented by the formula (I-3) by causing a reaction by adding an oligomer or a polymer, which has a group which forms salt by reacting with amine, to a resin which has a primary or secondary amino group in the main chain section. Ya is preferably the formula (III-2) described later.

In the formula (I-1) to the formula (I-5), $R^1$ and $R^2$ are particularly preferably hydrogen atoms. a is preferably 2 from the point of view of the availability of raw materials.

The specific dispersible resin (B1) may further include a lower alkyleneimine which contains a primary or tertiary amino group as a repeating unit. Here, a group which is indicated by the X, the Y or the Ya may be further bonded to a nitrogen atom in such a lower alkyleneimine repeating unit. A resin which includes both a repeating unit where a group which is indicated by X is bonded and a repeating unit where Y is bonded in such a main chain structure is also encompassed by the specific dispersible resin (B1).

From the point of view of the storage stability and the developing property, 1 to 80 mol % of the repeating unit which is represented by the formula (I-1) is preferably contained in all of the repeating units which are included in the specific dispersible resin (B1), and most preferably 3 to 50 mol % of the repeating unit is contained. From the point of view of the storage stability, 10 to 90 mol % of the repeating unit which is represented by the formula (I-2) is preferably contained in all of the repeating units which are included in the specific dispersible resin (B1), and most preferably 30 to 70 mol % of the repeating unit is contained. From the point of view of the balance between the dispersion stability and the hydrophilicity and the hydrophobicity, the content ratio [(1-1):(1-2)] of the repeating unit (1-1) and the repeating unit (1-2) is preferably in a range of 10:1 to 1:100 in the molar ratio, and more preferably in a range of 1:1 to 1:10. From the point of view of the effect, 0.5 to 20 mol % of the repeating unit which is represented by the formula (I-3) which is used together as desired is preferably contained in all of the repeating units which are included in the specific dispersible resin (B1), and most preferably 1 to 10 mol % of the repeating unit is contained. Here, it is possible to confirm that the polymer chain Ya is ionically bonded using infrared spectroscopy or base titration.

Here, the description regarding the copolymer ratio of the formula (I-2) described above also applies to the repeating units which are represented by the formula (I-2a), formula (I-4), and formula (I-5), and has the meaning of the total amount when both are included.

Partial Structure X

The partial structure X in each of the formulas described above has a functional group where the pKa is 14 or less in a water temperature of 25° C. The definition of 'pKa' here is described in the Chemical Manual (II) (Amendment 4, in 1993, Chemical Society of Japan, Maruzen Co., Ltd.). The structure of 'a functional group of pKa 14 or less' is not particularly limited as long as the physical properties satisfy these conditions, and examples thereof include a known functional group where the pKa satisfies the range described above; however, a functional group where the pKa is 12 or less is preferable, and a functional group where the pKa is 11 or less is particularly preferable. There is no particular lower value; however, −5 or more is realistic. Specific examples of a partial structure X include a carboxylic acid group (pKa: approximately 3 to 5), a sulfonic acid (pKa: approximately −3 to −2), —COCH$_2$CO— (pKa: approximately 8 to 10), —COCH$_2$CN (pKa: approximately 8 to 11), —CONHCO—, a phenol hydroxyl group, —R$_F$CH$_2$OH or —(R$_F$)$_2$CHOH(R$_F$ represents a perfluoroalkylene group or a perfluoroalkyl group pKa: approximately 9 to 11), and a sulfonamide group (pKa: approximately 9 to 11), and a carboxylic acid group (pKa approximately 3 to 5), a sulfonic acid group (pKa: approximately −3 to −2) and —COCH$_2$CO— (pKa: approximately 8 to 10) are particularly preferable.

It is possible to achieve the interaction with the highly refractive particles by the pKa of the functional group which has the partial structure X being 14 or less. The partial structure X is preferably directly bonded to a basic nitrogen atom in the repeating unit which has the basic nitrogen atom. The partial structure X may be linked in an aspect where a salt is formed by an ionic bond in addition to a covalent bond. In particular, the partial structure X preferably has the structure which is represented by the following formula (V-1), formula (V-2), or formula (V-3)

[Chem. 45]

(V-1)

-continued

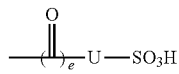

(V-2)

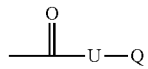

(V-3)

U represents a single bond or a divalent linking group.
d and e each independently represent 0 or 1.
Q represents an acyl group or an alkoxycarbonyl group.
Examples of a divalent linking group which is represented by U include an alkylene (more specifically, for example, —CH$_2$—, CH$_2$CH$_2$—, CH$_2$CHMe-(Me is a methyl group), —(CH$_2$)$_5$—, CH$_2$CH(n-C$_{10}$H$_{21}$)—, and the like), an alkylene which has oxygen (more specifically, for example, —CH$_2$OCH$_2$—, —CH$_2$CH$_2$OCH$_2$CH$_2$—, and the like), an arylene group (for example, phenylene, tolylene, biphenylene, naphthylene, furanylene, pyrrolylene, and the like) and an alkyleneoxy (for example, ethyleneoxy, propyleneoxy, phenyleneoxy, and the like); however, an alkylene group which has 1 to 30 carbon atoms or an arylene group which has 6 to 20 carbon atoms are particularly preferable, and an alkylene which has 1 to 20 carbon atoms or an arylene group which has 6 to 15 carbon atoms are most preferable.

In addition, from the point of view of productivity, d is preferably 1, and e is preferably 0.

Q represents an acyl group or an alkoxycarbonyl group. The acyl group in Q is preferably an acyl group which has 1 to 30 carbon atoms (for example, formyl, acetyl, n-propanoyl, benzoyl, and the like), and particularly preferably acetyl. As the alkoxycarbonyl group in Q, Q is particularly preferably an acyl group, and from the point of view of the ease of manufacturing and the availability of the raw materials (X$^a$ which is a precursor of X), an acetyl group is preferable.

The partial structure X is preferably bonded to the basic nitrogen atoms in the repeating unit which has basic nitrogen atoms. Due to this, the dispersibility and the dispersion stability of the titanium dioxide particles are rapidly improved. It is considered that the partial structure X contributes the dispersion stability by also having a solvent solubility and suppressing the eduction of the resin at the passing of time. Furthermore, the partial structure X includes a functional group which is pKa14 or less, and therefore also functions as an alkali soluble group. It is considered that due to this, the developing property is improved and that it is possible to satisfy all of the dispersibility, the dispersion stability, and the developing property.

The content of a functional group with pKa14 or less in the partial structure X is not particularly limited; however, with respect to 1 g of the specific dispersible resin (B1), 0.01 to 5 mmol is preferable, and 0.05 to 1 mmol is particularly preferable. In addition, it is preferable from the point of view of the developing property that an amount where the acid value of the specific dispersible resin (B1) is approximately 5 mgKOH/g to 50 mgKOH/g be included from the point of view of the acid value.

Side Chain Y

Examples of Y include a known polymer chain such as polyester, polyamide, polyimide and poly(meth)acrylic acid ester which are able to link with the main chain section of the specific dispersible resin (B1). The bond site with the specific dispersible resin (B1) in Y is preferably the terminal of the side chain Y.

Y is preferably bonded to the nitrogen atom in at least one type of the repeating unit which has basic nitrogen atom which is selected from a poly(lower alkyleneimine) based repeating unit, a polyallylamine based repeating unit, a polydiallylamine based repeating unit, a metaxylenediamine-epichlorohydrin polycondensate based repeating unit, and a polyvinylamine based repeating unit. The bonding mode between the main chain section of a repeating unit which has at least one type of nitrogen atom which is selected from a poly(lower alkyleneimine) based repeating unit, a polyarylamine based repeating unit, a polydiarylamine based repeating unit, a metaxylenediamine-epichlorohydrin polycondensate based repeating unit, and a polyvinylamine based repeating unit, and Y is a covalent bond, an ionic bond, or a mixture of a covalent bond and an ionic bond. The ratio of the bonding mode between Y and the main chain section is the covalent bond:the ionic bond=100:0 to 0:100; however, 95:5 to 5:95 is preferable, and 90:10 to 10:90 is particularly preferable.

Y is preferably amide-bonded to the nitrogen atom in the repeating unit which has the basic nitrogen atom, or ionically bonded as a carboxylic acid salt.

From the point of view of the dispersibility, the dispersion stability and the developing property, the number of atoms of the side chain Y is preferably 50 to 5,000, and more preferably 60 to 3,000.

In addition, it is possible to measure the number-average molecular weight of Y using the polystyrene equivalent value according to the GPC method. Here, it is practical to measure the molecular weight in a state before Y is combined into the resin. The number-average molecular weight of Y is particularly preferably 1,000 to 50,000, and most preferably 1,000 to 30,000 from the point of view of the dispersibility, the dispersion stability and the developing property. It is possible to specify the molecular weight of Y from the polymer compound which is a raw material for Y, and the measuring method thereof is based on the measuring conditions according to the GPC described later.

Regarding the side chain structure which is shown in Y, 2 or more in one molecule of the resin are preferably linked with respect to the main chain linking chain, and particularly preferably 5 or more are linked.

In particular, Y is preferably has a structure which is represented by the formula (III-1).

[Chem. 46]

(III-1)

In the formula (III-1), Z is a polymer or an oligomer which has a polyester chain as a partial structure, and represents a residue where a carboxyl group is removed from the polyester which has a free carboxylic acid which is represented by HO—CO—Z. In a case where the specific dispersible resin (B1) contains a repeating unit which is represented by the formula (I-3) to (I-5), Ya is preferably the formula (III-2).

[Chem. 47]

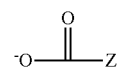

(III-2)

In the formula (III-2), Z has the same meaning as Z in the formula (III-1). Regarding the partial structure Y described above, it is possible to obtain a polyester which has a carboxyl group in one terminal by polycondensation of carboxylic acid and lactone, polycondensation of carboxylic acid containing hydroxy groups, polycondensation of a divalent alcohol and a divalent carboxylic acid (or cyclic acid anhydride), and the like.

Z is preferably $-(L^B)_{nB}-Z^B$.

$Z^B$ represents a hydrogen atom or a monovalent organic group. When $Z^B$ is an organic group, an alkyl group (which preferably has 1 to 30 carbon atoms), an aryl group, a heterocyclic group, or the like is preferable. $Z^B$ may further have a substituent group, and examples of the substituent group include an aryl group which has 6 to 24 carbon atoms and a heterocyclic group which has 3 to 24 carbon atoms.

$Z^B$ is an alkylene group (which preferably has 1 to 6 carbon atoms), an alkenylene group (which preferably has 2 to 6 carbon atoms), an arylene group (which preferably has 6 to 24 carbon atoms), a heteroarylene group (which preferably has 1 to 6 carbon atoms), an imino group (which preferably has 0 to 6 carbon atoms), an ether group, a thioether group, a carbonyl group, or a linking group relating to a combination thereof. Among these, an alkylene group (which preferably has 1 to 6 carbon atoms), an ether group, a carbonyl group, or a linking group relating to a combination thereof is preferable. The alkylene group may be branched or linear. The alkylene group may have a substituent group, and preferable substituent groups are an alkyl group (which preferably has 1 to 6 carbon atoms), an acyl group (which preferably has 2 to 6 carbon atoms), an alkoxy group (which preferably has 1 to 6 carbon atoms), or an alkoxycarbonyl group (which preferably has 2 to 8 carbon atoms). nB is an integer from 5 to 100,000 nB of $L^B$s may each have a different structure.

The specific aspect of the specific dispersible resin (B) will be shown below by the specific structures of the repeating units of the resin and combinations thereof; however, the present invention is not limited thereto. In the following formulas, k, l, m and n each represent the polymerization molar ratio of the repeating unit, and k is 1 to 80, l is 10 to 90, m is 0 to 80, and n is 0 to 70, and k+l+m+n=100. When defined by k, l, and m, k+l+m=100, and when defined by k and l only, k+l=100. p and q indicate the number of links of the polyester chains, and each independently represents 5 to 100,000.1e represents a hydrogen atom or an alkoxycarbonyl group.

[Chem. 48]

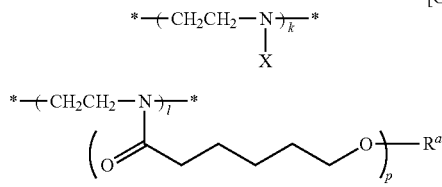

-continued
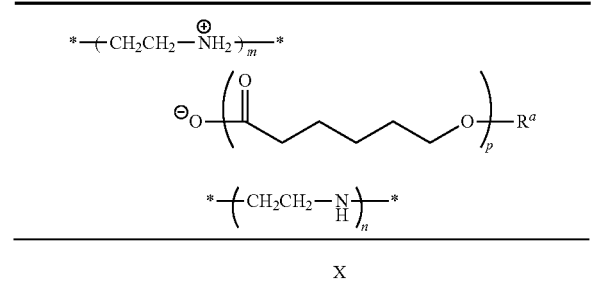
| X |
|---|
| (A-1) | 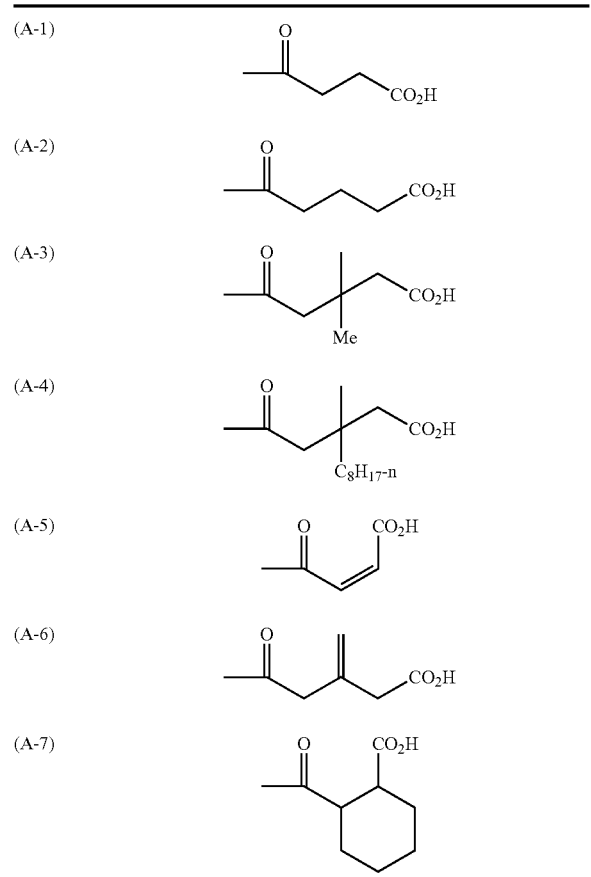 |
| (A-2) | |
| (A-3) | |
| (A-4) | |
| (A-5) | |
| (A-6) | |
| (A-7) | |
| (A-8) | |
| (A-9) | |
| (A-10) | 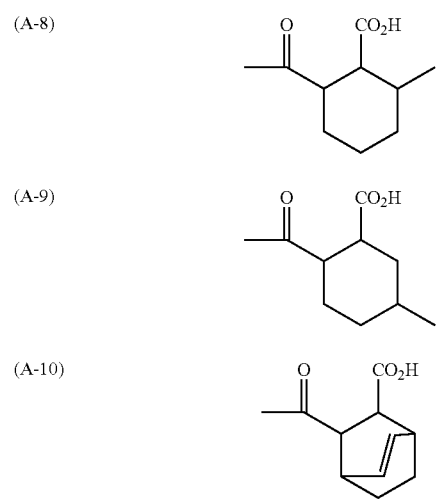 |
-continued
| (A-11) | 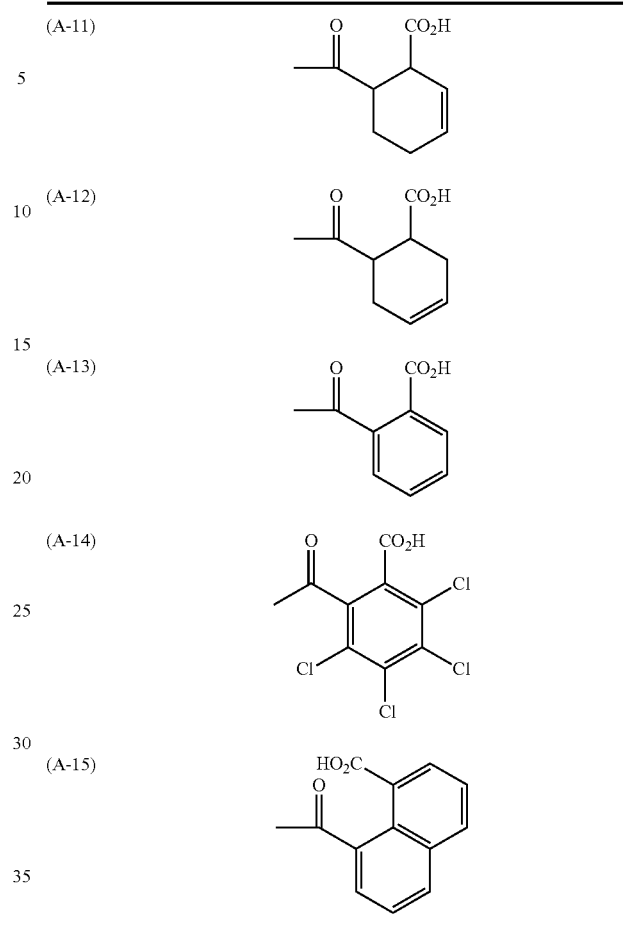 |
| (A-12) | |
| (A-13) | |
| (A-14) | |
| (A-15) | |
[Chem. 49]
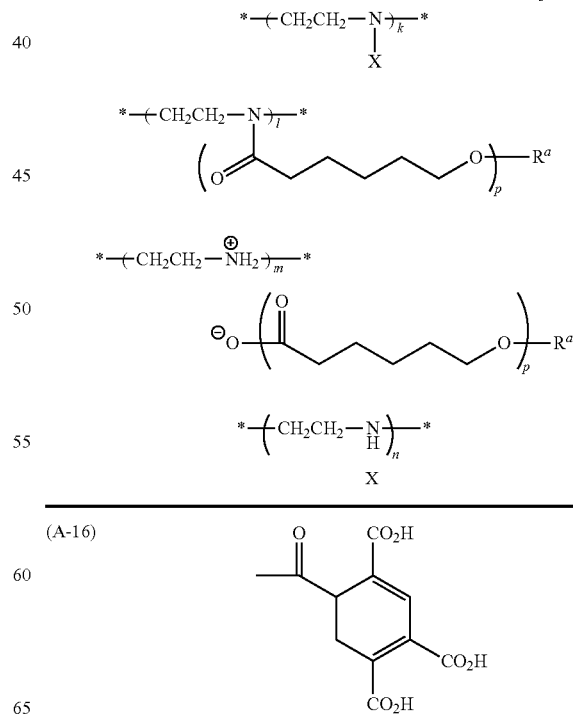
| (A-16) | |

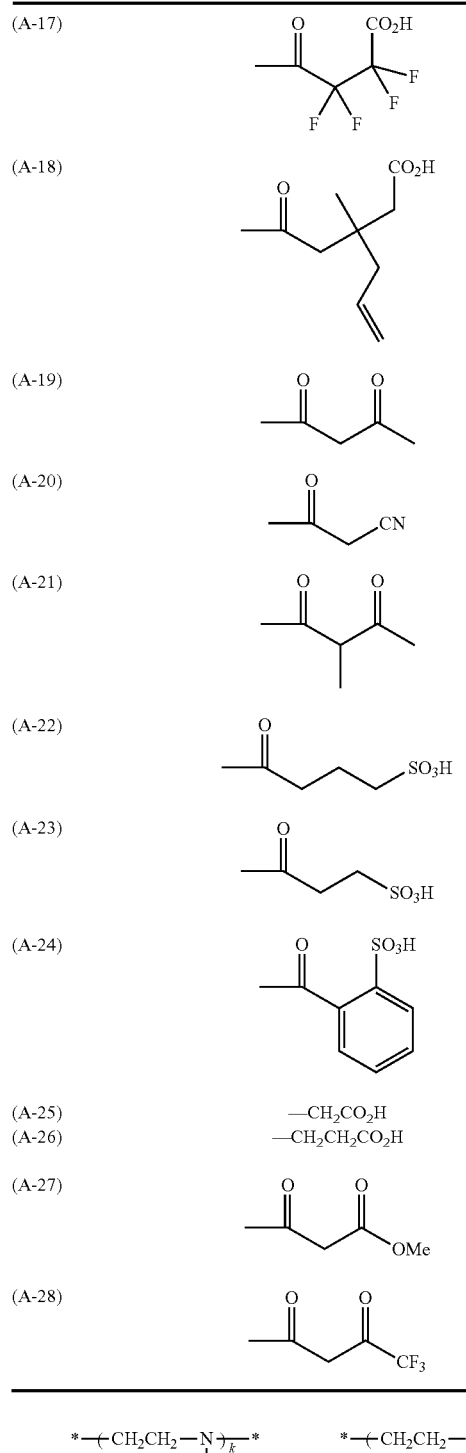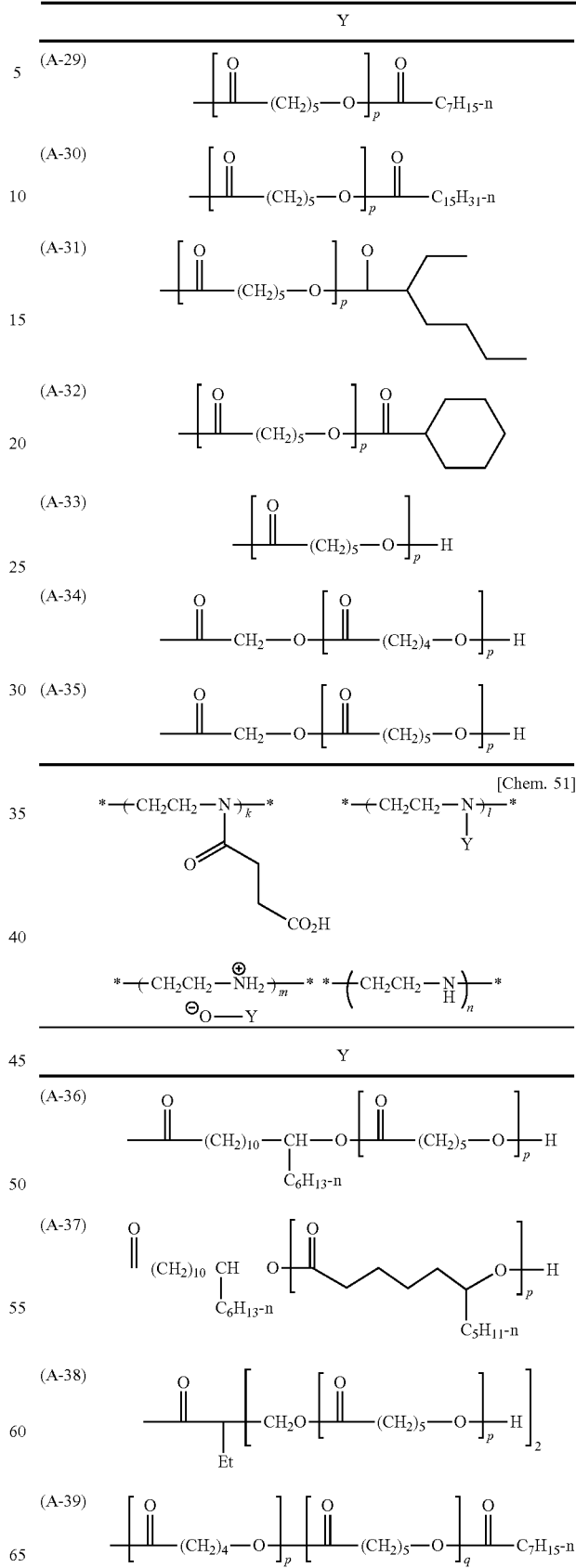

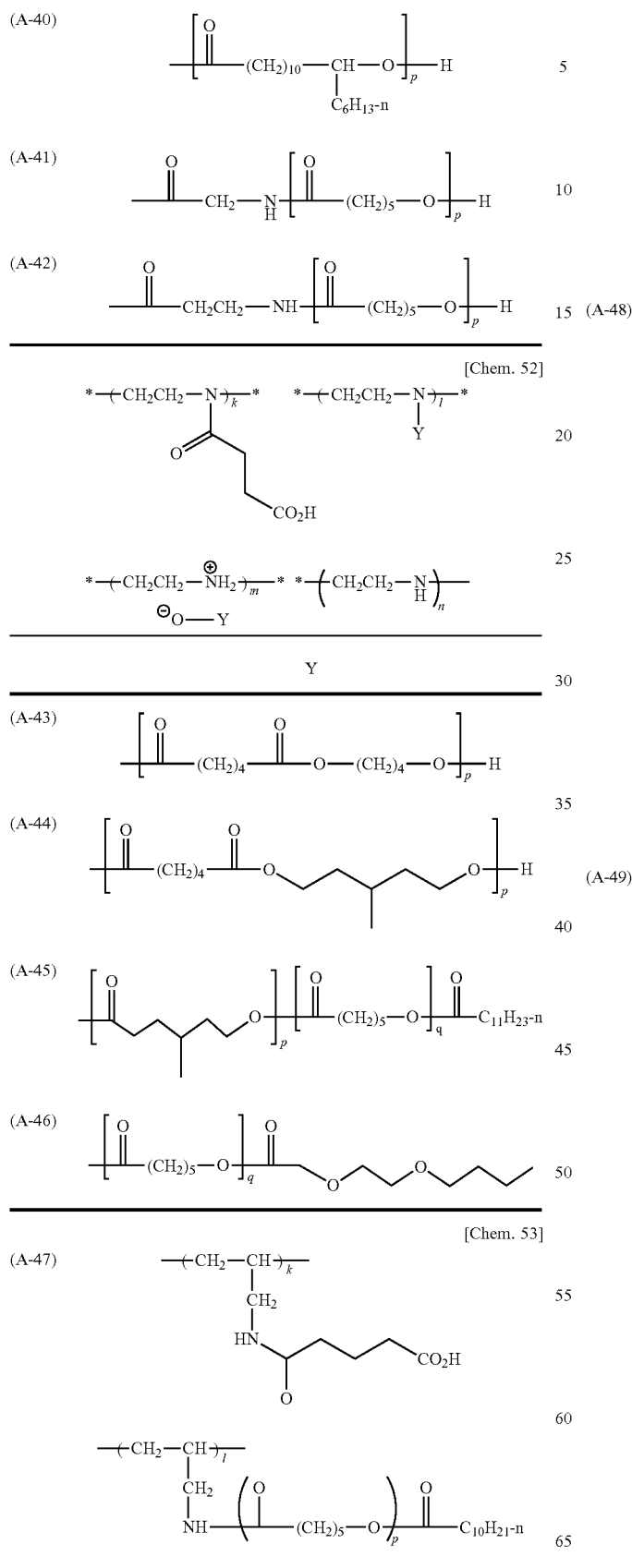
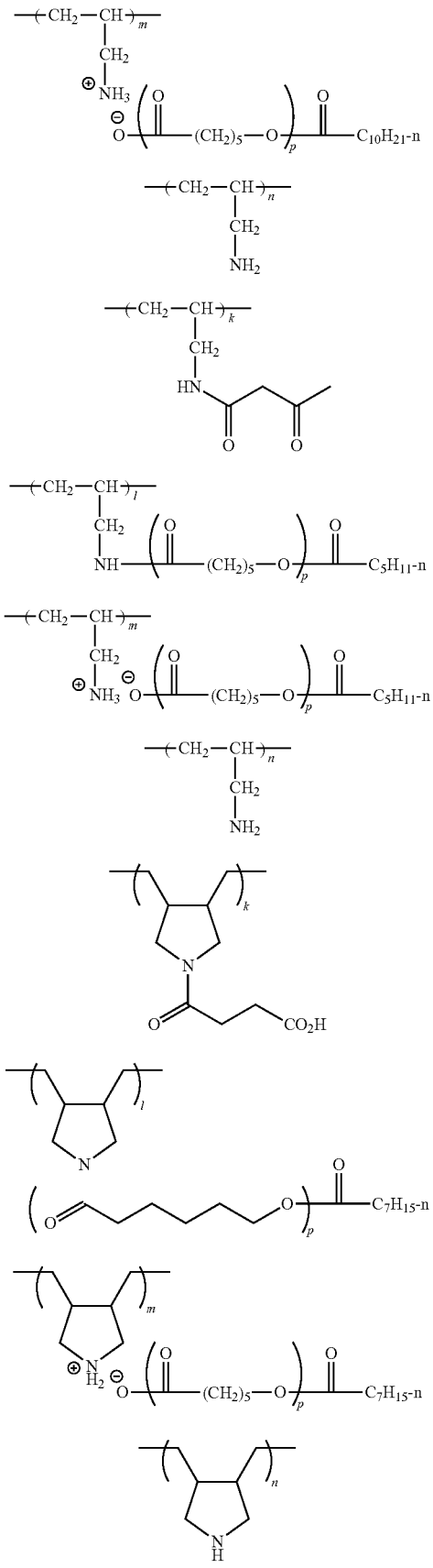

[Chem. 54]
(A-50) 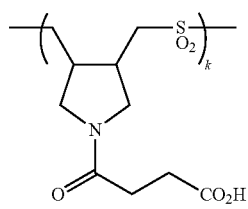
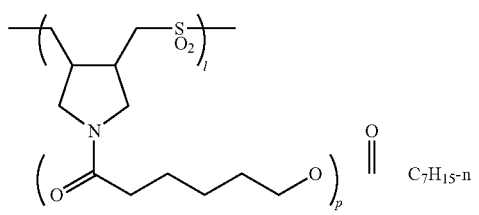
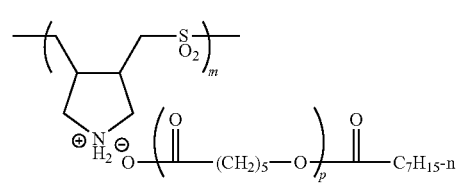
(A-51) 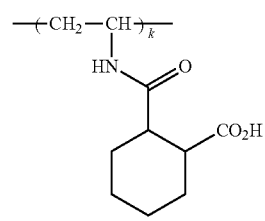
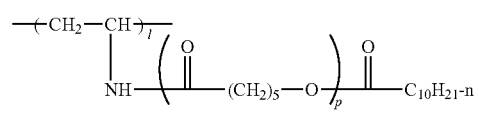
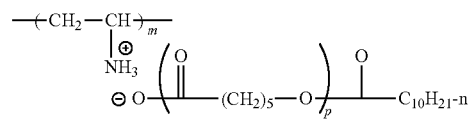
(A-52) 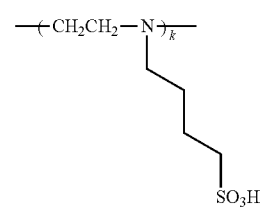
[Chem. 55]
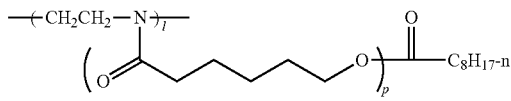
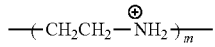
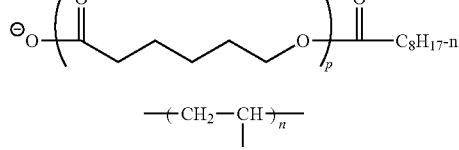
(A-53) 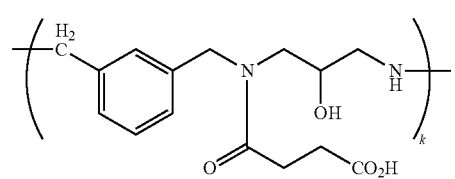
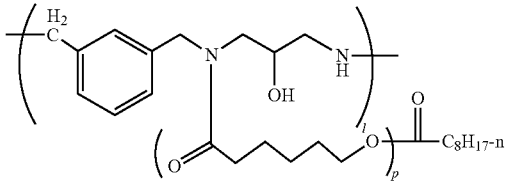
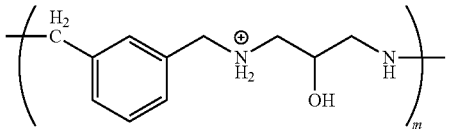
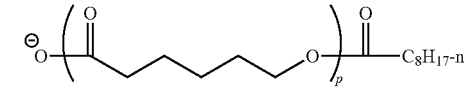
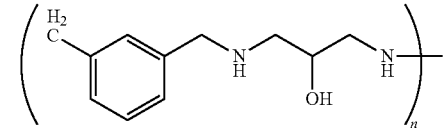
[Chem. 56]
(A-54) 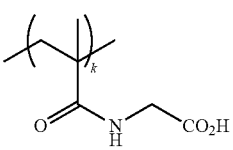
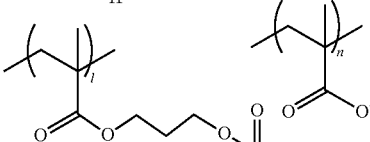
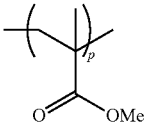

(A-55) 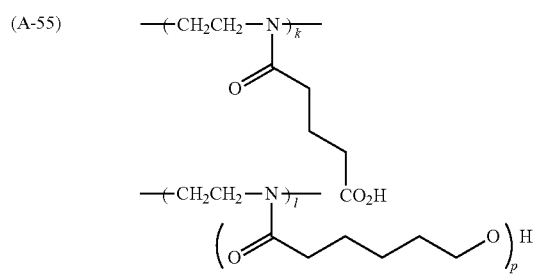

(A-56) 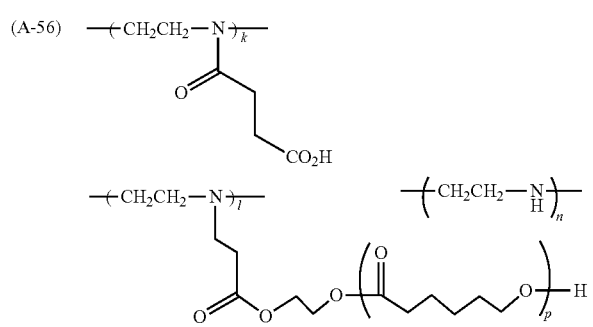

(A-57) 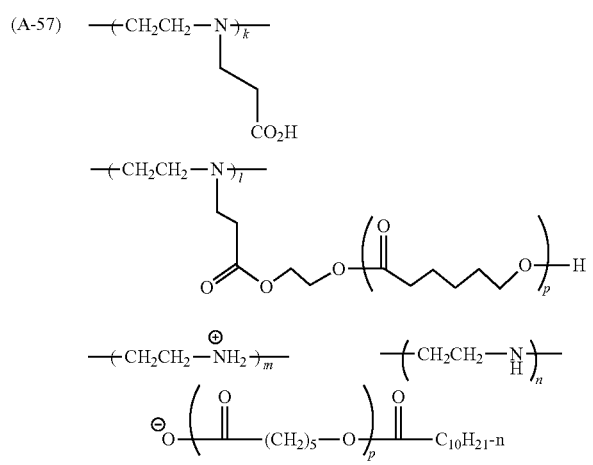

[Chem. 57]

(A-58) 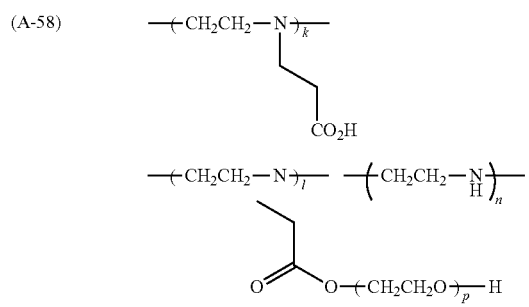

(A-59) 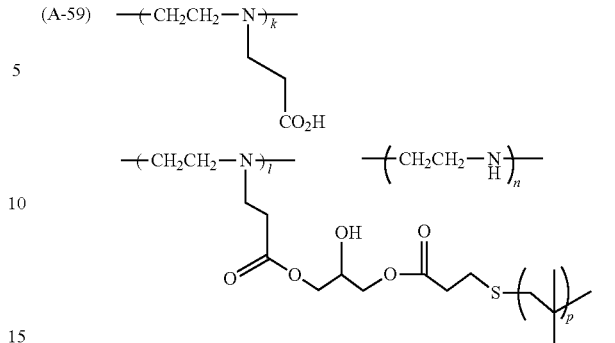

(A-60) 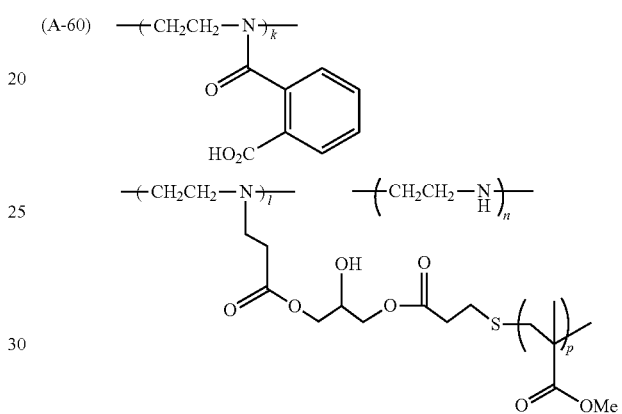

When the specific dispersible resin (B1) is synthesized, it is possible to carry out the manufacturing by (1) a method which reacts a resin which has a primary or secondary amino group, and the precursor x of the partial structure X and the precursor y of Y; (2) a method using the polymerization between a monomer which contains a structure which corresponds with the partial structure X and a macromonomer which contains Y; and the like. It is preferable to carry out the manufacturing by first synthesizing a resin which has a primary or secondary amino group in the main chain, and thereafter reacting the precursor x of X and the precursor y of Y with the resin, and carrying out introducing using the polymer reaction in the nitrogen atoms which exist in the main chain. Regarding the details of the manufacturing method, it is possible to refer to JP2009-203462A, and the like.

The molecular weight of the specific dispersion resin B is preferably 3,000 to 100,000 by weight average molecular weight and more preferably 5,000 to 55,000 by weight average molecular weight. When the weight average molecular weight is within the above range, the effect of the plurality of adsorption sites which are introduced at the terminals of the polymers is sufficiently exhibited, and it is possible to exhibit an excellent performance in adsorption to the surface of titanium dioxide particles. Here, in the present specification, unless otherwise specified, the GPC measurement was carried out using an HLC-8020 GPC (manufactured by Tosoh Corp.) and columns of TKSgel SuperHZM-H, TSKgel SuperHZ4000, and TSKgel SuperHZ200 (manufactured by Tosoh Corp.). The carrier may be appropriately selected; however, soluble tetrahydrofuran is used.

In the photosensitive composition of the present invention, it is possible to use one type alone or two or more types of the dispersing agent for high refractive-index particles in combination.

From the points of view of dispersibility and dispersion stability, the content of the specific resin (B) with respect to the total solid content of the dispersion composition (II) is preferably in a range of 10 mass % to 50 mass %, more preferably in a range of 11 mass % to 40 mass %, and even more preferably in a range of 12 mass % to 30 mass %.

The curable composition of the present embodiment is preferably filtered through a filter with the object of removing foreign matter, reducing defects, and the like. It is possible to use a filter which is used in filtration applications in the related art without being particularly limited. Examples include filters using fluorine resin such as PTFE (polytetrafluoroethylene), polyamide resins such as nylon-6 and nylon-6,6, polyethylene, polyolefin resins such as polypropylene (PP) (which include high density and ultra-high molecular weight resins), and the like. Among these materials, polypropylene (including high density polypropylene) is preferable.

The pore diameter of the filter is suitably approximately 0.01 μm to 7.0 preferably approximately 0.01 μm to 2.5 μm, and more preferably approximately 0.01 μm to 1.5 μm. By being in these ranges, the dissolved pigment is mixed in, and it is possible to reliably remove fine foreign matter which impairs the preparation of a uniform and smooth curable composition in the subsequent steps.

When using filters, different filters may be combined. At that time, the filtering with the first filter may be carried out one time, or may be performed two or more times. In a case where the filtering is performed two or more times by combining different filters, it is preferable that the pore diameter of the second time or later be larger than the pore diameter of the first filtering. In addition, first filters with different pore diameters may be combined within the ranges described above. Here, for the pore diameters, it is possible to refer to the nominal value of the filter manufacturer. As commercially available filters, it is possible to select from among various types of filters which are provided by Pall Corp., Advantec Toyo Kaisha, Ltd., Nippon Entegris, Inc. (formerly Nippon Mykrolis Corp.), Kitz Micro Filter Corp., and the like.

As the second filter, it is possible to use a filter which is formed of the same material or the like as the first filter described above. The pore diameter of the second filter is suitably approximately 0.5 μm to 7.0 μm, preferably approximately 2.5 μm to 7.0 μm, and more preferably approximately 4.5 μm to 6.0 μm. By being in these ranges, introduction is carried out into the mixture solution while the component particles which are contained in the mixture solution are left as is, and it is possible to remove foreign matter which impairs the preparation of a uniform and smooth curable composition in the subsequent steps.

For example, the filtering with the first filter may performed only on the dispersion, and the second filtering may be performed after the other components are mixed in.

EXAMPLES

The present invention is described in more detail by the following examples; however, the present invention is not to be interpreted as limited by these examples. Here, unless otherwise specified, "parts" and "%" are based on mass in the present examples. In addition, the names of the agents which are described along with the manufacturers (company names) are all product names Example 1, Comparative Example 1

<Creation of Dispersion for Microlens Body (lower layer: a second optical member)>

[Preparation of Titanium Dioxide Dispersion (Dispersion Composition)]

Using NPM (a nanodispersion apparatus for small diameter beads) manufactured by Shinmaru Enterprises Corp., as a circulation type dispersion apparatus (bead mill), a dispersion process was performed as described below with respect to the mixture solution of the following composition, and a titanium dioxide dispersion was obtained as the dispersion composition.

—Composition—

Titanium dioxide (TTO-51 (C) manufactured by Ishihara Sangyo Kaisha Ltd.): 150.0 parts Dispersible resin 1 described below (solid content 20% PGMEA solution): 165.0 parts Propylene glycol monomethyl ether acetate: 142.5 parts

[Chem. 58]

Dispersible resin 1

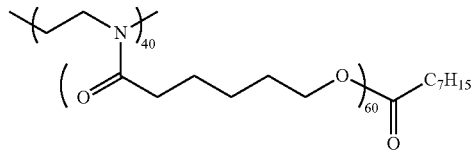

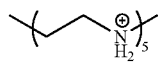

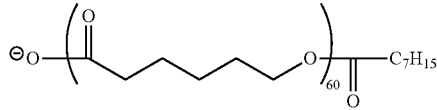

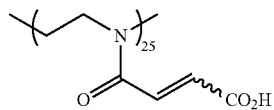 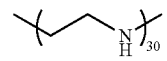

In addition, the dispersion apparatus was operated under the following conditions.

Bead diameter: ϕ0.05 mm
Bead filling rate: 60% by volume
Peripheral speed: 10 m/sec
Pump supply quantity: 30 Kg/hour
Cooling water: tap water
Bead mill annular passage volume: 1.0 L
Mixture solution amount for dispersion process: 10 kg After starting the dispersion, measurement of the average particle diameter was performed at 30 minute intervals (the time for one pass).

The average particle diameter is reduced along with the dispersion time (the number of passes); however, the amount of change slowly becomes less and less. At the point of time when the change in the average particle diameter when the dispersion time is extended to 30 minutes is 5 nm or less, the dispersion is finished. Here, the average particle diameter of the titanium dioxide particles in the dispersion was 40 nm.

Here, the average particle diameter of the titanium dioxide and the like in the present example refers to values which are obtained by diluting the mixture solution or the dispersion which includes titanium dioxide 80 times with propylene glycol monomethyl ether acetate and measuring the diluted solution which is obtained using a dynamic light scattering method.

This measurement refers to the number-average particle diameter which was obtained by using a Micro Track UPA-EX150 manufactured by Nikkiso Co., Ltd.

Description of other abbreviations than described above is as follows.

(Polymerizable Compound)

1031S JER1031S (manufactured by Japan Epoxy Resins Co., Ltd.)

157S65 JER157S65 (manufactured by Japan Epoxy Resins Co., Ltd.)

(Polymer)

B acrylate base (graft copolymer of a benzyl methacrylate/ 1-butyl methacrylate 2-hydroxyethyl methacrylate methacrylic acid copolymer and methoxy polyethylene glycol, manufactured by Fujikura Kasei Co., Ltd.)

TABLE 1

| No | $TiO_2$ Dispersion | ZrO Dispersion | Polymerizable Compound* | Polymerization Initiator* | Polymer* | Surfactant* | Solvent* | Contact Angle |
|---|---|---|---|---|---|---|---|---|
| B01 | 80 | — | DPHA 3.7 | OXE-01 0.1 | A 1 | 0.2 | 15 | 75 |
| B02 | 86.5 | — | DPHA 2.23 | OXE-01 0.07 | A 0.1 | — | 11.1 | 73 |
| B03 | 67 | — | DPHA 6.3 | OXE-01 0.15 | A 1.25 | 0.3 | 25 | 77 |
| B04 | 80 | — | DPHA 3.6 | OXE-01 0.1 | A 1 | 0.3 | 15 | 80 |
| B05 | 88 | — | DPHA 2 | OXE-01 0.07 | — | 0.8 | 9.13 | 85 |
| B06 | — | 80 | DPHA 3.7 | OXE-01 0.1 | A 1 | 0.2 | 15 | 90 |
| B07 | 80 | — | DPHA 3.6 | OXE-01 0.1 | A 1 | 1.5 | 13.8 | 95 |
| B08 | 92 | — | DPHA 3 | OXE-01 0.07 | A 3.4 | — | 1.53 | 68 |
| B09 | 40 | 31 | DPHA 10 | OXE-01 0.15 | A 1.25 | — | 17.6 | 65 |
| B10 | 72 | — | DPHA 5 | OXE-01 0.05 | A 4 | 1.5 | 17.45 | 97 |
| B11 | 15 | 50 | DPHA 6.3 | OXE-01 0.15 | A 1.25 | 3 | 24.3 | 100 |
| B12 | 72 | — | 1031S 10.78 | — | B 1.28 | 0.11 | 15.83 | 83 |
| B13 | 82.8 | — | 157S65 3.72 | — | B 0.97 | 3.45 | 9.06 | 81 |

*mass %

[Preparation of Zirconium Oxide Dispersion (Dispersible Composition)]

The zirconium oxide dispersion was prepared in exactly the same way as the preparation method of the titanium dioxide dispersion described above, except that the 'titanium dioxide (manufactured by Ishihara Sangyo Kaisha, Ltd., TTO-51(C))' was changed to 'zirconium oxide (manufactured by Nippon Denko Co., Ltd., PCS)' in the preparation of the titanium dioxide dispersion described above.

<Preparation of Coating Composition for Lower Layer>

A coating composition for a lower layer was obtained by mixing each component so as to form the following composition, using the titanium dioxide dispersion (a dispersible composition) which was obtained as described above.

| -Composition of Coating Composition for Lower Layer- | |
|---|---|
| Titanium dioxide dispersion prepared as described above (dispersion composition) | 80 parts |
| Polymerizable compound: KAYARAD DPHA (manufactured by Nippon Kayaku Co., Ltd.) | 3.7 parts |
| Polymerization initiator: IRGACURE OXE 01 (manufactured by BASF Corp.) | 0.1 parts |
| Polymer: A (benzyl methacrylate/methacrylic acid copolymer) (copolymerization ratio: 80/20 (wt %), weight average molecular weight: 12,000) | 1.0 part |
| Surfactant: MEGAFAC F781 (manufactured by DIC Corp.) | 0.20 parts |
| Solvent: propylene glycol monomethyl ether acetate | 15 parts |

After coating the lower layer coating composition B01 onto a silicon wafer, a coating film with a film thickness of 1.5 μm was formed by carrying out pre-baking (100° C., 2 minutes), and post-baking (230° C., 10 minutes). Other lower layer coating compositions were prepared according to Table 1 below.

[Contact Angle Evaluation]

Automatic measurement (measuring temperature: 25° C.) of the static contact angle 5 seconds after dripping one drop of pure water onto the obtained film was carried out with the θ/2 method, using an automatic contact angle meter (CA-V model [product name], manufactured by Kyowa Interface Science Co., Ltd.,). The same measurement was repeatedly carried out until N=5, and the average value thereof was set as the static contact angle with respect to pure water. This measurement method is the same as in the testing of the upper layer described above.

<Coating Composition of Optically Transparent Cured Film (Upper Layer: First Optical Member)>

(Synthesis of Hydrolytic Condensate)

The hydrolysis and condensation reaction was carried out using methyltriethoxysilane. The solvent which was used at this time was ethanol. The weight average molecular weight of the obtained hydrolytic condensate A-1 was approximately 10,000. Here, the weight average molecular weight described above was confirmed by GPC following the procedure which was previously described. Next, an upper layer coating composition A01 was prepared by mixing the components of the composition 1 described below with a stirrer. Other upper layer coating compositions were prepared in the same manner as A01, apart from using components in the amounts shown in the Table 2 below.

(Composition 1)

| | |
|---|---|
| Siloxane resin: hydrolytic condensate(A-1) | 20 parts |
| Solvent: propylene glycol monomethyl ether acetate (PGMEA) | 64 parts |
| 3-ethoxy propionate ethyl (EEP) | 16 parts |
| Surfactant: EMULSOGEN COL-020 (manufactured by Clariant Japan Co., Ltd.) | 2 parts |

TABLE 2

| No | MTES*[1] | PhTES*[1] | TEOS*[1] | γ-GP-TMS*[1] | TFP-TMS*[1] | TDFO-TMS*[1] | Other | Added amount | Contact Angle |
|---|---|---|---|---|---|---|---|---|---|
| A01 | 100 | | | | | | EMUL-020 | 2 | 84 |
| A02 | 100 | | | | | | EMUL-020 | 3 | 83 |
| A03 | 100 | | | | | | EMUL-070 | 1.5 | 81 |
| A04 | 100 | | | | | | ELEBASEBUB-3 | 3 | 86 |
| A05 | 100 | | | | | | Plysurf A208B | 3 | 89 |
| A06 | 100 | | | | | | AAc | 0.004 | 82 |
| A07 | 100 | | | | | | EMUL-020/AAc | 2/0.004 | 81 |
| A08 | 100 | | | | | | EMUL-020/ZAc | 2/0.02 | 85 |
| A09 | | | | 30 | 70 | | | | 110 |
| A10 | 60 | | | 35 | 5 | | | | 100 |
| A11 | | | 80 | | | 20 | | | 105 |
| A12 | 60 | | | 35 | 5 | | Thrulya 2320 | | 98 |
| A13 | 100 | | | | | | EMUL-020/ Thrulya 2320 | 2/20 | 84 |
| A14 | | | | | | | CYTOP | | 110 |
| A15 | | | 100 | | | | | | 97 |
| A16 | | 100 | | | | | | | 75 |
| A17 | | | 15 | | 85 | | | | 115 |
| A18 | | | | | | 100 | | | 120 |

*[1]mass %
*[2]parts by mass when the total of A-1, PGMEA and EEP in the composition 1 is 100 parts by mass Meaning Of Abbreviation (Siloxane Resin Raw Material)
MTES methyltriethoxysilane
PhTES phenyltriethoxysilane
TEOS tetraethoxysilane
γ-GP-TMS γ-glyci doxypropyltrimethoxysilane
TFP-TMS trifluoropropyltrimethoxysilane
TDFO-TMS tridecafluorooctyltrimethoxysilane
(Surfactant)
EMUL-020 EMULSOGEN COL-020 (anionic surfactant, manufactured by Clariant Japan Co., Ltd.)
EMUL-070 EMULSOGEN COA-070 (anionic surfactant, manufactured by Clariant Japan Co., Ltd.)
Plysurf A208B anionic surfactant, product name, manufactured by Dai-ichi Kogyo Seiyaku Co., Ltd.
ELEBASE BUB-3 non-ionic surfactant, product name, manufactured by Aoki Oil Industrial Co., Ltd.
(Fluorine-based Resin)
CYTOP: product name, manufactured by Asahi Glass Co., Ltd.
(Hollow Silica Fine Particles)
Thrulya 2320 product name, manufactured by JGC C&C (Average Primary Particle Diameter 50 nm)
(Curing Agent)
AAc aluminum acetyl acetonate
ZAc zirconium acetyl acetonate
(Coating of Upper Layer Coating Composition)

After coating the obtained coating composition A01 described above onto a silicon wafer, a coating film with a film thickness of 700 nm was formed by carrying out pre-baking (100° C., 2 minutes), and post-baking (230° C., 10 minutes).

(Forming of Lens Body)

After coating the lower layer coating compositions B01 to B11 described in the examples of the present invention which were prepared as described in Table 1, heating was carried out with a hot plate for two minutes at 100° C. After that, curing was carried out by heating with a hot plate for ten minutes at 230° C. The film thickness after being cured was 1.5 µm.

Furthermore, HPR-204ESZ-9-5 mPa·s (resist solution manufactured by Fujifilm Electronic Materials FFEM Inc.) was coated thereon, and heating was carried out with a hot plate for one minute at 90° C. The film thickness after being heated was 0.5 p.m. This coating film was exposed to light at 300 mJ/cm² by an i-line stepper (product name: FPA-3000i5+, manufactured by Canon Inc.) using a mask which has a large number of square patterns with one side of 1.15 µm and with pattern gaps of 0.35 µm.

After puddle developing the above for 60 seconds at room temperature using an alkaline developer HPRD-429E (manufactured by Fujifilm Electronic Materials Co., Ltd.), rinsing was further performed with a spin shower using pure water for 20 seconds. Thereafter, washing was further performed with pure water, and then a resist pattern was formed by drying the substrate with high-speed rotation. A post-baking process was carried out with a hot plate for 300 seconds at 200° C. and the resist was shaped into the shape of a lens.

The substrate which was obtained as described above was subjected to a dry etching process under conditions described below using a dry etching apparatus (U-621 manufactured by Hitachi High-Technologies Corp.) and processed such that it is possible for the lower layer film of the present invention to be used as a microlens. The height of the lens body was 380 nm.

RF Power: 800 W
Antenna bias: 100 W
Wafer bias: 500 W
Inter-chamber pressure: 0.5 Pa
Substrate temperature: 50° C.
Mixed gas type and flow rate: $CF_4/C_4F_6/O_2/Ar=175/25/50/200$ ml/min
Photoresist etching rate: 140 nm/min (Creation Method of Microlens Unit)

After coating the upper layer coating compositions A01 to A18 in Table 2 thereon so as to have a film thickness of 0.7 µm, the microlens unit was created by heating with a hot plate for ten minutes at 230° C.

[Planarity]

The coating film (of the upper layer immediately after coating) was observed with an optical microscope before heating. The results were determined using the following classifications.

5: There is no unevenness or air bubbles in the entire film.
4: There is a little unevenness or a few air bubbles in the peripheral section of the film.
3: There is a little unevenness or a few air bubbles in the peripheral section of the film; however, practical use is possible.
2: There is unevenness or air bubbles throughout the entire film, and practical use is impossible.
1: There is cissing beyond unevenness or air bubbles, and practical use is impossible.

after exposing the film for 20 hours to an environment where the temperature was 85° C. and the humidity was 95% RH using a high acceleration lifespan testing device EHS-221 (M) manufactured by Espec Corp., and removing water excluding the moisture of the film. The moisture content (%) was calculated by [(the weight after the testing/the weight before the testing −1)×100]. The measurement is the average value of three measurements. 2 or more is acceptable in terms of performance.
3: Water content is 0.01% or less.
2: Water content is more than 0.01% to 0.2% or less.
1: Water content is more than 0.2%.

TABLE 3

| Sample No. | Upper Layer Composition | Upper Layer Contact angle | Lower Layer Composition | Lower Layer Contact angle | Planarity of Upper Layer Directly after coating | Cracks in Upper layer After heating at 230° | Moisture content |
|---|---|---|---|---|---|---|---|
| 101 | A01 | 84 | B04 | 80 | 5 | 5 | 3 |
| 102 | A01 | 84 | B05 | 85 | 5 | 5 | 3 |
| 103 | A02 | 83 | B03 | 77 | 5 | 5 | 3 |
| 104 | A03 | 81 | B02 | 73 | 4 | 5 | 3 |
| 105 | A04 | 86 | B01 | 75 | 5 | 5 | 3 |
| 106 | A05 | 89 | B07 | 95 | 3 | 3 | 3 |
| 107 | A06 | 82 | B06 | 90 | 4 | 3 | 3 |
| 108 | A07 | 81 | B04 | 80 | 5 | 5 | 3 |
| 109 | A07 | 81 | B05 | 85 | 5 | 5 | 3 |
| 110 | A08 | 85 | B07 | 95 | 3 | 3 | 3 |
| 111 | A13 | 84 | B06 | 90 | 4 | 4 | 3 |
| 112 | A13 | 84 | B03 | 77 | 5 | 5 | 3 |
| 113 | A09 | 110 | B05 | 85 | 3 | 3 | 3 |
| 114 | A10 | 100 | B07 | 95 | 3 | 3 | 3 |
| 115 | A11 | 105 | B02 | 73 | 3 | 3 | 3 |
| 116 | A12 | 98 | B03 | 77 | 4 | 4 | 3 |
| 117 | A12 | 98 | B05 | 85 | 4 | 4 | 3 |
| 118 | A14 | 110 | B02 | 73 | 3 | 3 | 3 |
| 119 | A15 | 97 | B06 | 90 | 4 | 3 | 3 |
| 120 | A01 | 84 | B12 | 83 | 5 | 5 | 3 |
| 121 | A01 | 84 | B13 | 81 | 5 | 5 | 3 |
| c11 | A16 | 75 | B08 | 68 | 1 | 2 | 1 |
| c12 | A06 | 82 | B09 | 65 | 2 | 2 | 3 |
| c13 | A12 | 98 | B08 | 68 | 2 | 2 | 3 |
| c14 | A17 | 115 | B08 | 68 | 1 | 1 | 3 |
| c15 | A16 | 75 | B10 | 97 | 1 | 2 | 1 |
| c16 | A10 | 100 | B11 | 100 | 2 | 2 | 3 |
| c17 | A17 | 115 | B11 | 100 | 1 | 1 | 3 |
| c18 | A16 | 75 | B04 | 80 | 1 | 2 | 1 |
| c19 | A18 | 120 | B05 | 85 | 1 | 3 | 3 |

[Crack Evaluation]

Cracks in the film which was obtained after being heated at 230° C. were observed by an MX50 Semiconductor Inspection Microscope which is an optical microscope manufactured by OLYMPUS, or a Hitachi S-4800 Super High Resolution Field Emission Form Scanning Electron Microscope manufactured by Hitachi High-Technologies Corp. The results were determined using the following classifications.
5: There are no cracks in the entire film.
4: There are a few cracks in the peripheral section of the film.
3: There are a few cracks in the peripheral section of the film; however, practical use is possible.
2: There are cracks throughout the entire film, and practical use is impossible.
1: Many cracks occur throughout the entire film, and practical use is impossible.

[Water Absorption (Moisture Content)]

The weight measurement of the obtained film was performed, and then, the weight was immediately measured All of the microlens units equipped with the optically transparent cured films formed using the set of test bodies 101 to 121 according to the present invention had favorable transparency and optical characteristics. Furthermore, as shown in the Table 3 above, the planarity and the crack resistance on the unit surface are realized, the filling ability (embedability) in the concave section c is realized, and extremely high planarity is realized.

The coating composition 122 was prepared and evaluated in the same manner as A01, except for changing to PGMEA and EEP and using 80 parts of propylene glycol mono n-butyl ether (PnB) in the preparation of the upper layer coating composition A01 of the upper layer (the first optical member). A favorable result was obtained in the same manner as A01.

Furthermore, the coating composition 123 was prepared and evaluated in the same manner as A01, except for changing to PGMEA and EEP and using 80 parts of propylene glycol mono tert-butylether (PTB), 80 parts of dipropylene glycol dimethyl ether (DMM), and 80 parts of 2-heptanone. All of these had favorable results in the same manner as A01.

[Creation of Solid-State Imaging Element]

The solid-state imaging element was formed by setting the microlens unit of the present invention under the color filter (the side close to the support body) which is on a device protective layer in the configuration of the solid-state imaging element described below.

As a result, it was confirmed that the obtained solid-state imaging element is excellent in color separation property in high resolution.

[Configuration of Solid-State Imaging Element]

The configuration has a transfer electrode which is formed of a plurality of photodiodes, polysilicons and the like which configure a light-receiving area of the solid-state imaging element (a CCD image sensor, a CMOS image sensor, or the like) on the support body, a light shielding film which is formed of tungsten and the like where only the light receiving sections of photodiodes are opened on the photodiodes and the transfer electrode, a device protective film which is formed of silicon nitride and the like which are formed so as to cover the entire light shielding film and the photodiode light receiving sections on the light shielding film, and a color filter for solid-state imaging elements on the device protection film.

Example 2

Influence of Thickness

For the set of test body 101 and 103, testing was performed by preparing samples with different thicknesses in the upper layer and the lower layer in various manners. As a result, as shown in the Table 4 below, it is understood that a good performance was realized even when the thickness was changed. However, it is also understood that the performance is outstanding in the favorable thickness. Here, the lower layer was evaluated by the thickness (the height of the lens body) of the object processed so as to be able to be used as a microlens by carrying out dry etching processing in the same manner as example 1 described above.

TABLE 4

| Sample No. | Upper Layer No. | Thickness | Lower Layer No. | Thickness | Planarity of Upper Layer Directly After Coating | Cracks of Upper Layer After heating at 230° C. |
|---|---|---|---|---|---|---|
| 101 | A01 | 500 nm | B04 | 1000 nm | 5 | 5 |
| 101a | A01 | 600 nm | B04 | 1000 nm | 5 | 5 |
| 101b | A01 | 1500 nm | B04 | 1000 nm | 5 | 5 |
| 101c | A01 | 600 nm | B04 | 500 nm | 5 | 5 |
| 101d | A01 | 600 nm | B04 | 1500 nm | 5 | 5 |

Example 3

In the A01, curable compositions were prepared and evaluated in the same manner except that one part of ECT-3 (manufactured by Nikko Chemicals Co., Ltd.) was used instead of Emulsogen COL-020. As a result, the results were good for both the planarity of the upper layer (directly after coating) and the cracks (after heating at 230° C.) of the upper layer. Here, ECT-3 is a surfactant which has a polyoxyalkylene structure, and has the structure R—O-(EO)$_7$—COOH (R=C$_{1-3}$ alkyl group).

Example 4

Coating compositions were prepared and evaluated in the same manner as in example 1 except that one part of ECT-3 (manufactured by Nikko Chemicals Co., Ltd.) and 0.02 parts of KF6001 (manufactured by Shin-Etsu Silicone Co., Ltd.) were used instead of Emulsogen COL-020 in the (composition) of A01. As a result, the results were good for both the planarity of the upper layer (directly after coating) and the cracks (after heating at 230° C.) of the upper layer.

What is claimed is:

1. An optical member set comprising:
a first optical member formed by curing a composition of curable resins and a second optical member which is covered by the first optical member,
wherein the contact angle with water on a surface, which comes into contact with a first optical member, of the second optical member is 70 to 97° and the contact angle with the water on a surface of the opposite side to the side, which comes into contact with the second optical member, of the first optical member is 80 to 115°, and
the second optical member contains titania or zirconia,
the second optical member is a photocurable dispersible composition which contains
metal oxide particles (A) where the primary particle diameter is 1 nm to 100 nm,
a graft copolymer (B) which has a graft chain where the number of atoms excluding hydrogen atoms is the range of 40 to 10,000, and
a solvent (C), and
the content of the metal oxide particles (A) is 50 mass % or more to 90 mass % or less with respect to the total solids content of the dispersible composition.

2. The optical member set according to claim 1, wherein the first optical member contains at least one of a siloxane resin or a fluorine-based resin.

3. The optical member set according to claim 1, wherein the first optical member further contains hollow particles.

4. The optical member set according to claim 1, wherein the thickness of the first optical member is 0.5 μm to 3 μm.

5. The optical member set according to claim 1, wherein the thickness of the second optical member is 0.2 μm to 2 μm.

6. The optical member set according to claim 2, wherein 65 mass % or more to 100 mass % or less of the siloxane resin is configured of a silsesquioxane structure which is represented by the following formula (1),

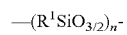 Formula (1)

wherein the formula (1) above, R$^1$ represents an alkyl group which has 1 to 3 carbon atoms, and n represents an integer from 20 to 1000.

7. The optical member set according to claim 1, wherein the first optical member further contains a surfactant.

8. The optical member set according to claim 1,
wherein the first optical member includes a resin which is obtained by hydrolytic condensation of alkyltrialkoxysilane which is represented by the following formula (2), $$R^2Si(OR^3)_3 \quad \text{Formula (2)}$$

wherein $R^2$ represents an alkyl group which has 1 to 3 carbon atoms and $R^3$ represents an alkyl group.

9. The optical member set according to claim 1,
wherein a plurality of convex lenses are adopted as the second optical member,
the plurality of convex lenses are arranged to face in substantially the same direction as the swelling direction of the convex lenses,
the plurality of convex lenses are covered by a first optical member which is an optically transparent cured film from the swelling direction,
the optically transparent cured film is filled into concave sections which are formed between the plurality of convex lenses substantially without gaps, and
the opposite side of the convex lens in the optically transparent cured film is a flat surface.

10. The optical member set according to claim 1,
wherein the contact angle with the water on the surface of the opposite side to the side, which comes into contact with a second optical member, of the first optical member is 80 to 98°.

11. The optical member set according to claim 1,
wherein the first optical member contains a siloxane resin.

12. A solid-state imaging element comprising:
the optical member set according to claim 1; and
a semiconductor light receiving unit.

13. An optical member set comprising:
a first optical member formed by curing a composition of curable resins and a second optical member which is covered by the first optical member,
wherein the contact angle with water on a surface, which comes into contact with a first optical member, of the second optical member is 70 to 97° and the contact angle with the water on a surface of the opposite side to the side, which comes into contact with the second optical member, of the first optical member is 80 to 115°,
the second optical member contains titania or zirconia,
the first optical member contains a siloxane resin, and
65 mass % or more to 100 mass % or less of the siloxane resin is configured of a silsesquioxane structure which is represented by the following formula (1), $$-(R^1SiO_{3/2})_n- \quad \text{Formula (1)}$$

wherein the formula (1) above, $R^1$ represents an alkyl group which has 1 to 3 carbon atoms, and n represents an integer from 20 to 1000.

14. An optical member set comprising:
a first optical member formed by curing a composition of curable resins and a second optical member which is covered by the first optical member,
wherein the contact angle with water on a surface, which comes into contact with a first optical member, of the second optical member is 70 to 97° and the contact angle with the water on a surface of the opposite side to the side, which comes into contact with the second optical member, of the first optical member is 80 to 115°,
the second optical member contains titania or zirconia, and
the first optical member contains a surfactant having an acid group.

15. The optical member set according to claim 14:
wherein the acid group is a carboxyl group.

* * * * *